United States Patent [19]

Shigehara et al.

[11] Patent Number: 5,771,250
[45] Date of Patent: Jun. 23, 1998

[54] LASER LIGHT SOURCE APPARATUS, OTDR APPARATUS, AND OPTICAL COMMUNICATION LINE INSPECTION SYSTEM

[75] Inventors: Masakazu Shigehara; Akira Inoue, both of Yokohama, Japan

[73] Assignee: Sumitomo Electric Indust., Ltd., Osaka, Japan

[21] Appl. No.: 721,326

[22] Filed: Sep. 26, 1996

[30] Foreign Application Priority Data

Nov. 1, 1995 [JP] Japan .................................. 7-285068
Sep. 19, 1996 [JP] Japan .................................. 8-248255

[51] Int. Cl.⁶ .............................. H01S 3/30; G02B 6/34; H04B 10/08
[52] U.S. Cl. ............................... 372/6; 372/99; 372/102; 385/12; 385/14; 385/37; 385/42; 359/109; 359/110; 359/130
[58] Field of Search .................................. 372/6, 99, 102; 385/14, 15, 16, 27, 49, 37, 42, 88, 89, 123, 12; 359/109, 110, 127, 130, 135

[56] References Cited

U.S. PATENT DOCUMENTS

| | | | |
|---|---|---|---|
| 5,305,335 | 4/1994 | Ball et al. | 372/6 |
| 5,305,336 | 4/1994 | Adar et al. | 372/18 |
| 5,317,576 | 5/1994 | Leonberger et al. | 372/6 |
| 5,396,569 | 3/1995 | Yanagawa et al. | 385/24 |
| 5,422,897 | 6/1995 | Wyatt et al. | 372/6 |
| 5,564,832 | 10/1996 | Ball et al. | 372/102 X |
| 5,570,440 | 10/1996 | Mizrahi | 385/37 |
| 5,594,747 | 1/1997 | Ball | 372/31 |
| 5,600,665 | 2/1997 | Minden et al. | 372/6 |

FOREIGN PATENT DOCUMENTS

| | | | |
|---|---|---|---|
| 0 453 816 | 10/1991 | European Pat. Off. | 385/24 X |
| 0 611 097 | 8/1994 | European Pat. Off. | 371/18 X |
| 62-500052 | 1/1987 | Japan | 372/18 X |
| 6-291423 | 10/1994 | Japan | 372/18 X |
| 2 280 326 | 1/1995 | United Kingdom | 385/24 X |
| 86/01303 | 2/1986 | WIPO | 372/18 X |

OTHER PUBLICATIONS

Mizrahi et al, "Mode–Locked Hybrid Soliton Pulse Source With Extremely Wide Operating Frequency Range", IEEE Photonics Technology Letters, vol. 5, No. 1, Jan. 1993, pp. 28–31.

Jungbluth, "Fiber Bragg Grating Tunes Laser Diodes", Laser Focus World, vol. 29, No. 1, Jan. 1993, pp. 20–21.

Bird et al, "Narrow Line Semiconductor Laser Using Fibre Grating", Electronics Letters, Jun. 20, 1991, vol. 27, No. 13, pp. 1115–1116.

Patent Abstracts of Japan, vol. 011, No. 375 (P–644), Dec. 8, 1987 & JP 62 145265 A (Fuji Xerox Co Ltd), Jun. 29, 1987.

Patent Abstracts of Japan, vol. 010, No. 251 (E–432), Aug. 28, 1986 & JP 61 080922 A (Matsushita Electric Ind Co Ltd), Apr. 24, 1986.

(List continued on next page.)

*Primary Examiner*—Brian Healy
*Attorney, Agent, or Firm*—Cushman Darby & Cushman IP Group of Pillsbury Madison & Sutro LLP

[57] ABSTRACT

The pulse laser light source apparatus in the OTDR apparatus of present invention comprises an optical waveguide which receives and guides the light emitted from the first light-emitting end face, wherein the optical waveguide comprises a reflecting area which selectively reflects a part of light emitted from a light-emitting end face of a semiconductor light-emitting device, a core of the reflecting area comprises a first diffraction grating which is disposed in a first area and whose refractive index periodically changes along an optical-axis direction, the first diffraction grating selectively reflects, of the light emitted from the light-emitting end face of the semiconductor light-emitting device, a part of the light within a first wavelength range. And the diffraction grating is one of denvices which constitute a laser resonator.

72 Claims, 19 Drawing Sheets

OTHER PUBLICATIONS

Kashyap et al, "Novel Method of Producing all Fibre Photoinduced Chirped Gratings", Electronics Letters, Jun. 9, 1994, vol. 30, No. 12, pp. 996–998.

Kashyap et al, "Novel Method of Producing all Fibre Photoinduced Chirped Gratings", Electronics Letters 1994, vol. 30, No. 12, pp. 966–998.

Hill et al, "Application of Phase Masks to the Photolithographic Fabrication of Bragg Gratings in Conventional Fiber/Planar Waveguides Wigh Enhanced Photosensitivity", pp. 64–67 OFC PD, 15–1, 1993.

LASER LIGHT SOURCE APPARATUS, OTDR APPARATUS, AND OPTICAL COMMUNICATION LINE INSPECTION SYSTEM

BACKGROUND OF THE INVENTION

1. Field of the Invention

The present invention relates to a laser light source apparatus for generating laser light having a narrow wavelength range, and an OTDR (Optical Time-Domain Reflectometry) apparatus for detecting backscattering light of an optical fiber to be measured and, based on the time characteristic of its intensity, for measuring a characteristic at each point of the optical fiber in a particular wavelength of light using this laser light source apparatus, and an optical communication line inspection system for perfoming OTDR tests.

2. Related Background Art

Conventionally, OTDR tests have been widely used for measuring loss of optical fibers and so on. In the OTDR tests, by way of an optical coupler or the like, pulse light from a light source is made incident on an end of a fiber to be measured; backscattering light generated at each point of the fiber is detected; and the resulting electric signal data are collected so as to measure loss characteristics and the like at each point of the fiber.

As the light source for such an OTDR test, a semiconductor laser whose longitudinal mode is of multimode structure has been used in general. Since such a multi-longitudinal-mode semiconductor laser has a broad oscillation wavelength width exceeding 20 nm, however, it has not been suitable for measuring characteristics of optical fibers with respect to light having a specific wavelength.

On the other hand, as an OTDR test which is suitable for measuring characteristics of optical fibers with respect to light having a specific wavelength, there has been proposed an apparatus in which a light source such as optical fiber laser having a high time-coherency is used. For example, an OTDR apparatus using an optical fiber laser as an light source is disclosed in Japanese Patent Laid-Open No. 6-13688.

When the light from the light source has a high time-coherency, "Fading Noise" is created. "Fading Noise" will be familiar to those of skill in the art.

SUMMARY OF THE INVENTION

It is an object of the present invention to provide a laser light source apparatus suitably used in an OTDR apparatus or the like and to provide an OTDR apparatus which enables accurate measurement.

Also, it is an object of the present invention to provide an optical communication line inspection system which enables a suitable OTDR test.

The laser light source apparatus of the present invention comprises: (a) a semiconductor light-emitting device which is excited by a current to effect spontaneous emission and stimulated emission; (b) a reflecting means which is disposed at a position opposed to a first light-emitting end face of the semiconductor light-emitting device by way of the semiconductor light-emitting device, and reflects light generated by the semiconductor light-emitting device so as to make thus reflected light travel through the semiconductor light-emitting device again; and (c) an optical waveguide which receives and guides the light emitted from the first light-emitting end face, wherein the optical waveguide comprises a reflecting area which selectively reflects a part of the light emitted from the first light-emitting end face of the semiconductor light-emitting device, wherein a core of the reflecting area comprises a first diffraction grating which is disposed in a first area and whose refractive index periodically changes along an optical-axis direction, and wherein the first diffraction grating selectively reflects a part of the light emitted from the first light-emitting end face of the semiconductor light-emitting device within a first wavelength range; here the reflecting means, the semiconductor light-emitting device, and the diffraction gratings constitute a laser resonator.

Here, the reflecting means may be constituted by either (i) a reflectively processed end face of the semiconductor light-emitting device opposed to the first light-emitting end face or (ii) a reflector which reflects light emitted from a second light-emitting end face of the semiconductor device.

When an pumping current is supplied to the semiconductor light-emitting device in the laser light source apparatus of the present invention, spontaneously emitted light and stimulatively emitted light are generated, whereby light having a relatively broad wavelength width is emitted from the light-emitting surface thereof. When thus emitted light enters the optical waveguide and reaches the diffraction grating formed in its core, only a light component having a wavelength width whose center is the reflection wavelength (Bragg wavelength) of this diffraction grating and which is narrower than the output wavelength width of the semiconductor light-emitting device is reflected thereby with a sufficient reflectance. The reflected light enters the semiconductor light-emitting device from the light-emitting surface and, while causing stimulated emission, reaches the reflecting means, where it is reflected so as to advance in the opposite direction. Thus reflected light advances through the light-emitting device, while causing stimulated emission, and then is emitted from the light-emitting surface. Thus emitted light is reflected again by the diffraction grating. As the foregoing phenomenon is repeated, light is amplified so as to finally effect laser oscillation. Accordingly, in the semiconductor light-emitting device, only the wavelength of light which travels to-and-fro is amplified, so that the other wavelength light has a very low emission level, thereby enabling laser oscillation only at a narrow wavelength width. Thus obtained laser light is emitted from the optical waveguide.

Thus, since the laser light source apparatus of the present invention uses the diffraction grating formed in the core of the optical waveguide and the reflecting means to effect laser oscillation, it outputs laser light with a narrow wavelength width corresponding to the reflection spectrum width of the diffraction grating.

The above-mentioned laser light source apparatus is constituted by the semiconductor light-emitting device, the reflecting means, and the optical waveguide, whereby the number of parts therein is remarkably smaller than that in a light source using an optical fiber laser. Accordingly, in the laser light source apparatus of the present invention, designing of optical systems and disposition of optical parts are easy; whereby the apparatus can be easily manufactured, while a smaller size is effortlessly attained.

The laser light source apparatus of the present invention may further comprise a period changing means (also referred to as "reflection wavelength adjusting means" hereinafter) which changes grating period of change in refractive index along the optical-axis direction in the first diffraction grating.

The period changing means may be either (i) a stress (ex. corresponding to tensile force) applying means which applies a stress to a part of the optical waveguide including the first diffraction grating along the optical-axis direction or (ii) a temperature adjusting means which changes temperature at the part of the optical waveguide including the first diffraction grating.

When the laser light source apparatus of the present invention has a stress applying means, as a stress is applied to the part of the optical waveguide including the diffraction grating, the period of the diffraction grating or the like changes and, in response thereto, the reflection wavelength of the diffraction grating changes as well. As the stress applied by the stress applying means is adjusted, the reflection wavelength of the diffraction grating is regulated. Since the output wavelength of the laser light source apparatus changes in response to the reflection wavelength of the diffraction grating, the wavelength of the laser light is regulated when the stress applied by the stress applying means is adjusted.

When the laser light source apparatus of the present invention has a temperature adjusting means, as temperature around the part of the optical waveguide including the diffraction grating is changed, that part expands or contracts. As a result, the period or the like of the diffraction grating changes and, in response thereto, the reflection wavelength of the diffraction grating changes as well. When the temperature adjusting means is controlled so as to adjust temperature around the part including the diffraction grating, the reflection wavelength of the diffraction grating is regulated. Since the output wavelength of the laser light source apparatus changes in response to the reflection wavelength of the diffraction grating, the wavelength of the laser light is regulated when the temperature adjusting means is controlled.

Further, the period changing means may change grating period with time.

As the reflection wavelength range of the diffraction grating is changed with time by the period changing means, the wavelength range of the laser light output from the laser light source apparatus in response thereto also changes with time. Normally, in measurement perfomed by an OTDR apparatus, data are obtained by averaging with time. Consequently, even when the reflection wavelength width of the diffraction grating is narrow, time-coherency is sufficiently lowered.

Preferably, the period changing means changes the reflection wavelength of the diffraction grating with time in a wavelength width of about 1 nm or larger. Here, "changing the reflection wavelength of the diffraction grating with time in a wavelength width of about 1 nm or larger" refers to a case where the reflection wavelength range is changed such that, in a reflection characteristic chart of the diffraction grating in which horizontal and vertical axes respectively indicate wavelength and reflectance, when an intersection between a line drawn in parallel to the wavelength axis at a point which is ¹⁄₁₀ of the maximum reflectance of the diffraction grating and the reflection spectrum of the diffraction grating is determined per time, the wavelength width between the point at which the wavelength is minimized and the point at which the wavelength is maximized becomes about 1 nm or larger.

When the reflection wavelength of the diffraction grating is changed with time in a wavelength width of about 1 nm or larger, the wavelength width of the laser light is also securely broadened to a degree by which time-coherency of the laser light is sufficiently lowered.

Also, preferably, the period changing means changes the reflection wavelength of the diffraction grating with time in a wavelength width of about 20 nm or smaller. Here, "changing the reflection wavelength of the diffraction grating with time in a wavelength width of about 20 nm or smaller" refers to a case where the reflection wavelength range is changed such that, in a reflection characteristic chart of the diffraction grating in which horizontal and vertical axes respectively indicate wavelength and reflectance, when an intersection between a line drawn in parallel to the wavelength axis at a point which is ¹⁄₁₀ of the maximum reflectance of the diffraction grating and the reflection spectrum of the diffraction grating is determined per time, the wavelength width between the point at which the wavelength is minimized and the point at which the wavelength is maximized becomes about 20 nm or smaller.

In this case, the wavelength width of the laser light becomes narrower than that in the conventional multi-longitudinal-mode semiconductor laser light source.

Further preferably, the change in reflection wavelength is at least 2 nm but not greater than 10 nm.

The laser light source apparatus of the present invention may further comprise a current driving means which supplies, to the semiconductor light-emitting device, a stabilizing current having a level not lower than a threshold current level for oscillation of the laser oscillator and a pulse current required for generating pulse laser light.

Here, the current driving means may comprise (i) a first current source for supplying the stabilizing current; (ii) a second current source for supplying the pulse current; and (iii) a current adder for adding the stabilizing current and the pulse current together.

Upon operation of the current driving means, the laser oscillating operation of the laser light source apparatus is stabilized by the stabilizing current before the current driving means supplies of the pulse current to emit the pulse laser light. Accordingly, immediately after the pulse current is supplied, the laser light source apparatus emits pulse laser light with a narrow wavelength range.

Also, the current driving means may either (i) always supply a stabilizing current having a level not lower than that of the threshold current at least except for a time during which the pulse current is supplied or (ii) supply the stabilizing current over a predetermined period of time before the pulse current is supplied.

In either case of (i) and (ii), the laser oscillating operation of the laser light source apparatus is stabilized by the stabilizing current before the current driving means supplies of the pulse current to emit the pulse laser light. Accordingly, immediately after the pulse current is supplied, the laser light source apparatus emits pulse laser light with a narrow wavelength range.

In the case of (ii), the predetermined period of time for supplying the stabilizing current is preferably a time during which light travels to-and-fro through the laser resonator for once to 200 times.

During the period of time in which the laser light travels through the laser resonator to-and-fro for any of once to 200 times, stimulated emission of the laser light is stabilized so that pulse laser light with a narrow wavelength range is emitted immediately after the pulse current is supplied.

Also, the peak current level of the pulse current is preferably at least 10 times as high as the current level of the stabilizing current.

In this case, optical intensity of the light component generated as the stabilizing current is supplied is made lower than that of the pulse laser light originally required, whereby laser light is emitted with a small S/N.

Preferably, in the laser light source apparatus, the width of the first wavelength range of the light reflected by the first diffraction grating formed in the optical waveguide is 1 nm or greater.

Here, "optical waveguide" refers to a circuit or line in which difference between refractive indices of a core and a clad is utilized to confine light into a predetermined area and transmit thus confined light therethrough, and includes optical fiber, thin-film waveguide, and the like. Also, "reflection wavelength width of the diffraction grating" herein refers to the wavelength width, in a reflection characteristic chart of the diffraction grating in which horizontal and vertical axes respectively indicate wavelength and reflectance, between intersections of a line drawn in parallel to the wavelength axis at a point which is $1/10$ of the maximum reflectance of the diffraction grating and the reflection spectrum of the diffraction grating.

Of the light emitted from the semiconductor light-emitting device, a light component which is repeatedly reflected between the reflecting means and the diffraction grating disposed in the optical waveguide is subjected to laser oscillation so as to be output from the laser light source apparatus as laser light. As this laser light has a wavelength width corresponding to the reflection wavelength width of the diffraction grating; when the latter is about 1 nm or greater, the former is broadened to a degree where time-coherency of the laser light is sufficiently lowered. Here, "wavelength width of the laser light" refers to the wavelength width, in a laser light characteristic chart in which horizontal and vertical axes respectively indicate wavelength and optical power, between intersections of a line drawn in parallel to the wavelength axis at a point which is lower than the maximum power of the laser light by 20 dB and the power spectrum of the laser light.

More preferably, the width of the first wavelength range is at least 1 nm but not greater than 20 nm.

In this case, the wavelength width of laser light becomes smaller than that attained when the conventional multi-longitudinal-mode semiconductor laser light source is used.

Further preferably, the width of the first wavelength range is at least 2 nm but not greater than 10 nm.

In the laser light source apparatus of the present invention, the first diffraction grating may be constituted by a first chirped grating in which grating period monotonically changes along the optical-axis direction.

The first chirped grating has different reflection wavelength values according to respective positions therein along the optical axis, thereby exhibiting a reflection wavelength width corresponding to the width of such a change in the reflection wavelength, i.e., difference between the minimum and maximum values of the reflection wavelength. When the grating period or the width of change in the minimum refractive index is adjusted, a chirped grating having a desired reflection wavelength width can be easily obtained, and the wavelength width of laser light is determined in response to this reflection wavelength width.

Preferably, the first chirped grating is disposed such that the grating period thereof on the semiconductor light-emitting device side becomes shorter than that on the opposite side.

When the first chirped grating is thus disposed, such a phenomenon that light which should be reflected by each part of the first chirped grating is radiated outward therefrom before being reflected is prevented from occurring, whereby laser light with a substantially uniform power over the whole reflection wavelength range can be output.

The first chirped grating may be disposed such that reflectance in the first chirped grating monotonically increases along a direction moving away from the semiconductor light-emitting device.

In this case, since the first chirped grating has different reflectance wavelength values according to respective positions therein along the optical axis of the optical waveguide, light included in the output wavelength range of the semiconductor light-emitting device is reflected at different positions according to the wavelength thereof. The light reflected at a part of the chirped grating farther from the semiconductor light-emitting device (i.e., part where the optical path length from the semiconductor light-emitting device is longer) has an optical power further attenuated. Nevertheless, in the case where the pulse width is relatively broad, when the reflectance is made greater in a part farther from the semiconductor light-emitting device as in the case of the above-mentioned chirped grating, the optical power can be made substantially uniform regardless of the part at which the light is reflected. Consequently, laser light having a substantially uniform power over the whole reflection wavelength range can be output.

When the grating period monotonically increases along a direction moving away from the semiconductor light-emitting device, the first chirped grating may be disposed such that reflectance in the first chirped grating monotonically decreases along the direction moving away from the semiconductor light-emitting device.

When the pulse width is shortened, there is a case where an effect that injection energy can be made smaller on the long wavelength side surpasses the influence of the resonator length. In such a case, when reflectance is made to decrease as the resonator length is longer, laser light with a substantially uniform power over the whole reflection wavelength range can be output.

In the laser light source apparatus of the present invention, the reflecting area may further comprise a second diffraction grating which is formed in a second area of the core and whose refractive index periodically changes along the optical-axis direction; namely, the reflecting area may comprise a plurality of diffraction gratings, such that the reflecting area can selectively reflect, of the light emitted from the first light-emitting end face of the semiconductor light-emitting device, a part of the light within a second wavelength range.

In this case, of the light emitted from the semiconductor light-emitting device, light components which are repeatedly reflected between the reflecting means and the reflecting area comprising the above-mentioned plurality of diffraction gratings are subjected to laser oscillation so as to be output from the laser light source apparatus as laser light. Even in the case where each diffraction grating constituting the reflecting area has a narrow reflection wavelength width, and each of the light components reflected by the respective diffraction gratings and subjected to laser oscillation has a high time-coherency, these laser light components are output as being superposed on each other, thereby yielding a sufficiently low time-coherency in the output laser light.

Preferably, these diffraction gratings are disposed such that the light from the semiconductor light-emitting device successively enters the diffraction gratings from the diffraction grating having a shorter reflection wavelength. When each diffraction grating is a chirped grating, the reflection wavelength values of the respective gratings are compared with each other at each part, and then the one having a greater number of shorter reflection wavelength values is adopted as "diffraction grating having a shorter reflection wavelength."

When the diffraction gratings are thus disposed, the phenomenon where light which should be reflected by each part of the diffraction gratings is radiated outward therefrom before being reflected is prevented from occurring, whereby laser light with a substantially uniform power over the whole wavelength range can be output from the laser light source apparatus.

Preferably, the width of the second wavelength range is 1 nm or greater.

Here, "reflection wavelength of the reflecting area" refers to, in a reflection characteristic chart of the reflecting area in which horizontal and vertical axes respectively indicate wavelength and reflectance, among intersections between a line drawn in parallel to the wavelength axis at a point which is 1/10 of the maximum reflectance of the reflecting area and the reflection spectrum of the reflecting area, the wavelength width between the point at which the wavelength is minimized and the point at which the wavelength is maximized.

When the reflecting area has a reflection wavelength width of about 1 nm or greater, the wavelength width of the laser light is also securely broadened to a degree where time-coherency of the laser light is sufficiently lowered.

More preferably, the width of the second wavelength range is at least 1 nm but not greater than 20 nm.

Here, "reflection wavelength width of the reflecting area" is defined as mentioned above.

In this case, the wavelength width of laser light becomes smaller than that attained when the conventional multi-longitudinal-mode semiconductor laser light source is used.

Further preferably, the width of the second wavelength range is at least 2 nm but not greater than 10 nm.

The second diffraction grating may be constituted by a second chirped grating in which grating period monotonously changes along the optical-axis direction.

The reflection wavelength of the second chirped grating is different from that of the other diffraction grating. Here, "reflection wavelength is different" encompasses all the cases except for the case where the reflection wavelength values between the diffraction gratings being compared with each other totally coincide with each other at each part.

The second chirped grating has different reflection wavelength values according to respective positions therein along the optical axis, thereby exhibiting a reflection wavelength width corresponding to the width of such a change in the reflection wavelength, i.e., difference between the minimum and maximum values of the reflection wavelength. When the grating period or the width of change in the minimum refractive index is adjusted, a chirped grating having a desired reflection wavelength width can be easily obtained, and the wavelength width of laser light is determined in response to this reflection wavelength width. Accordingly, the apparatus can be easily made so as to output laser light with a desired wavelength width.

Preferably, the second chirped grating is disposed such that the grating period thereof on the semiconductor light-emitting device side becomes shorter than that on the opposite side.

When the second chirped grating is thus disposed, the phenomenon where light which should be reflected by each part of the second chirped grating is radiated outward therefrom before being reflected is prevented from occurring, whereby laser light with a substantially uniform power over the whole reflection wavelength range can be output.

The second chirped grating may be disposed such that reflectance in the second chirped grating monotonically increases along a direction moving away from the semiconductor light-emitting device.

In this case, since the second chirped grating has different reflectance wavelength values according to respective positions therein along the optical axis of the optical waveguide, light included in the output wavelength range of the semiconductor light-emitting device is reflected at different positions according to the wavelength thereof. The light reflected at a part of the chirped grating farther from the semiconductor light-emitting device (i.e., a part where the optical path length from the semiconductor light-emitting device is longer) has an optical power further attenuated. Nevertheless, when the reflectance is made greater in a part farther from the semiconductor light-emitting device as in the case of the above-mentioned chirped grating, the optical power of the reflected light can be made substantially uniform regardless of the part at which the light is reflected.

When the second grating period monotonically increases along a direction moving away from the semiconductor light-emitting device, the second chirped grating may be disposed such that reflectance in the second chirped grating monotonically decreases along the direction moving away from the semiconductor light-emitting device.

When the pulse width is shortened, there is a case where injection energy can be made smaller on the long wavelength side, this effect surpasses the influence of the resonator length. In such a case, when reflectance is made to decrease as the resonator length is longer, laser light with a substantially uniform power over the whole reflection wavelength range can be output.

The pulse laser light source apparatus comprising the first and second diffraction gratings may be constituted either (i) such that no common area exists between the first and second areas or (ii) such that the first and second areas have a common area.

The OTDR apparatus of the present invention comprises (a) a laser light source (also referred to as "inspection light source" hereinafter) comprising a semiconductor light-emitting device which is excited by a current to effect spontaneous emission and stimulated emission; a reflecting means which is disposed at a position opposed to a first light-emitting end face of the semiconductor light-emitting device by way of the semiconductor light-emitting device, and reflects light generated by the semiconductor light-emitting device so as to make thus reflected light travel through the semiconductor light-emitting device again; and an optical waveguide which receives and guides the light emitted from the first light-emitting end face, wherein the optical waveguide comprises a reflecting area which selectively reflects a part of the light emitted from the first light-emitting end face of the semiconductor light-emitting device, wherein a core of the reflecting area comprises a first diffraction grating which is disposed in a first area and whose refractive index periodically changes along an optical-axis direction, and wherein the first diffraction grating selectively reflects a part of the light emitted from the first light-emitting end face of the semiconductor light-emitting device within a first wavelength range; here the reflecting means, the semiconductor light-emitting device, and the diffraction grating constitute a laser resonator; (b) an optical path setting device which receives, from a first terminal, the light emitted from the laser light source and sends, from a second terminal, thus received light toward an optical fiber to be measured, and also receives, from the second terminal, return light from the optical fiber and sends, from a third terminal, thus received return light; and (c) an optical measurement section which measures a wavelength distribution of intensity in the light output from the third terminal of the optical path setting device. The laser light source is used as an inspection light source.

Here, the optical path setting device may be constituted by either (i) an optical coupler or (ii) a optical directional coupler.

Also, the reflecting means may be constituted by either (i) a reflectively processed end face of the semiconductor light-emitting device opposed to the first light-emitting end face or (ii) a reflector which reflects light emitted from a second light-emitting end face of the semiconductor device.

When a pumping current is supplied to the semiconductor light-emitting device in the inspection light source in the OTDR apparatus of the present invention, spontaneously emitted light and stimulatively emitted light are generated, whereby light having a relatively wide wavelength width is emitted from the light-emitting surface thereof. When thus emitted light enters the optical waveguide and reaches the diffraction grating formed in its core, only a light component having a wavelength width whose center is the reflection wavelength (Bragg wavelength) of this diffraction grating and which is narrower than the output wavelength width of the semiconductor light-emitting device is reflected thereby with a sufficient reflectance. The reflected light enters the semiconductor light-emitting device from the light-emitting surface and, while causing stimulated emission, reaches the light-reflecting surface, where it is reflected so as to advance in the opposite direction. Thus reflected light advances through the light-emitting device, while causing stimulated emission, and then is emitted from the light-emitting surface. Thus emitted light is reflected again by the diffraction grating. As the foregoing phenomenon is repeated, light is amplified so as to finally effect laser oscillation. Accordingly, in the semiconductor light-emitting device, only the wavelength of light which travels to-and-fro is amplified, so that the other wavelength light has a very low emission level, thereby enabling laser oscillation only at a narrow wavelength width. Thus obtained laser light is emitted from the optical waveguide. This laser light is the inspection light output from the inspection light source.

Thus, since the inspection light source in the OTDR apparatus of the present invention uses the diffraction grating formed in the core of the optical waveguide and the reflecting means to effect laser oscillation, it outputs laser light with a narrow wavelength width corresponding to the reflection spectrum width of the diffraction grating. Since this laser light with a narrow wavelength width is used as the inspection light, the OTDR apparatus of the present invention can preferably measure characteristics of an optical fiber at a specific wavelength.

The above-mentioned inspection light source is constituted by the semiconductor light-emitting device, the reflecting means, and the optical waveguide, whereby the number of parts therein is remarkably smaller than that in the conventional OTDR apparatus using an optical fiber laser as its light source. Accordingly, in the OTDR apparatus of the present invention, designing of optical systems and disposition of optical parts are easy, whereby the apparatus is easily manufactured while a smaller size is effortlessly attained.

The OTDR apparatus of the present invention may further comprise a band pass filter in an optical path between the laser light source, which is the inspection light source, and the optical fiber to be measured.

In the inspection light source in the OTDR apparatus of the present invention, one of facing mirrors is constituted by a diffraction grating formed in the optical waveguide so as to narrow the wavelength width of the oscillated laser light. Nevertheless, when the resonator length becomes large, due to its relationship to pulse width, the number of to-and-fros of light through the resonator decreases. Accordingly, though with a low power, oscillation wavelength cannot be prevented from expanding. When OTDR test is perfomed, there are cases where, in order to prevent crosstalk to a signal transmission band from occurring, such an extension of oscillation wavelength is desired to be reduced by an amount which is beyond the capacity of the diffraction grating.

In such cases, when a band pass filter is further provided in an optical path between the laser light source, which is the inspection light source, and the optical fiber to be measured, light outside of the wavelength range necessary for the OTDR apparatus can be cut off, whereby a prefeable output characteristic can be obtained.

The OTDR apparatus of the present invention may further comprise a period changing means which changes grating period of change in refractive index along the optical-axis direction in the first diffraction grating.

The period changing means may be either (i) a stress (ex. corresponding to tensile force) applying means which applies a stress to a part of the optical waveguide including the first diffraction grating along the optical-axis direction or (ii) a temperature adjusting means which changes temperature at the part of the optical waveguide including the first diffraction grating.

When the inspection light source in the OTDR apparatus of the present invention has a stress applying means, as a stress is applied to the part of the optical waveguide including the diffraction grating, the period of the diffraction grating or the like changes and, in response thereto, the reflection wavelength of the diffraction grating changes. As the stress applied by the stress applying means is adjusted, the reflection wavelength of the diffraction grating is regulated. Since the output wavelength of the inspection light source changes in response to the reflection wavelength of the diffraction grating, the wavelength of the inspection light is regulated when the stress applied by the stress applying means is adjusted.

When the inspection light source in the OTDR apparatus of the present invention has a temperature adjusting means, as temperature around the part of the optical waveguide including the diffraction grating is changed, that part expands or contracts. As a result, the period or the like of the diffraction grating changes and, in response thereto, the reflection wavelength of the diffraction grating changes. When the temperature adjusting means is controlled so as to adjust temperature around the part including the diffraction grating, the reflection wavelength of the diffraction grating is regulated. Since the output wavelength of the inspection light source changes in response to the reflection wavelength of the diffraction grating, the wavelength of the inspection light is regulated when the temperature adjusting means is controlled.

Further, the period changing means can change the grating period with time.

Of the light emitted from the semiconductor light-emitting device, a light component which is repeatedly reflected between the light-reflecting surface of the semiconductor light-emitting device and the diffraction grating disposed in the optical waveguide is subjected to laser oscillation so as to be output from the inspection light source as inspection light. As the reflection wavelength range of the diffraction grating is changed with time by the period changing means, the wavelength range of the inspection light output from the inspection light source in response thereto also changes with time. Normally, in measurement perfomed by an OTDR apparatus, data are obtained by averaging with time. Consequently, even when the reflection wavelength width of the diffraction grating is narrow, it is possible to obtain data equivalent to those obtained with inspection light having a wavelength width which is large enough to sufficiently lower time-coherency. When such inspection light is used, an OTDR test with suppressed fading noise can be perfomed.

Preferably, the period changing means changes the reflection wavelength of the diffraction grating with time in a wavelength width of about 1 nm or larger. Here, "changing the reflection wavelength of the diffraction grating with time in a wavelength width of about 1 nm or larger" refers to a case where the reflection wavelength range is changed such that, in a reflection characteristic chart of the diffraction grating in which horizontal and vertical axes respectively indicate wavelength and reflectance, when an intersection between a line drawn in parallel to the wavelength axis at a point which is 1/10 of the maximum reflectance of the diffraction grating and the reflection spectrum of the diffraction grating is determined per time, the wavelength width between the point at which the wavelength is minimized and the point at which the wavelength is maximized becomes about 1 nm or greater.

When the reflection wavelength of the diffraction grating is changed with time in a wavelength width of about 1 nm or larger, the wavelength width of the inspection light is also securely broadened to a degree where time-coherency of the laser light is sufficiently lowered. As such inspection light with a low time-coherency is used, an OTDR test with suppressed fading noise can be securely perfomed.

Also, preferably, the period changing means changes the reflection wavelength of the diffraction grating with time in a wavelength width of about 20 nm or smaller. Here, "changing the reflection wavelength of the diffraction grating with time in a wavelength width of about 20 nm or smaller" refers to a case where the reflection wavelength range is changed such that, in a reflection characteristic chart of the diffraction grating in which horizontal and vertical axes respectively indicate wavelength and reflectance, when an intersection between a line drawn in parallel to the wavelength axis at a point which is 1/10 of the maximum reflectance of the diffraction grating and the reflection spectrum of the diffraction grating is determined per time, the wavelength width between the point at which the wavelength is minimized and the point at which the wavelength is maximized becomes about 20 nm or smaller.

In this case, the wavelength width of the inspection light becomes narrower than that in the case where the conventional multi-longitudinal-mode semiconductor laser light source is used as inspection light source, whereby a characteristic of an optical fiber at a specific wavelength can be measured more preferably than that conventionally measured.

The inspection light source in the OTDR apparatus of the present invention may further comprise a current driving means which supplies, to the semiconductor light-emitting device, a stabilizing current having a level not lower than a threshold current level for oscillation of the laser oscillator and a pulse current required for generating the pulse laser light.

Here, the current driving means may comprise (i) a first current source for supplying the stabilizing current; (ii) a second current source for supplying a pulse current; and (iii) a current adder for adding the stabilizing current and the pulse current together.

The laser oscillating operation of the inspection light source is stabilized by the stabilizing current before the current driving means supplies the pulse current to emit the pulse laser light. Accordingly, immediately after the pulse current is supplied, the inspection light source emits pulse laser light (inspection light or strobe light) with a narrow wavelength range. Therefore, samples can be measured with a high accuracy.

Also, the current driving means may either (i) always supply a stabilizing current having a level not lower than that of the threshold current at least except for a time during which the pulse current is supplied or (ii) supply the stabilizing current over a predetermined period of time before the pulse current is supplied.

In either case of (i) and (ii), the laser oscillating operation of the inspection light source is stabilized by the stabilizing current before the current driving means supplies the pulse current to emit the pulse laser light. Accordingly, immediately after the pulse current is supplied, the inspection light source emits pulse laser light with a narrow wavelength range. Therefore, samples can be measured with a high accuracy.

In this case, the predetermined period of time for supplying the stabilizing current is preferably a time during which light travels to-and-fro through the laser resonator for once to 200 times.

During the period of time in which the laser light travels through the laser resonator to-and-fro for any of one to 200 times, stimulated emission of the laser light is stabilized so that pulse laser light with a narrow wavelength range is emitted immediately after the pulse current is supplied. Therefore, samples can be measured with a high accuracy.

Also, the peak current level of the pulse current is preferably at least 10 times as high as the current level of the stabilizing current.

As optical intensity of the light component generated upon supply of the stabilizing current is made lower than that of the pulse laser light originally required, laser light can be emitted with a small S/N; and as pulse laser light with a narrow wavelength range is emitted immediately after the supply of pulse current, samples can be measured with a high accuracy.

Preferably, in the OTDR apparatus supplying the stabilizing current, the optical measurement section further comprises a high pass filter which eliminates a low frequency component in input optical intensity.

In this case, the DC component in the reflected light, resulting from the fact that the strobe light contains a light component generated upon the supply of stabilizing current, is eliminated. Accordingly, information about the reflected light is substantially obtained while only the pulse laser light is used as inspection light. Therefore, samples can be measured with a high accuracy.

Preferably, in the OTDR apparatus of the present invention, the width of the first wavelength range of the light reflected by the first diffraction grating formed in the optical waveguide is 1 nm or greater.

Of the light emitted from the semiconductor light-emitting device, a light component which is repeatedly reflected between the reflecting means and the diffraction grating disposed in the optical waveguide is subjected to laser oscillation so as to be output from the inspection light source as inspection light. As this inspection light has a wavelength width corresponding to the reflection wavelength width of the diffraction grating; when the latter is about 1 nm or greater, the former is broadened to a degree where time-coherency of the laser light is sufficiently lowered. Here, "wavelength width of the laser light" refers to the wavelength width, in an inspection light characteristic chart in which horizontal and vertical axes respectively indicate wavelength and optical power, between intersections of a line drawn in parallel to the wavelength axis at a point which is lower than the maximum power of the inspection light by 20 dB and the power spectrum of the inspection light. When such inspection light with a low time-coherency is used, OTDR tests with suppressed fading noise can be perfomed.

More preferably, the width of the first wavelength range is at least 1 nm but not greater than 20 nm.

In this case, since the wavelength width of inspection light becomes smaller than that attained when the conventional multi-longitudinal-mode semiconductor laser light source is used as inspection light source, a characteristic of an optical fiber at a specific wavelength can be measured more preferably than that conventionally measured.

Further preferably, the width of the first wavelength range is at least 2 nm but not greater than 10 nm.

In the OTDR apparatus of the present invention, the first diffraction grating may be constituted by a first chirped grating in which grating period monotonically changes along the optical-axis direction.

The first chirped grating has different reflection wavelength values according to respective positions therein along the optical axis, thereby exhibiting a reflection wavelength width corresponding to the width of such a change in the reflection wavelength, i.e., difference between the minimum and maximum values of the reflection wavelength. When the grating period or the width of change in the minimum refractive index is adjusted, a chirped grating having a desired reflection wavelength width can be easily obtained, and the wavelength width of inspection light is determined in response to this reflection wavelength width. Accordingly, the OTDR apparatus comprising an inspection light source with a chirped grating can be easily made so as to output inspection light with a desired wavelength width.

Preferably, the first chirped grating is disposed such that the grating period thereof on the semiconductor light-emitting device side becomes shorter than that on the opposite side.

When the first chirped grating is thus disposed, a phenomenon where light which should be reflected by each part of the first chirped grating is radiated outward therefrom before being reflected is prevented from occurring, whereby inspection light with a substantially uniform power over the whole reflection wavelength range is output from the inspection light source. Therefore, OTDR tests can be perfomed more preferably.

The first chirped grating may be disposed such that reflectance in the first chirped grating monotonically increases along a direction moving away from the semiconductor light-emitting device.

In this case, since the first chirped grating has different reflectance wavelength values according to respective positions along the optical axis of the optical waveguide, light included in the output wavelength range of the semiconductor light-emitting device is reflected at different positions according to the wavelength thereof. The light reflected at a part of the chirped grating farther from the semiconductor light-emitting device (i.e., part where the optical path length from the semiconductor light-emitting device is longer) has an optical power further attenuated. Nevertheless, in the case where the pulse width is relatively broad, when the reflectance is made greater in a part farther from the semiconductor light-emitting device as in the case of the above-mentioned chirped grating, the optical power can be made substantially uniform regardless of the part at which the light is reflected. Consequently, inspection light having a substantially uniform power over the whole wavelength range can be output from the inspection light source in the OTDR apparatus comprising the above-mentioned chirped grating, whereby OTDR tests can be perfomed more preferably.

When the grating period monotonically increases along a direction moving away from the semiconductor light-emitting device, the first chirped grating may be disposed such that reflectance in the first chirped grating monotonically decreases along the direction moving away from the semiconductor light-emitting device.

When the pulse width is shortened, injection energy can be made smaller on the long wavelength side, this effect surpasses the influence of the resonator length. In such a case, when reflectance is made to decrease as the resonator length is longer, inspection light with a substantially uniform power over the whole reflection wavelength range can be output. As a result, preferable OTDR tests can be perfomed.

In the OTDR apparatus of the present invention, the reflecting area may further comprise a second diffraction grating which is formed in a second area of the core and whose refractive index periodically changes along the optical-axis direction; namely, the reflecting area may comprise a plurality of diffraction gratings, such that the reflecting area can selectively reflect a part of the light emitted from the first light-emitting end face of the semiconductor light-emitting device within a second wavelength range.

In this case, of the light emitted from the semiconductor light-emitting device, light components which are repeatedly reflected between the reflecting means device and the reflecting area comprising the above-mentioned plurality of diffraction gratings are subjected to laser oscillation so as to be output from the laser light source apparatus as inspection light. Even in the case where each diffraction grating constituting the reflecting area has a narrow reflection wavelength width, and each of the light components reflected by the respective diffraction gratings and subjected to laser oscillation has a high time-coherency, these laser light components are output as being superposed on each other, thereby yielding a sufficiently low time-coherency in the output inspection light. Accordingly, in the OTDR apparatus of the present invention, OTDR tests can be perfomed with suppressed fading noise.

Preferably, these diffraction gratings are disposed such that the light from the semiconductor light-emitting device successively enters the diffraction gratings from the diffraction grating having a shorter reflection wavelength. When each diffraction grating is a chirped grating, the reflection wavelength values of the respective gratings are compared with each other at each part thereof, and then the one having a greater number of shorter reflection wavelength values is adopted as "diffraction grating having a shorter reflection wavelength."

When the diffraction gratings are thus disposed, such a phenomenon that light which should be reflected by each part of the diffraction gratings is radiated outward therefrom before being reflected is prevented from occurring, whereby inspection light with a substantially uniform power over the whole wavelength range can be output from the inspection light source. Accordingly, OTDR tests can be perfomed more preferably.

Preferably, the width of the second wavelength range is 1 nm or greater.

Here, "reflection wavelength of the reflecting area" refers to, in a reflection characteristic chart of the reflecting area in which horizontal and vertical axes respectively indicate wavelength and reflectance, among intersections between a line drawn in parallel to the wavelength axis at a point which is 1/10 of the maximum reflectance of the reflecting area and the reflection spectrum of the reflecting area, the wavelength width between the point at which the wavelength is minimized and the point at which the wavelength is maximized.

When the reflecting area has a reflection wavelength width of about 1 nm or greater, the wavelength width of the inspection light is also securely broadened to a degree where time-coherency of the inspection light is sufficiently lowered. When such inspection light with a low time-coherency is used, OTDR tests with suppressed fading noise can be securely perfomed.

More preferably, the width of the second wavelength range is at least 1 nm but not greater than 20 nm.

Here, "reflection wavelength width of the reflecting area" is defined as mentioned above.

In this case, since the wavelength width of inspection light becomes smaller than that attained when the conventional multi-longitudinal-mode semiconductor laser light source is used as inspection light source, a characteristic of an optical fiber at a specific wavelength can be measured more preferably than that conventionally measured.

Further preferably, the width of the second wavelength range is at least 2 nm but not greater than 10 nm.

The second diffraction grating may be constituted by a second chirped grating in which grating period monotonously changes along the optical-axis direction.

The second chirped grating and the other diffraction grating have reflection wavelengths different from each other. Here, "diffraction gratings have different reflection wavelengths" encompasses all the cases except for the case where the reflection wavelength values between the diffraction gratings being compared with each other totally coincide with each other at each part thereof.

The second chirped grating has different reflection wavelength values according to respective positions therein along the optical axis, thereby exhibiting a reflection wavelength width corresponding to the width of such a change in the reflection wavelength, i.e., difference between the minimum and maximum values of the reflection wavelength. When the grating period or the width of change in the minimum refractive index is adjusted, a chirped grating having a desired reflection wavelength width can be easily obtained, and the wavelength width of inspection light is determined in response to this reflection wavelength width. Accordingly, the OTDR apparatus comprising a chirped grating can be easily made so as to output inspection light with a desired wavelength width.

Preferably, the second chirped grating is disposed such that the grating period thereof on the semiconductor light-emitting device side becomes shorter than that on the opposite side.

When the second chirped grating is thus disposed, such a phenomenon that light which should be reflected by each part of the second chirped grating is radiated outward therefrom before being reflected is prevented from occurring, whereby inspection light with a substantially uniform power over the whole reflection wavelength range can be output. Accordingly, OTDR tests can be perfomed more preferably.

The second chirped grating may be disposed such that reflectance in the second chirped grating monotonically increases along a direction moving away from the semiconductor light-emitting device.

Since the second chirped grating has different reflectance wavelength values according to respective positions along the optical axis of the optical waveguide, light included in the output wavelength range of the semiconductor light-emitting device is reflected at different positions according to the wavelength thereof. The light reflected at a part of the chirped grating farther from the semiconductor light-emitting device (i.e., part where the optical path length from the semiconductor light-emitting device is longer) has an optical power further attenuated. Nevertheless, when the reflectance is made greater in a part farther from the semiconductor light-emitting device as in the case of the above-mentioned chirped grating, the optical power of the reflected light can be made substantially uniform regardless of the part at which the light is reflected. Accordingly, in the OTDR apparatus comprising the above-mentioned chirped grating, inspection light having a substantially uniform power over the whole reflection wavelength range can be output from the inspection light source, whereby OTDR tests can be perfomed more preferably.

When the grating period in the second diffraction grating monotonically increase along a direction moving away from the semiconductor light-emittimg device, the second chirped grating may be disposed such that reflectance in the second chirped grating monotonically decreases along the direction moving away from the semiconductor light-emitting device.

When the pulse width is shortened, there is a case where an effect that injection energy can be made smaller on the long wavelength side surpasses the influence of the resonator length. In such a case, when reflectance is made to decrease as the resonator length is longer, inspection light with a substantially uniform power over the whole reflection wavelength range can be output.

The OTDR apparatus in which the reflecting area of the optical waveguide comprises the first and second diffraction gratings may be constituted either (i) such that no common area exists between the first and second areas or (ii) such that the first and second areas have a common area.

The optical communication line inspection system of the present invention is an optical communication line inspection system for inspecting transmission state of an optical communication line which is transmitting signal light, and comprises (a) a light-emitting section for outputting inspection light with a wavelength in a first wavelength range; (b) an optical path setting section disposed in an optical path of the optical communication line, which optical path setting section receives the inspection light output from the light-emitting section and introduces thus received inspection light into the optical communication line, and also receives return light derived from the inspection light input from the optical communication line and outputs thus received return light to a path different from the optical communication line; (c) a waveguide type reflecting means disposed at a terminating portion of the optical communication line, which reflecting means reflects light with a wavelength in a second wavelength range including the first wavelength range and comprises a first diffraction grating in which at least refractive index of a core thereof periodically changes along an optical-axis direction; and (d) a processing section which measures a wavelength distribution of intensity in the return light output from the optical path setting section and, based on a result of the measurement, determines the transmission state of the optical communication line.

Here, the width of the first wavelength range is preferably 20 nm or smaller and, more preferably, 5 nm or smaller.

In the optical communication line inspection system of the present invention, since the waveguide type reflecting means comprises a waveguide type diffraction grating, and inspection light within a wavelength range included in the reflection wavelength of the waveguide type reflecting means is used to inspect the optical communication line, the optical communication line can be inspected while influence upon optical communications is suppressed.

When the light-emitting section outputs inspection light with a wavelength width of about 20 nm or smaller, and this inspection light is used to inspect an optical communication line; the reflection wavelength width of the waveguide type reflecting means can be sufficiently narrowed. Accordingly, the transmission loss of signal light caused by mode-mismatching and absorption of OH group is lowered, whereby the optical communication line can be inspected while influence upon optical communications is sufficiently suppressed.

In particular, when the wavelength width of the inspection light output from the light-emitting section is about 5 nm or smaller, the number of waveguide type diffraction gratings can be made very small, whereby influence of the optical communication line inspection upon optical communications can become very little.

As a light source apparatus adopted in the light-emitting section, either (i) a laser light source apparatus in accordance with the present invention or (ii) a distributed feedback type semiconductor laser can be suitably used.

The optical communication line inspection system of the present invention may further comprise a band pass filter in an optical path between the light-emitting section and the optical communication line.

The light source of the light-emitting section has a narrow wavelength width. Nevertheless, there are cases where, due to the relationship to the generated pulse width, though with a low power, an expanding oscillation wavelength cannot be prevented. When an inspection is perfomed, in order to prevent crosstalk to a signal transmission band from occurring, such an extension of oscillation wavelength should be reduced by an amount which beyond the capacity of the diffraction grating.

In such a case, when a band pass filter is further provided in an optical path between the light-emitting section and the optical communication line to be measured, light outside of the wavelength range necessary for the inspection can be cut off, whereby influence upon optical communications can be securely suppressed.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 19 is a characteristic chart of inspection light output from an inspection light source 1a;

DESCRIPTION OF THE PREFERRED EMBODIMENTS

Figure 1:
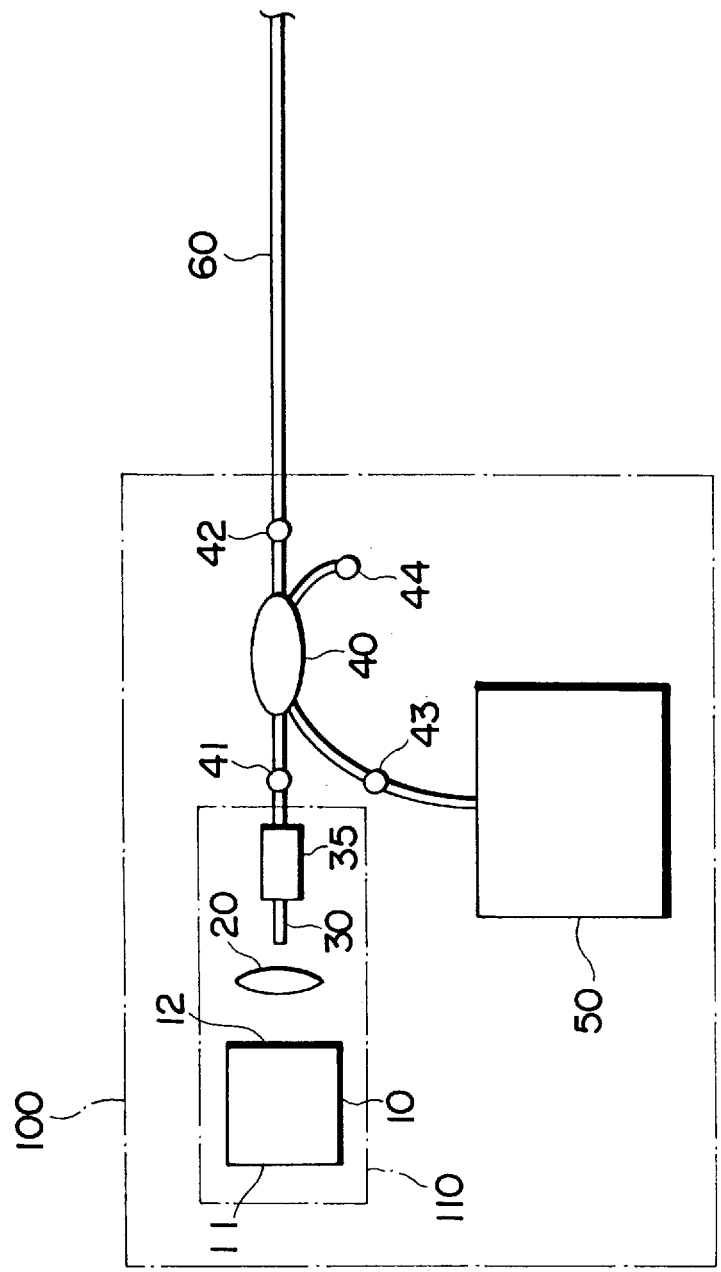
FIG. 1 is a view showing a configuration of an OTDR apparatus in accordance with Embodiment 1.

In the following, embodiments of the present invention will be explained in detail with reference to attached drawings. In the explanation of the drawings, elements identical to each other will be referred to with marks identical to each other without their overlapping explanations being repeated. Also, sizes and ratios in the drawings do not always coincide with those explained.

(Embodiment 1)

FIG. 1 is a schematic view showing a configuration of an OTDR apparatus 100 in this embodiment. This OTDR apparatus 100 is constituted by an inspection light source 110, an optical coupler 40, and a measurement section 50.

The inspection light source 110 oscillates in a pulsing manner to emit laser light. It is constituted by a Fabry-Perot type semiconductor laser 10, a lens 20, and an optical fiber 30. It is formed as the optical fiber 30 is optically connected, by way of the lens 20, to the Fabry-Perot type semiconductor laser 10 which has been conventionally used as inspection light source of an OTDR apparatus. This inspection light source 110 is similar to that disclosed in a paper of D. M. Bird et al (*Electron. Lett.,* Vol. 30, No. 13, pp. 1115–1116, 1994).

The Fabry-Perot type semiconductor laser 10 is a semiconductor light-emitting device constituted by a heterostructure of InGaAsP/InP. When an operating current flows therethrough, it is excited so as to output pulse light of 1,550 nm band. On both sides of the hetero-structure, a light-reflecting surface 11 and a light-emitting surface 12 are respectively disposed. These surfaces are opposed to each other, thereby forming a Fabry-Perot laser resonator. The light-reflecting surface 11 has a high reflectance (about 80% in this embodiment), whereas the light-emitting surface 12 has a low reflectance (about 5% in this embodiment). As in the case of most Fabry-Perot type devices, the semiconductor laser 10 is a multi-longitudinal-mode laser and shows an oscillation spectrum in which output increases in response to wavelengths in the respective modes.

The lens 20 converges the light emitted from the semiconductor laser 10 so as to make it incident on the optical fiber 30, thereby coupling the semiconductor laser 10 to the optical fiber 30 in terms of optical power. As the lens 20, an ordinary optical coupling lens such as that used in optical communications can be employed.

Here, a tip of the optical fiber 30 may be processed by melting or shaving to have a lens function, thereby eliminating the lens 20 which is arranged between the semiconductor laser 10 and the optical fiber 30.

The optical fiber 30 comprises an ordinary single-mode optical fiber and a diffraction grating 35 formed at a part of its core. The refractive index of this diffraction grating 35, which is an area of the core, periodically changes between the minimum refractive index and the maximum refractive index according to positions along its optical axis. The period of this change in refractive index corresponds to the period of the diffraction grating.

It has been known in general that, when "interference of two lightwaves" technique is used to generate an interference fringe of ultraviolet rays, and an optical fiber having a core doped with $GeO_2$ is irradiated with thus generated interference fringe, the diffraction grating 35 can be formed. This manufacturing method is disclosed in Japanese Publication of the Translation of International Application No. 62-500052. In this method, since the effective refractive index of the core increases according to the optical intensity distribution of the interference fringe, an area where the refractive index fluctuates between the original effective refractive index of the core and the increased effective refractive index is formed. This area is the diffraction grating 35.

The diffraction grating 35 reflects light over a narrow wavelength width whose center is a predetermined reflection wavelength $\lambda_R$. This reflection wavelength $\lambda_R$ is expressed as:

$$\lambda_R = 2 \cdot n \cdot \Lambda \qquad (1)$$

wherein n is the effective refractive index of the diffraction grating 35 and $\Lambda$ is the period of the diffraction grating 35.

The optical coupler 40 is a kind of an optical directional coupler having four terminals, i.e., first to third terminals 41 to 43 and a resistive terminator 44. The first terminal 41 is connected to the optical fiber 30 such that the inspection light from the inspection light source 100 is incident on the optical coupler 40. To the second terminal 42, an optical fiber 60 to be measured is connected.

The inspection light incident on the optical coupler 40 is split into two light components. One of the split light components is made incident on the optical fiber 60 to be measured. Of the incident inspection light, backscattering light which has been made to advance in the opposite direction due to Rayleigh scattering at each point of the optical fiber 60 is made incident on the optical coupler 40 and then split into two. One of thus split light component is made incident on the measurement section 50.

As in the case of the conventional OTDR apparatus, an optical directional coupler such as optical circulator may be used in place of the optical coupler 40.

The measurement section 50, which measures the back-scattering light of the optical fiber 60 to be measured, is connected to the third terminal 43 of the optical coupler 40. The measurement section 50, which is similar to that used in ordinary OTDR apparatuses, comprises a photodetector which detects the backscattering light and converts thus detected light into an electric signal; an amplifier for amplifying the electric signal output from the photodetector; a signal processing section which A/D-converts the signal output from the amplifier and further subjects thus converted signal to an averaging processing or the like; a CRT device connected to the signal processing section; and the like. Based on the output signal of the signal processing section, the CRT device displays the scattering light power of the optical fiber 60 with respect to the distance from a predetermined reference point to the measurement point in the optical fiber 60. As thus displayed waveform is observed, loss between two arbitrary points in the optical fiber can be determined.

The inspection light source 110 outputs laser pulse light having a wavelength width narrower than the output wavelength width of the semiconductor laser 10. The principle thereof will be explained in the following.

When an operating current flows through the Fabry-Perot type semiconductor laser 10, spontaneously emitted light is generated. As this light is repeatedly reflected between the light-reflecting surface 11 and the light-emitting surface 12 while causing stimulated emission, the light is amplified so as to finally generate laser oscillation. In this manner, the light reflected by the light-emitting surface 12 contributes to laser oscillation of the semiconductor laser 10.

Figure 2:
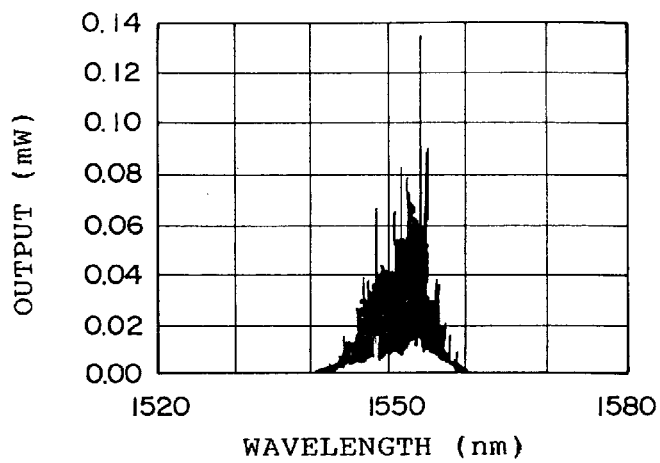
FIG. 2 is a chart showing a wavelength spectrum of light emitted from a semiconductor laser 10.

Nevertheless, since the reflectance of the light-emitting surface 12 is as low as 5%, most of the spontaneously emitted light and stimulatively emitted light can pass through the light-emitting surface 12. FIG. 2 is a chart showing a wavelength spectrum of light emitted from the light-emitting surface 12. The emitted light has a wavelength range of about 1,540 nm to about 1,560 nm with a wavelength width of about 20 nm.

Figure 3:
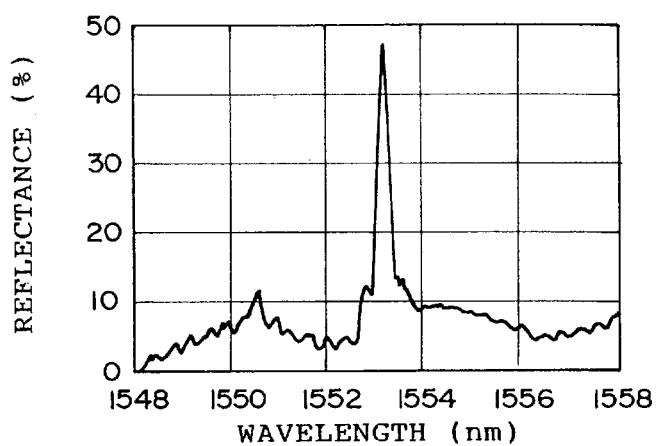
FIG. 3 is a chart showing a reflection spectrum of a diffraction grating 35.

The light emitted through the light-emitting surface 12 passes through the lens 20 and then is made incident on the optical fiber 30, thereby reaching the diffraction grating 35. FIG. 3 is a chart showing a reflection spectrum of the diffraction grating 35. As indicated by FIG. 3, the reflection wavelength $\lambda_R$ of the diffraction grating 35 is about 1,553.3 nm, and relatively high reflectance is exhibited over a narrow wavelength width whose center is this wavelength. Here, the reflectance with respect to the reflection wavelength is about 47%.

The light reflected by the diffraction grating 35 is made incident, by way of the lens 20, on the semiconductor laser 10 from the light-emitting surface 12, and reaches the light-reflecting surface 11 while causing stimulated emission. The light reflected by the light-reflecting surface 11 advances, while causing stimulated emission, so as to be emitted from the light-emitting surface 12 and then incident on the optical fiber 30 again. This incident light reaches the diffraction grating 35, where it is reflected again. Thus, as reflection is repeated between the diffraction grating 35 and the light-reflecting surface 11, light is amplified so as to finally generate laser oscillation. Consequently, laser light is emitted from the end face of the optical fiber 30 facing the optical coupler 40. Thus emitted laser light is the inspection laser light output from the inspection light source 110.

The light generating laser oscillation between the diffraction grating 35 and the light-reflecting surface 11 is limited to light having a wavelength which is reflected by the diffraction grating 35 with a relatively high reflectance. While the light passing through the light-emitting surface 12 to enter the optical fiber 30 extends over the wavelength range of about 1,540 nm to about 1,560 nm as shown in FIG. 2, the diffraction grating 35 reflects with a sufficient reflectance only the light extending over a wavelength width of about 0.3 nm whose center is about 1,553.3 nm as shown in FIG. 3. Accordingly, light with a wavelength width narrower than that obtained when the semiconductor laser 10 is used alone causes laser oscillation. Since the reflectance of the diffraction grating 35 with respect to the reflection wavelength is sufficiently higher than the reflectance of the light-reflecting surface 11, the output of the laser light due to laser oscillation between the diffraction grating 35 and the light-reflecting surface 11 becomes sufficiently higher than that generated by the semiconductor laser 10. As a result, the laser light output from the inspection light source 110 has a wavelength width narrower than that of the laser light output from the semiconductor laser 10.

Figure 4:
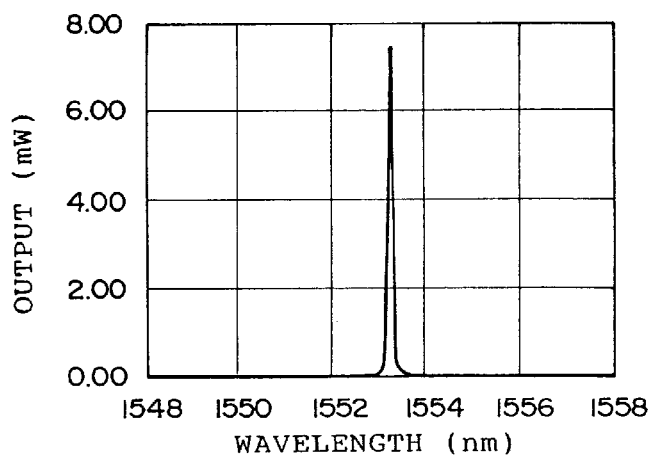
FIG. 4 is a chart showing an oscillation spectrum of an inspection light source 100.

FIG. 4 is a chart showing an oscillation spectrum of the inspection light source 110. As indicated by this chart, the inspection light source 110 performs single longitudinal mode laser oscillation. Of the light reflected by the diffraction grating 35, only light components exhibiting a relatively high reflectance satisfy the oscillation condition. Accordingly, the wavelength width (half-width) of the oscillation spectrum is about 0.1 nm, which is further narrower than the line width of the reflection spectrum of the diffraction grating 35.

Here, when the output wavelength width of the inspection light source 110 is 2 nm or smaller, characteristics of an optical fiber at a specific wavelength can be measured preferably. The output wavelength width of the inspection light source 110 can be adjusted when the line width of the reflection spectrum of the diffraction grating 35 is appropriately set.

The inspection light source 110 of this embodiment utilizes, as it is, a semiconductor laser which has conventionally been used as inspection light source, while adding the lens 20 and the optical fiber 30 thereto. Accordingly, while laser oscillation occurs between the diffraction grating 35 and the light-reflecting surface 11, laser oscillation also occurs in the semiconductor laser 10 between the light-reflecting surface 11 and the light-emitting surface 12. Nevertheless, since laser light with a narrow wavelength width can be obtained when laser oscillation is generated between the diffraction grating 35 and the light-reflecting surface 11, laser oscillation in the semiconductor laser 10 is not always necessary in practice. Accordingly, the reflectance of the light-emitting surface 12 can be made lower than that in this embodiment without the reflectance of the light-reflecting surface 11 being changed. Since the power of the light emitted from the light-emitting surface 12 is enhanced in this manner, the reflectance of the diffraction grating 35 may be made lower than that in this embodiment.

Since the OTDR apparatus 100 of this embodiment comprises the above-mentioned inspection light source 110 and thereby uses laser light with a sufficiently narrow wavelength width as inspection light, characteristics of the optical fiber 60 to be measured at a specific wavelength can be preferably measured.

Also, the inspection light source 110 has a simple configuration constituted by the semiconductor laser 10, the optical fiber 30, and the lens 20 for optically coupling them together. Thus, the number of parts in the OTDR apparatus 100 is remarkably smaller than that in the conventional OTDR apparatus using an optical fiber laser as its light source. Accordingly, the OTDR apparatus 100 of this embodiment is advantageous in that designing of optical systems and disposition of optical parts therein are easy, and that the apparatus can be made effortlessly with a smaller size. The small number of parts and the effortless manufacture lead to a low manufacturing cost. Accordingly, the OTDR apparatus of this embodiment is also suitable for mass production.

(Embodiment 2)

The OTDR apparatus of this embodiment differs from that of Embodiment 1 in that it comprises an inspection light source which, in addition to the constituents of the inspection light source 110 in Embodiment 1, further comprises a stress applying device 70 for applying a stress to the optical fiber 30.

Figure 5:
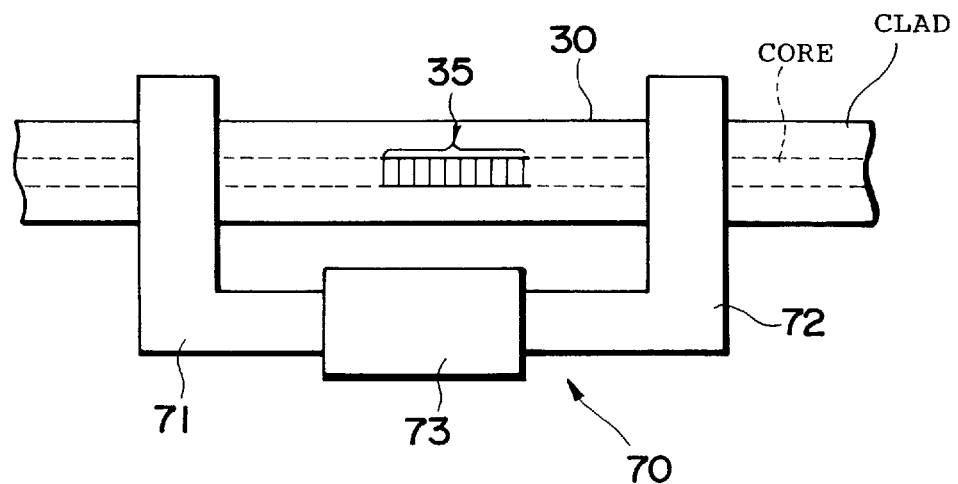
FIG. 5 is a configurational view showing a main part of an OTDR apparatus according to Embodiment 2.

FIG. 5 is a view showing a configuration of the stress applying device 70. The stress applying device 70 comprises arms 71 and 72 for holding the optical fiber 30 respectively at two points between which the diffraction grating 35 is held, and a piezoelectric device 73 to which the arms 71 and 72 are attached. To the piezoelectric device 73, a non-depicted variable voltage source is connected. The piezoelectric device 73 expands or contracts as a driving voltage is applied thereto from the variable voltage source. The direction of expansion or contraction is substantially in parallel to the optical-axis direction of the optical fiber 30.

When the piezoelectric device 73 expands or contracts, a stress (tension or pressure) is applied, by way of the arms 71 and 72, to the optical fiber 30 in the optical-axis direction. Consequently, the period of the diffraction grating 35 or the effective refractive index of the core changes. Since the reflection wavelength of the diffraction grating 35 depends on the period of the diffraction grating 35 and the effective refractive index of the core as indicated by the above-mentioned expression (1), the reflection wavelength of the diffraction grating 35 also changes in response to their changes. When the reflection wavelength changes, the output wavelength of the inspection light source also changes. Accordingly, when the magnitude or polarity of the driving voltage for the piezoelectric device 73 is adjusted so as to control the expansion and contraction of the piezoelectric device 73, the output wavelength of the inspection light source can be arbitrarily switched over. In this embodiment, an output wavelength change of 10 nm/kg can be realized.

Thus, since the OTDR apparatus of this embodiment comprises an inspection light source with a variable wavelength, it can select a wavelength from a predetermined variable wavelength range so as to measure characteristics of the optical fiber to be measured at this wavelength. While this inspection light source attaches the stress applying device 70 to the optical fiber 30 of the inspection light source 110 in Embodiment 1, no new optical parts are added thereto. Accordingly, as in the case of Embodiment 1, the OTDR apparatus of this embodiment is also advantageous in that designing of optical systems and disposition of optical parts therein are easy, and that the apparatus can be made effortlessly. Also, even though the stress applying device 70 is added thereto, the number of parts is still small, and the stress applying device 70 is a small device utilizing a piezoelectric device. Therefore, the OTDR apparatus as a whole can attain a sufficiently small size.

(Embodiment 3)

In the OTDR apparatus of this embodiment, the configuration of the inspection light source also differs from the inspection light source 110 of Embodiment 1. Namely, the inspection light source in the OTDR apparatus of this embodiment further comprises, in addition to the constituents of the inspection light source 110 in Embodiment 1, a temperature adjusting bath storaging the part of the optical fiber 30 including the diffraction grating 35. This temperature adjusting bath arbitrarily changes the temperature therein within a predetermined temperature range.

Figure 6:
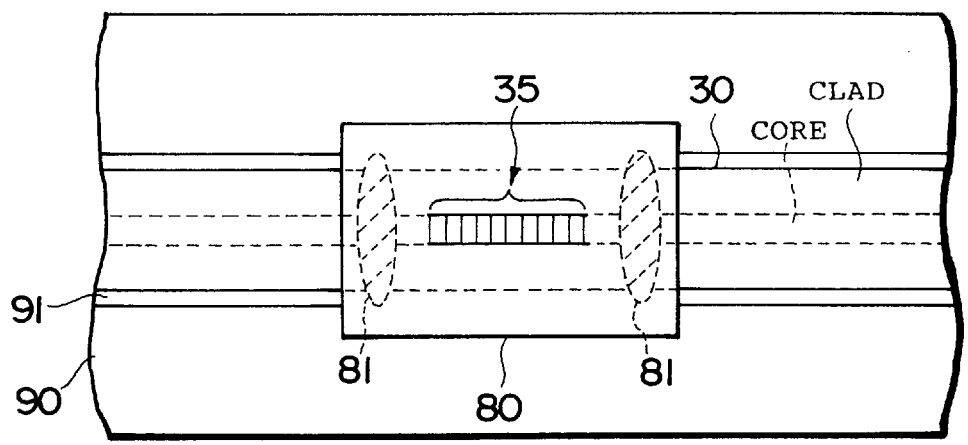
FIG. 6 is a configurational view showing a main part of an OTDR apparatus according to Embodiment 3.

Also, in this embodiment, as shown in FIG. 6, the optical fiber 30 is buried in a V-shaped groove 91 of a stationary plate 90. To the part of the optical fiber 30 including the diffraction grating 35, a metal plate (aluminum plate) 80 is attached. This aluminum plate 80 is bonded by means of an adhesive to the optical fiber 30 at two positions between which the diffraction grating 35 is held.

When the temperature within the temperature adjusting bath is changed, a stress is applied to the optical fiber 30 in response to the difference between the coefficient of thermal expansion of the aluminum plate 80 and that of the optical fiber 30. Consequently, the part of the optical fiber 30 including the diffraction grating 35 expands or contracts along the optical-axis direction, whereby the period of the diffraction grating 35 changes to shift the reflection wavelength. Accordingly, when the temperature within the temperature adjusting bath is regulated, the output wavelength of the inspection light source can be arbitrarily switched over. In this embodiment, an output wavelength change of 0.05 nm/°C. can be realized.

Here, since the optical fiber 30 itself expands or contracts when the temperature within the temperature adjusting bath changes, the reflection wavelength of the diffraction grating 35 can change even when the aluminum plate 80 is not provided. When the aluminum plate 80 is provided, however, the change in reflection wavelength with respect to change in temperature increases, whereby the output wavelength of the inspection light source can be advantageously switched over within a broader wavelength range. Also, better controllability is attained when the aluminum plate 80 is provided.

Since the OTDR apparatus in this embodiment also comprises a wavelength-variable inspection light source as in the case of the OTDR apparatus in Embodiment 2, it can select a wavelength from a predetermined variable wavelength range so as to measure characteristics of the optical fiber to be measured at this wavelength. Also, this inspection light source adds no new optical parts to the configuration of the inspection light in Embodiment 1 and, accordingly, is advantageous in that designing of optical systems and disposition of optical parts therein are easy, and that the apparatus can be made effortlessly.

(Embodiment 4)

First, a pulse laser light source used in the OTDR apparatus of this embodiment will be explained.

Figure 7:
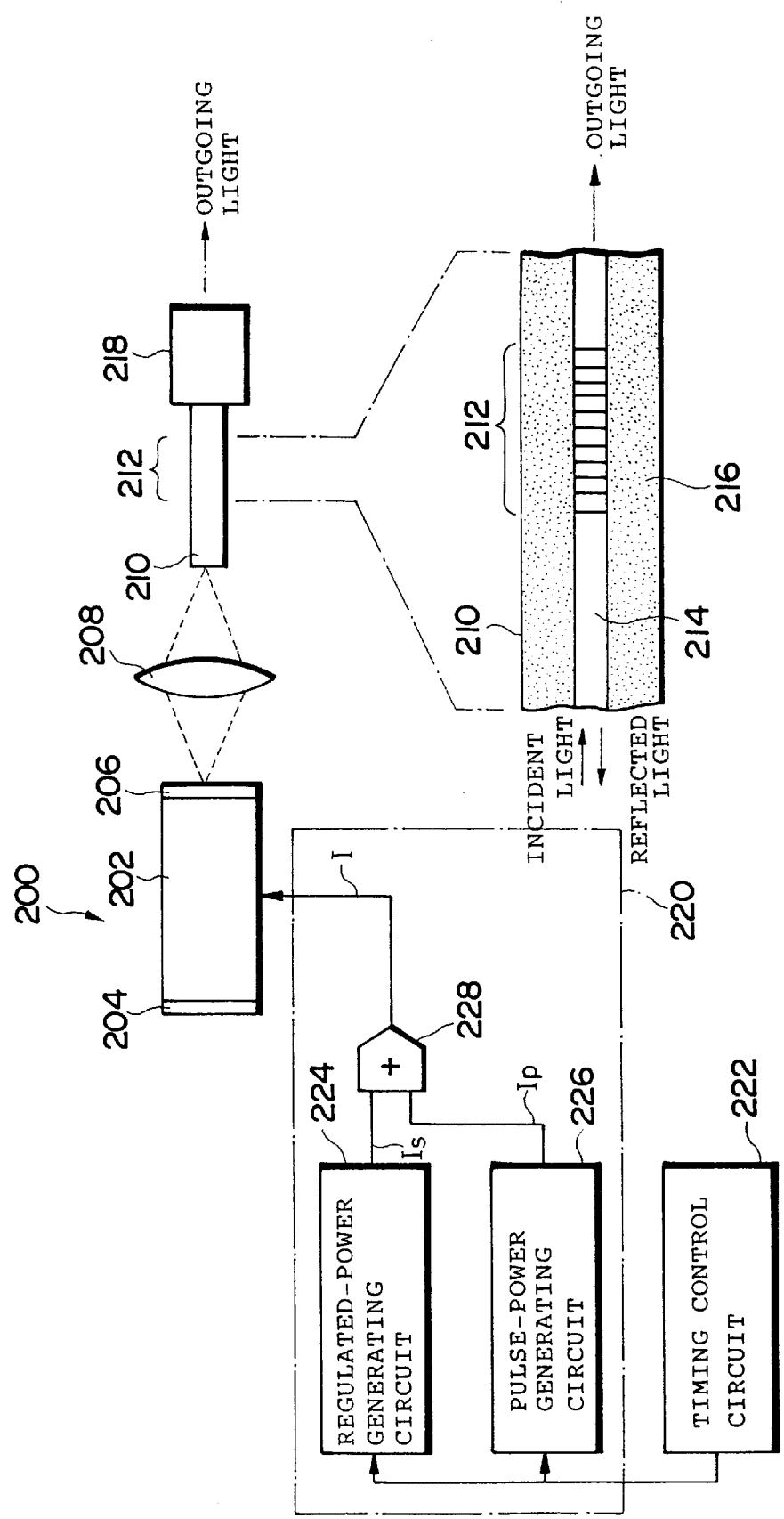
FIG. 7 is an explanatory view showing a schematic configuration of a first example of a pulse laser light source in an OTDR apparatus in accordance with Embodiment 4.

With reference to FIGS. 7 to 11, a first example of the pulse laser light source will be explained. Initially, with reference to FIG. 7, provided in the apparatus is a semiconductor light-emitting device (Fabry-Perot type laser) 200 comprising a laser medium 202 made of a semiconductor having a hetero-structure of InGaAsP/InP, for example, and light-reflecting surfaces 204 and 206 which are opposed to each other and respectively disposed at both ends of the laser medium 202. One light-reflecting surface 204 has a high reflectance of about 80%, for example, while the other light-reflecting surface 206 has a low reflectance of about 5%, for example, such that the laser light stimulatively emitted at the laser medium 202 passes through and exits from the light-reflecting surface 206.

A condenser lens 208 is disposed so as to face the light-reflecting surface 206. Disposed to face the condenser lens 208 from behind is an end face of a core in an optical fiber 210 in which an optical waveguide type diffraction grating 212, which will be explained later, is formed. Here, both the position from which the laser light exits and the end face of the core in the optical fiber 210 are disposed so as to coincide with the optical axis of the condenser lens 208.

As shown in a longitudinal cross section depicted as being enlarged in FIG. 7, the optical waveguide type diffraction grating 212 has such a configuration that, as ultraviolet rays or the like have irradiated a part of a core 214 disposed in a clad 216 of the optical fiber 212 along the optical wave-guiding direction thereof, a plurality of refractive-index changing portions (depicted as banded portions) having refractive index $n_2$ which is different from original refractive index $n_1$ of the core 212 ($n_2 < n_1$ in this embodiment) are formed. Namely, it has a so-called refractive-index change distribution in which portions with refractive indices $n_1$ and $n_2$ periodically alternate with a predetermined pitch A along the optical waveguiding direction, and exhibits a wavelength selectivity for selectively reflecting, of the light transmitted through this refractive-index change distribution, wavelength light with $\lambda = 2n_1 \Delta$. Namely, when incident light is introduced into the core 212 from one end (side facing the condenser lens 208), the light with the wavelength $\lambda$ returns toward the condenser lens 208 as reflected light due to the wavelength selectivity of the optical waveguide type diffraction grating 212, while the light excluding the wavelength λ is output to the other end as outgoing light. Here, the light transmittance of the optical waveguide type diffraction grating 212 is set to about 47%.

Disposed at the other end of the optical fiber 210 is an optical connector 218 for connecting the former to other optical fibers or the like.

Also provided are a driving section 220 for supplying a driving current (electric power) I for excitation to the laser medium 202, and a timing control circuit 222 for controlling the output timing of this driving current I. The driving section 220 comprises a stabilizing-power generating circuit 224 for outputting a stabilizing current (electric power) $I_s$ for stabilizing laser oscillation which will be explained later or the like, and a pulse-power generating circuit 226 for outputting a pulse current (electric power) $I_p$, while the respective output timings of the currents $I_s$ and $I_p$ in these circuits 224 and 226 are controlled by the timing control circuit 222.

Further provided in the driving section 220 is a current adding circuit 228 which adds the currents $I_s$ and $I_p$ together so as to supply the driving current I ($=I_s+I_p$) to the laser medium 202.

In the following, the operation of the pulse laser apparatus thus configured will be explained with reference to FIGS. 7 to 11.

Figure 8:
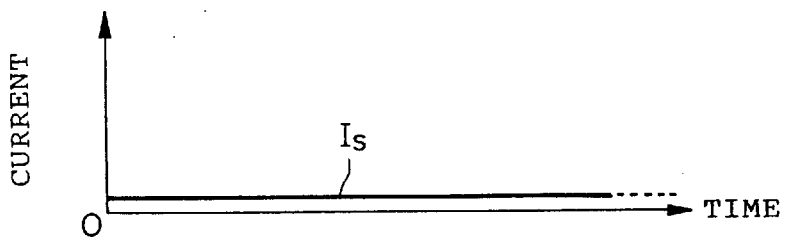
FIGS. 8 to 11 are explanatory views for explaining an operation and principle of the pulse laser light source in the first example.
Figure 9:
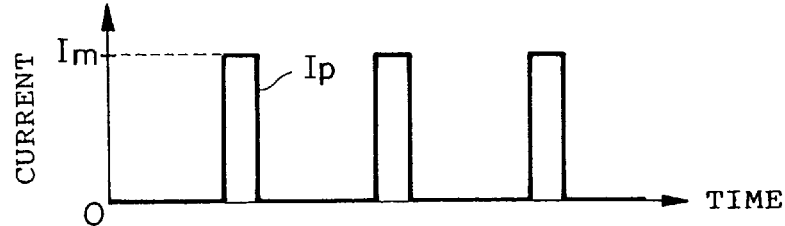

The stabilizing-power generating circuit 224 in the driving section 220 continuously outputs a certain constant level of the stabilizing current $I_s$ under the control of the timing control circuit 222 as shown in FIG. 8, whereas the pulse-power generating circuit 226 outputs the pulse current $I_p$ having a pulse form such as that shown in FIG. 9 according to a control signal with a predetermined timing from the timing control circuit 222.

Figure 10:
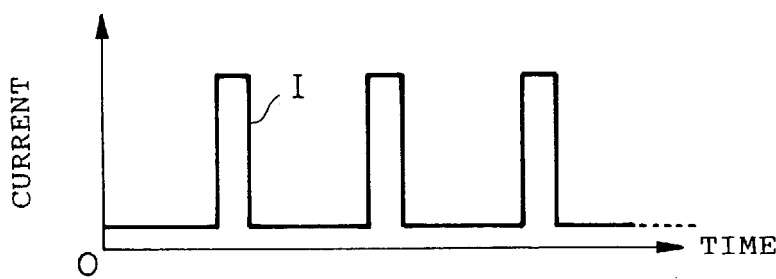

During a period which is not designated by the control signal from the timing control circuit 222, the pulse current $I_p$ is 0 A; whereas, at the time indicated by the above-mentioned control signal, it is set to a current level $I_m$ which is sufficient for exciting the laser medium 202. The stabilizing current $I_s$ is set to a constant level of about 1/10 of the current level $I_m$, i.e., $I_m/10$. Also, the stabilizing current $I_s$ is set to a level which is at a threshold current level necessary for the semiconductor light-emitting device 200 to generate laser oscillation or higher. As these currents $I_s$ and $I_p$ are added together at the current adding circuit 228, the driving current I ($=I_s+I_p$) such as that shown in FIG. 10 is supplied to the laser medium 202.

During the period in which the driving current I corresponds to the stabilizing current $I_s$ ($=I_m/10$), the light excited by this current $I_s$ in the laser medium 202 is introduced into the core 214 of the optical fiber 210 by way of the light-reflecting surface 206 and the condenser lens 208, and a part of the light with the reflection wavelength (Bragg wavelength) λ set in the optical waveguide type diffraction grating 212 is further reflected so as to be made incident on the laser medium 202 again by way of the condenser lens 208 and the light-reflecting surface 206, thereby contributing to the stimulated emission resulting from an interference phenomenon caused by the light-reflecting surfaces 204 and 206. Further, thus stimulatively emitted light is introduced into the core 214 of the optical fiber 210 by way of the light-reflecting surface 206 and the condenser lens 208, and a part of the light with the reflection wavelength (Bragg wavelength) λ set in the optical waveguide type diffraction grating 212 is further reflected so as to be made incident on the laser medium 202 again by way of the condenser lens 208 and the light-reflecting surface 206, thereby contributing to the above-mentioned stimulated emission. Accordingly, as the foregoing phenomenon of stimulated emission is continuously generated, the Fabry-Perot type laser emits laser light having a wavelength equal to the reflection wavelength λ set in the optical waveguide type diffraction grating 212. Here, since the driving current I during this period corresponds to the stabilizing current $I_s$ ($=I_m/10$), the optical intensity of the laser light emitted during this period becomes lower than the desired intensity of pulse laser light. Specifically, since the relationship of $I_s=I_m/10$ is set, the former becomes lower than the latter by 10 dB.

Next, at the time in which the pulse current $I_p$ is generated in the driving current I, as the driving current I rapidly increases, pulse laser light having a pulse form with a high optical intensity is emitted from the semiconductor light-emitting device 200 and, by way of the condenser lens 208 and the optical fiber 210 as well as the optical connector 218, is output as the outgoing light.

Figure 11:
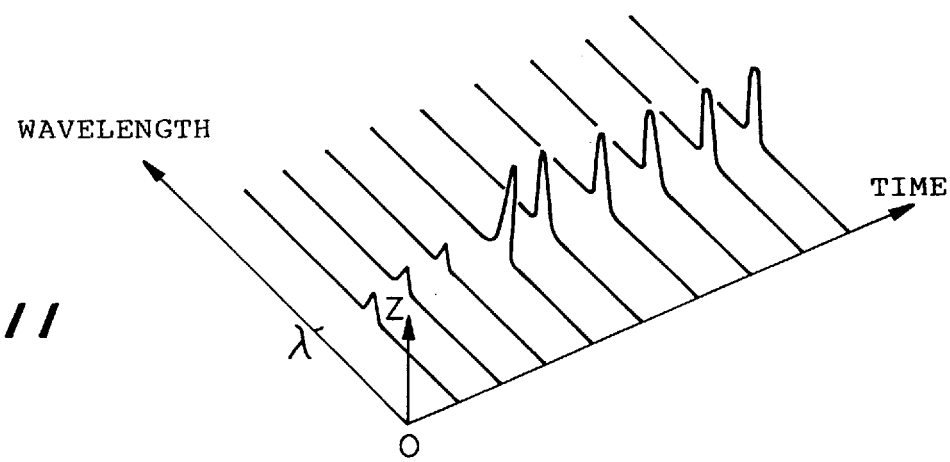

FIG. 11 schematically shows a result of measurement in which change in the spectrum distribution of the outgoing light output from the optical connector 218 is actually measured with time, with its Z axis indicating the optical intensity. From this chart, it has been confirmed that laser light at the wavelength λ with a low optical intensity is generated during the period in which the driving current laser becomes the stabilizing current $I_s$ ($=I_m/10$), whereas pulse-shaped laser light at the wavelength λ with a high optical intensity is generated at the time when the pulse current $I_p$ is supplied. In practice, laser light with a wavelength range having a half-width of about 0.3 nm whose center is the wavelength λ could be realized.

Further, it is necessary for the interval between adjacent supplies of the pulse current $I_p$ (i.e., period during which only the stabilizing current $I_s$ is supplied) to be set to a period during which the light emitted from the laser medium 202 is reflected by the optical waveguide type diffraction grating 212 and then returns to contribute to the stimulated emission (period for one to-and-fro travel) or longer. According to the result of actual measurement, when the pulse current $I_p$ was supplied at the time after the stabilizing current $I_s$ was continuously supplied over the period for about 200 to-and-fro travels, very stable pulse laser light with a narrow wavelength range could be output.

Thus, in the pulse laser light source of the first example, before the pulse laser light with a narrow wavelength range originally required is generated, the stabilizing current $I_s$ is supplied to the semiconductor light-emitting device 200 so as to effect laser oscillation beforehand. Accordingly, at the time when the pulse current $I_p$ is supplied, pulse laser light with a desired narrow wavelength range is obtained. Therefore, a pulse laser apparatus whose response is much better and whose stability concerning the narrow wavelength range is much more preferable as compared with those in the prior art can be provided. Namely, in the prior art, immediately after the pulse current is supplied to the pulse laser apparatus, light having a wide wavelength range is generated, thereby making it difficult to attain pulse laser light with a desired narrow wavelength range. The pulse laser light source of this example, by contrast, exhibits an excellent effect that pulse laser light with a stable narrow wavelength range can be obtained immediately after pulse current is supplied thereto.

During the period in which only the stabilizing current $I_s$ is supplied to the laser medium 202, laser light, which may become a noise light component, is also output. Nevertheless, the optical intensity of this noise light component can be made smaller than that of the desired pulse laser light when the stabilizing current $I_s$ is set to a level lower than that of the pulse current $I_p$ as mentioned above. Accordingly, it does not result in a substantial problem when the pulse laser source is applied to fields of various optical instruments, optical communications, and the like.

Here, in the driving section 220 of the pulse laser light source in the first example, the stabilizing-power generating circuit 224 and the pulse-power generating circuit 226 are provided independently from each other so as to respectively output the stabilizing current $I_s$ and the pulse current $I_p$, which are then added together in terms of current so as to generate the driving signal I. Without being restricted to such a configuration, however, the present invention may be configured so as to have a driving section which directly outputs the driving current I having a waveform shown in FIG. 10, for example.

In the following, the second example of the pulse laser light source used in the OTDR apparatus of this embodiment will be explained with reference to FIGS. 12 to 15. Here, since the configuration of this apparatus is basically the same as the pulse laser source shown in FIG. 7, only their differences will be explained in detail without their overlapping explanations being repeated.

Figure 12:
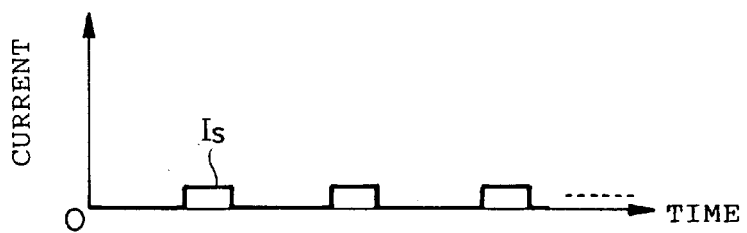
FIGS. 12 to 15 are explanatory views for explaining an operation and principle of a second example of the pulse laser light source in the OTDR apparatus in accordance with Embodiment 4.
Figure 13:
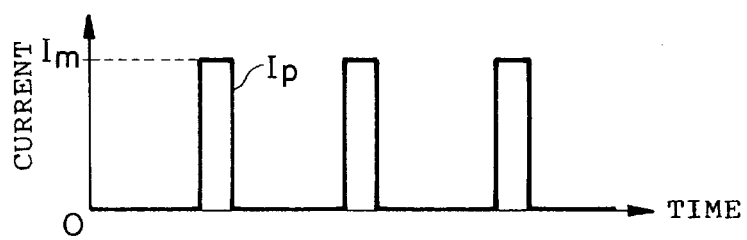

The stabilizing-power generating circuit 224 in FIG. 7 outputs the stabilizing current $I_s$ having a rectangular shape as shown in FIG. 12 according to a control signal from the timing control circuit 222. Further, the pulse-power generating circuit 226 outputs the pulse current $I_p$ having a pulse form as shown in FIG. 13 according to a control signal output from the timing control circuit 222. Here, timing control is perfomed such that the time width (generation period) of each rectangular block of the stabilizing current $I_s$ is longer than that of the pulse current $I_p$, and that the stabilizing current $I_s$ is synchronously output at a time which is prior, by a predetermined duration, to the time at which the pulse current $I_p$ is output.

Figure 14:
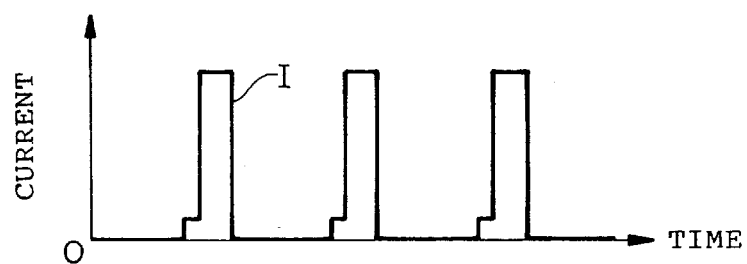

Accordingly, the driving current I ($=I_s+I_p$) supplied to the laser medium 202 in FIG. 7 changes stepwise as shown in FIG. 14. Here, during a period which is not designated by the control signal from the timing control circuit 222, the pulse current $I_p$ is 0 A; whereas, at the time indicated by the above-mentioned control signal, it is set to a current level $I_m$ which is sufficient for exciting the laser medium 202. The stabilizing current $I_s$ is set to a constant level of about $\frac{1}{10}$ of the current level $I_m$, i.e., $I_m/10$. Also, the stabilizing current $I_s$ is set to a level which is at a threshold current level necessary for the semiconductor light-emitting device 200 to generate laser oscillation or higher.

When the driving current I having a waveform shown in FIG. 14 is supplied to the semiconductor light-emitting device 200 in FIG. 7, laser light with the wavelength λ set at the optical waveguide type diffraction grating 212 is output, though with a low optical intensity, during the time in which the stabilizing current $I_s$ is supplied alone; whereas pulse laser light having a high optical intensity and a narrow wavelength range with a center wavelength of λ is output when the driving current I, in which the pulse current $I_p$ and the stabilizing current $I_s$ are added together, is supplied.

Figure 15:
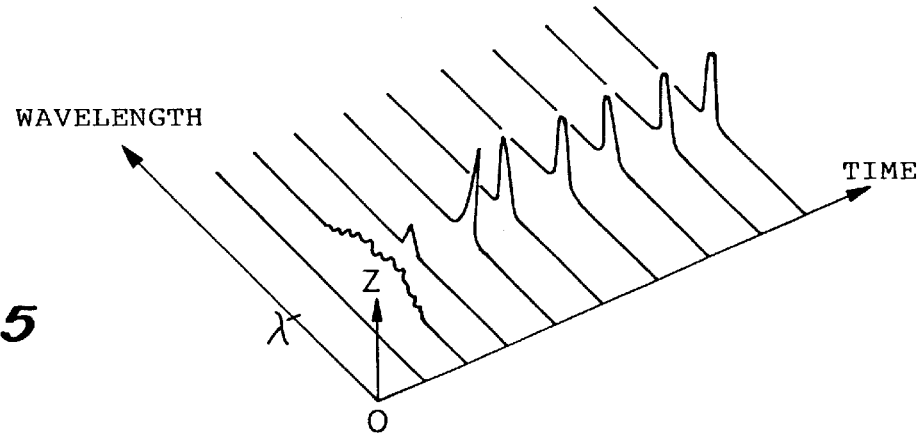

FIG. 15 schematically shows a result of measurement in which change in the spectrum distribution of the outgoing light output from the optical connector 218 is actually measured with time, with its Z axis indicating the optical intensity. From this chart, it has been confirmed that, though light with a broad wavelength range is generated during a short period of time immediately after the driving current I rises from 0 A to $I_m/10$ (i.e., immediately after the stabilizing current $I_s$ rises from 0 A to $I_m/10$); laser light at the wavelength λ with a low optical intensity is generated after this period has passed, and desired pulse-shaped laser light at the wavelength λ with a high optical intensity is generated at the time when the pulse current $I_p$ is supplied. In practice, laser light with a wavelength range having a half-width of about 0.3 nm whose center is the wavelength λ could be realized.

Further, it is necessary for the interval between adjacent supplies of the pulse current $I_p$ (i.e., period during which only the stabilizing current $I_s$ is supplied) to be set to a period during which the light emitted from the laser medium 202 is reflected by the optical waveguide type diffraction grating 212 and then returns to contribute to the stimulated emission (period for one to-and-fro travel) or longer. It has been confirmed by examination that, when the pulse current $I_p$ is supplied at the time after the stabilizing current $I_s$ is continuously supplied over the period for about 200 to-and-fro travels, very stable pulse laser light with a narrow wavelength range can be output.

Thus, according to the pulse laser light source of the second example, though light having a broad wavelength range is slightly generated, a pulse laser light source whose response is much better and whose stability concerning the narrow wavelength range is much more preferable as compared with those in the prior art can be provided.

During the period in which only the stabilizing current $I_s$ is supplied to the laser medium 202, laser light, which may become a noise light component, is also output. Nevertheless, the optical intensity of this noise light component can be made lower than that of the desired pulse laser light when the stabilizing current $I_s$ is set to a level lower than that of the pulse current $I_p$ as mentioned above. Accordingly, it does not result in a substantial problem when the pulse laser source is applied to fields of various optical instruments, optical communications, and the like.

Here, in the driving section 220 of the pulse laser light source in the second example, the stabilizing-power generating circuit 224 and the pulse-power generating circuit 226 are provided independently from each other so as to respectively output the stabilizing current $I_s$ and the pulse current $I_p$, which are then added together in terms of current so as to generate the driving signal I. Without being restricted to such a configuration, however, the present invention may be configured so as to have a driving section which directly outputs the driving current I having a waveform shown in FIG. 14, for example.

Figure 16:
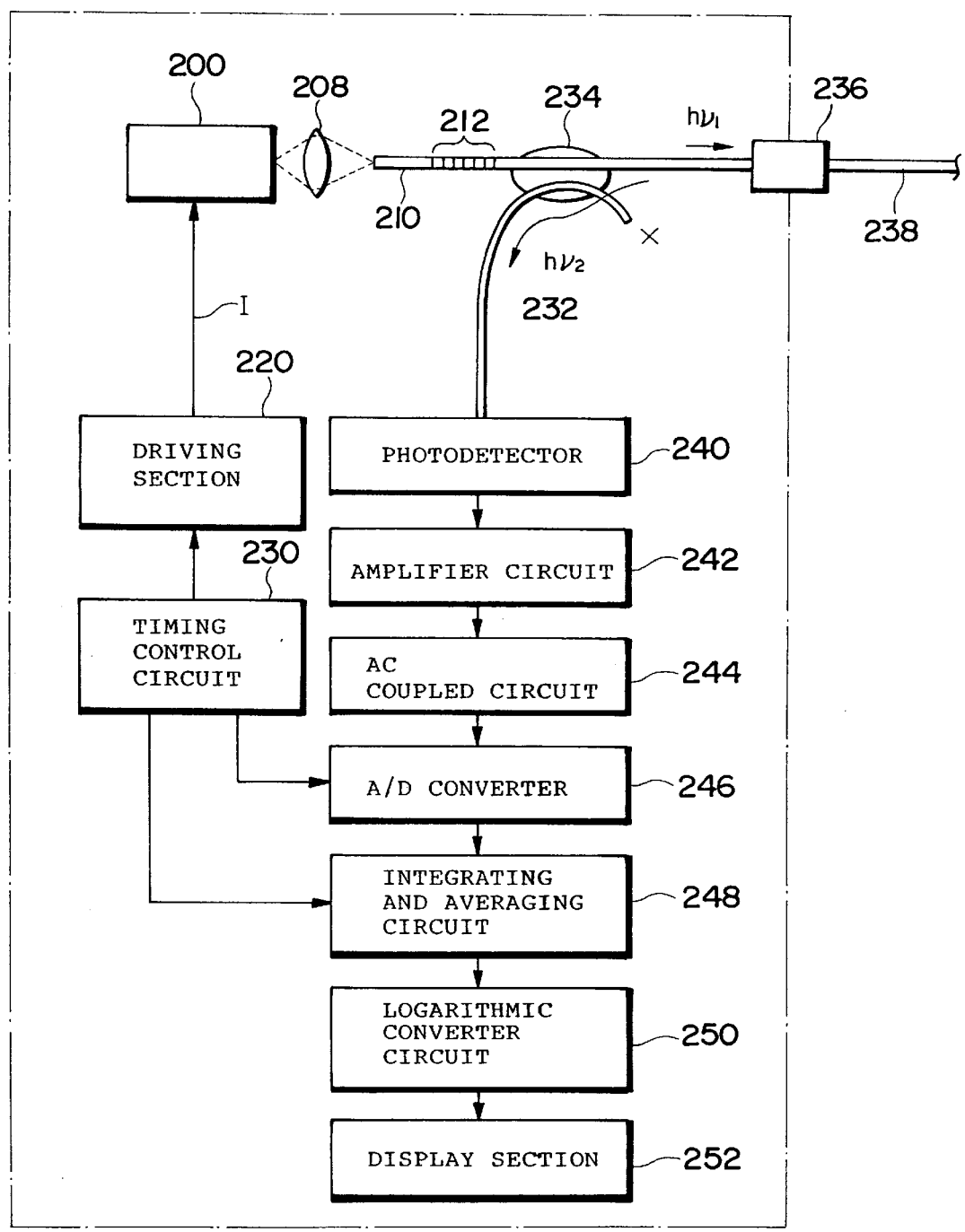
FIG. 16 is an explanatory view showing a schematic configuration of a mode of realization of the OTDR apparatus in accordance with Embodiment 4.

In the following, a mode of realization of the OTDR apparatus in this embodiment will be explained with reference to FIG. 16. In FIG. 16, parts identical or equivalent to those in FIG. 7 will be referred to with marks identical to each other.

This OTDR apparatus comprises the semiconductor light-emitting device 200 and the driving section 220 both shown in FIG. 7, as well as a timing control circuit 230 provided in a microcomputer system or the like. This timing control circuit 230 outputs a control signal for making the driving section 220 supply the driving current I having a waveform such as that shown in FIG. 10 or 14 to the semiconductor light-emitting device 200 and also output a signal for controlling the operation timing of the OTDR apparatus as a whole.

The condenser lens 208 is disposed so as to face the light-emitting end of the semiconductor light-emitting device 200, and the core end of the optical fiber 210 having the optical waveguide type diffraction grating 212 is disposed so as to face the condenser lens 208 from behind, thereby realizing the pulse laser apparatus shown in FIG. 7.

To one side end of the optical fiber 210, a bidirectional light-splitting coupler 234 which optically connects to another optical fiber (referred to as "guiding fiber" hereinafter) 232 for guiding measurement light, which will be explained later, is connected. Connected to the terminator of the optical fiber 210 is an optical connector 236, to which an optical fiber transmission line 238 or the like to be inspected is connected.

One end of the guiding fiber 232 is terminated by a nonreflective material or the like which inhibits reflection of light, while the other end is connected to a measurement section having constituents 240 to 252 explained in the following.

Namely, connected to the other end of the guiding fiber 232 is a photodetector 240 having a photoelectric converter device for photoelectrically converting the measurement light guided by way of the light-splitting coupler 234. Further connected to the photodetector 240 in cascade are an amplifier circuit 242 for amplifying the photoelectrically-converted signal output from the former; an AC coupled circuit 244 having an offset eliminating circuit for eliminating AC components in the signal output from the amplifier circuit 242, a low-band eliminating filter, and the like; an A/D converter 246 for converting the signal passed through the AC coupled circuit 244 into digital data; an integrating and averaging circuit 248 for integrating the digital data with a predetermined operation period and computes the temporal mean value thereof; a logarithmic converter circuit 250 for logarithmically converting the temporal mean value output from the integrating and averaging circuit 248; and a display section 252 for displaying the logarithmic value data output from the logarithmic converter circuit 250 onto a CRT display or the like through various kinds of graphic processing.

Here, the A/D conversion timing in the A/D converter 246 and the operation period in the integrating and averaging circuit 248 are controlled by the timing control circuit 230. Further, their timings are in synchronization with the timing at which pulse laser light with a narrow wavelength range is output from the semiconductor light-emitting device 200 according to the driving current I.

In the following, the operation of the OTDR apparatus in this embodiment will be explained.

As the driving current I having such a waveform as that shown in FIG. 10 or 14 is supplied to the semiconductor light-emitting device 200, pulse laser light having a narrow wavelength range is emitted therefrom and introduced into the optical fiber transmission line 238 by way of the optical fiber 210, light-splitting coupler 234, and optical connector 236. Namely, thus obtained pulse laser light $hv_1$ having a narrow wavelength range becomes strobe light for inspecting whether there is abnormality or the like in the optical fiber transmission line 238 or not.

In the optical fiber transmission line 238, backscattering light advancing toward the opposite direction (toward the optical connector 236) is generated due to Rayleigh scattering and becomes measurement light $hv_2$, which is then guided to the guiding fiber 232 by way of the light-splitting coupler 234.

Thereafter, the photodetector 240 photoelectrically converts the measurement light $hv_2$ into a signal, which is then amplified by the amplifier circuit 242. After unnecessary AC components are eliminated therefrom by the AC coupled circuit 244, this signal is supplied to the A/C converter 246 so as to be converted into digital data. Further, as the integrating and averaging circuit 248 integrates the digital data and computes the mean value thereof, an optical power indicative of the degree of abnormality in the optical fiber transmission line 238, distance to the position where the abnormality is generated, or the like is extracted. This mean value is logarithmically converted by the logarithmic converter circuit 250, and thus converted value is displayed on the display section 252, thereby indicating the result of inspection of abnormality in the optical fiber transmission line 238.

As this OTDR apparatus uses pulse laser light having a very narrow wavelength range as strobe light $hv_1$ so as to measure an object to be measured, the distance to the point where the abnormality occurs in the object can be measured precisely, and measurement with a high S/N can be perfomed.

(Embodiment 5)

Figure 17:
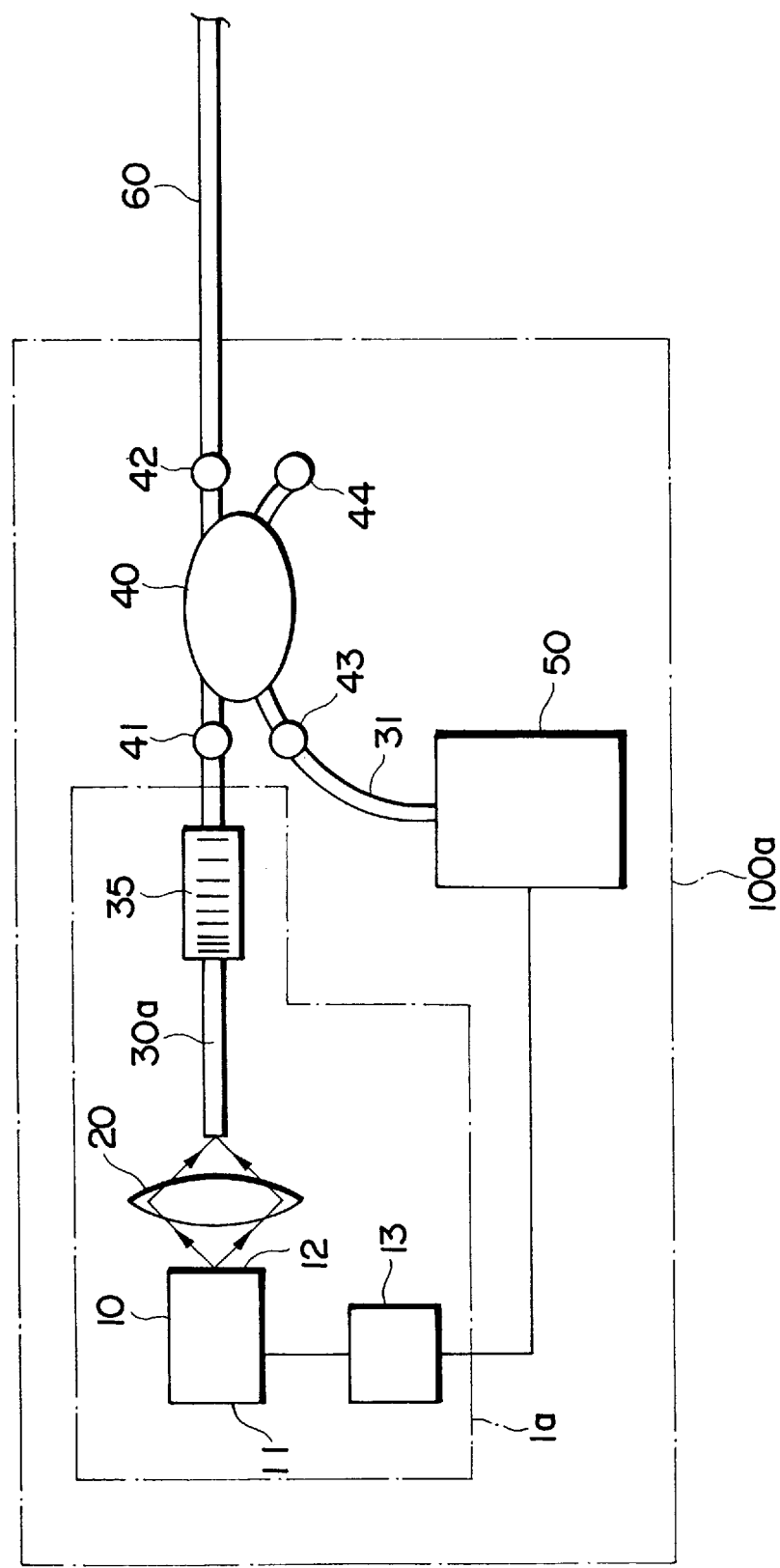
FIG. 17 is a view showing a view showing a configuration of an OTDR apparatus in accordance with Embodiment 5.

FIG. 17 is a view showing a configuration of an OTDR apparatus 100a in this embodiment. This OTDR apparatus 100a comprises an inspection light source 1a which oscillates in a pulsing manner to emit inspection laser light for OTDR test. This inspection light source 1a is formed as an optical fiber 30a is optically connected, by way of the lens 20, to the semiconductor light-emitting device (Fabry-Perot type semiconductor laser) 10 which has been conventionally used as inspection light source for OTDR apparatuses.

The Fabry-Perot type semiconductor laser 10 is a semiconductor light-emitting device constituted by a heterostructure of InGaAsP/InP. To this semiconductor laser 10, a driving circuit 13 is connected. As the driving circuit 13 supplies an operating current flowing through the semiconductor laser 10, the latter is excited so as to output pulse laser light having a wavelength range of about 20 nm extending over the wavelength range of about 1,540 nm to about 1,560 nm. On both sides of the hetero-structure, the light-reflecting surface 11 and the light-emitting surface 12 are respectively disposed. These surfaces are opposed to each other substantially in parallel, thereby forming a Fabry-Perot type laser resonator. The light-reflecting surface 11 has a high reflectance of about 80%, while the light-emitting surface 12 has a low reflectance of about 5%. As in the case of most Fabry-Perot type devices, the semiconductor laser 10 is a multi-longitudinal-mode laser and yields large outputs in response to wavelengths in the respective modes.

The lens 20 converges the light emitted from the semiconductor laser 10 so as to make it incident on the optical fiber 30a, thereby coupling the semiconductor laser 10 to the optical fiber 30a in terms of optical power. As the lens 20, an ordinary optical coupling lens such as that used in optical communications can be employed. Here, a tip of the optical fiber 30a may be processed by melting or shaving to have a lens function, thereby eliminating the lens 20 which intervenes between the semiconductor laser 10 and the optical fiber 30a.

The optical fiber 30a comprises an ordinary single-mode optical fiber part and a diffraction grating 35 formed at a predetermined part of its core. It is disposed such that the light emitted from the semiconductor laser 10 is incident thereon by way of the lens 20. Though both core and clad of the optical fiber 30a are made of quartz ($SiO_2$) glass; the clad is made of substantially pure quartz glass while $GeO_2$, which is a material for increasing refractive index, is added to the quartz glass constituting the core. As a result, the core of the optical fiber 30a has a refractive index which is higher than that of the clad by about 0.35%.

The diffraction grating 35 is disposed at a position where the optical path length (with respect to the output light of the semiconductor laser 10) from the light-reflecting surface 11 of the semiconductor laser 10 to the terminator (part farthest from the semiconductor laser 10) of the diffraction grating 35 is about 70 mm. This diffraction grating 35 is an area in the core where the effective refractive index thereof periodically changes between the minimum refractive index and the maximum refractive index according to positions along the optical axis. In other words, the diffraction grating 35 is an area having an effective refractive index distribution which repeatedly changes between the minimum refractive index and the maximum refractive index along the optical axis. Here, the period of this change in refractive index is referred to as period, grating pitch, or the like of the diffraction grating 35.

As is well known, a phenomenon that, when quartz glass doped with germanium is irradiated with ultraviolet rays, the refractive index of thus irradiated portion increases by an amount corresponding to the intensity of the ultraviolet rays can be utilized to form the diffraction grating 35. Namely, when an interference fringe of ultraviolet rays is projected onto the core doped with germanium from the clad surface of the optical fiber, an effective refractive index distribution corresponding to the optical intensity distribution of the interference fringe is formed at the area of the core irradiated with the interference fringe. The area having thus formed effective refractive index distribution is the diffraction grating 35. In this case, the minimum refractive index of the diffraction grating 35 substantially equals to the original effective refractive index (effective refractive index before the irradiation with ultraviolet rays) of the core.

The diffraction grating 35 reflects light over a wavelength range whose center is a predetermined reflection wavelength (Bragg wavelength) $\lambda_R$. This reflection wavelength $\lambda_R$ is expressed as:

$$\lambda_R = 2 \cdot n \cdot \Lambda \tag{1}$$

wherein n is the effective refractive index of the diffraction grating 35 and $\Lambda$ is the period of the diffraction grating 35.

The diffraction grating 35 in this embodiment is a chirped grating in which the reflection wavelength $\lambda_R$ monotonously changes according to positions along the optical axis. Since the reflection wavelength $\lambda_R$ changes depending on both minimum refractive index and period of the diffraction grating as indicated by the above expression (1), the above-mentioned chirped grating encompasses (i) that having minimum refractive index monotonously changing according to positions along the optical axis and (ii) that having grating period monotonously changing according to positions along the optical axis. The diffraction grating 35 of this embodiment belongs to the latter type (ii) and has grating period which becomes greater at the position farther from the semiconductor laser 10 along the optical axis of the optical fiber 30a. The minimum refractive index of the diffraction grating 35 is substantially uniform along the optical axis, while the reflection wavelength of the diffraction grating 35 is longer at the position farther from the semiconductor laser 10 along the optical axis of the optical fiber 30a in response to the change in grating period.

Figure 18:
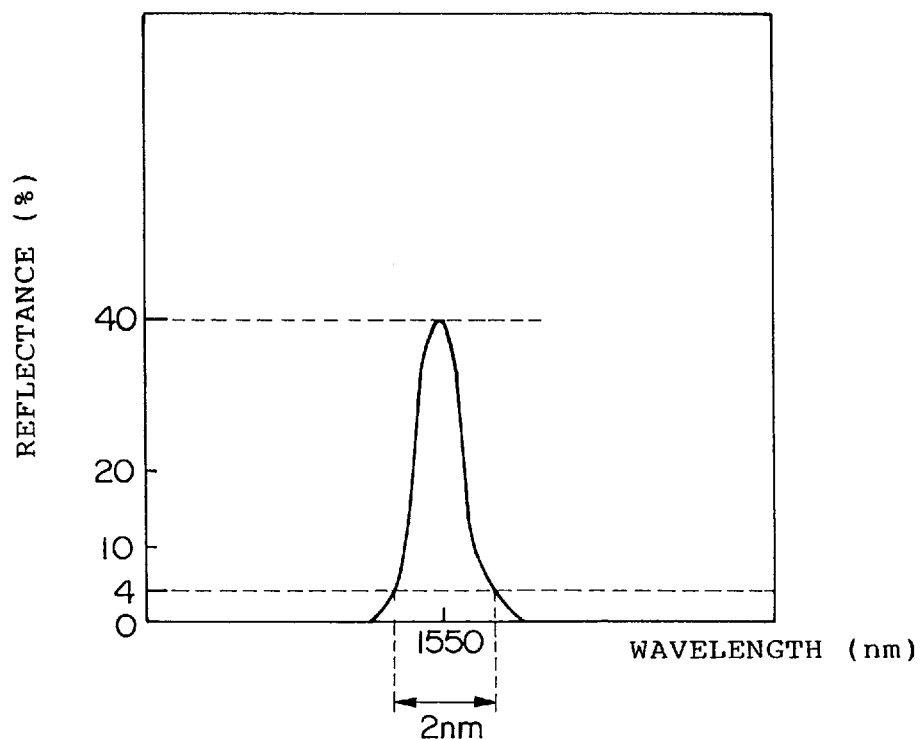
FIG. 18 is a chart showing a reflection characteristic of the diffraction grating 35.

FIG. 18 is a chart showing a reflection characteristic of the diffraction grating 35 in this embodiment. The vertical and horizontal axes in this chart indicate reflectance and wavelength, respectively. The peak shown in this chart is a reflection spectrum of the diffraction grating 35. This chart is obtained when a power spectrum of the light reflected by the diffraction grating 35 is determined and then the vertical axis of thus determined spectrum is converted into the ratio of the reflected light quantity to the incident light quantity, i.e., reflectance. As indicated by FIG. 18, the maximum reflectance of the diffraction grating 35 is about 40% with respect to the reflection wavelength of 1,550 nm, while the diffraction grating 35 has a reflection wavelength width of about 2 nm. Here, "reflection wavelength width of the diffraction grating 35" refers to the wavelength width between the intersections of the line drawn in parallel to the wavelength axis at a point which is $\frac{1}{10}$ of the maximum reflectance of the diffraction grating 35 and the reflection spectrum of the diffraction grating 35 as shown in FIG. 18.

As shown in FIG. 17, the optical coupler 40 is connected to the inspection light source 1a. The optical coupler 40 is a kind of an optical directional coupler having four terminals, i.e., the first to third terminals 41 to 43 and the non-reflection terminal 44. The first terminal 41 is connected to the optical fiber 30a such that the inspection light from the inspection light source 1a is incident on the optical coupler 40. To the second terminal 42, the optical fiber 60 to be measured is connected. Accordingly, when incident on the optical coupler 40, the inspection light from the inspection light source 1a is split into two, and one of the split light components is made incident on the optical fiber 60 to be measured.

To the third terminal 43, the measurement section 50 is connected by way of an optical fiber 31. Accordingly, of the inspection light incident on the optical fiber 60 to be measured, backscattering light which has been made to advance in the opposite direction due to Rayleigh scattering at each point of the optical fiber 60 is made incident on the optical coupler 40 and split into two, and one of thus split light components is made incident on the measurement section 50.

As in the case of the conventional OTDR apparatus, an optical directional coupler such as optical circulator may be used in place of the optical coupler 40 in the OTDR apparatus of this embodiment.

The measurement section 50 measures the backscattering light of the optical fiber 60 to be measured. The measurement section 50, which is similar to that used in ordinary OTDR apparatuses, comprises a photodetector which detects the backscattering light of the optical fiber 60 and converts thus detected light into an electric signal; an amplifier for amplifying the electric signal output from the photodetector; a signal processing section which converts the signal output from the amplifier from analogue to digital and further subjects thus converted signal to an integrating and averaging processing, logarithmic conversion, or the like; a display device connected to the signal processing section; and the like. Here, the A/D conversion or integrating and averaging perfomed by the signal processing section is effected while the light emission timing of the semiconductor laser 10 is controlled by way of the driving circuit 13. Based on the output signal of the signal processing section, the display device displays the scattering light power of the optical fiber 60 with respect to the distance from a predetermined reference point to the measurement point in the optical fiber 60. As thus displayed waveform is observed, loss between two arbitrary points in the optical fiber 60 can be determined. Also, based on thus determined loss value, fusion-spliced points in the optical fiber 60 can be identified, for example.

In the following, the principle of light emission in the inspection light source 1a will be explained. When the driving circuit 13 supplies an operating current flowing through the Fabry-Perot type semiconductor laser 10, spontaneously emitted light is generated within the heterostructure in the semiconductor laser 10. As this light is repeatedly reflected between the light-reflecting surface 11 and the light-emitting surface 12 while causing stimulated emission, the light is amplified so as to finally generate laser oscillation. In this manner, the light reflected by the light-emitting surface 12 contributes to laser oscillation of the semiconductor laser 10.

Nevertheless, since the reflectance of the light-emitting surface 12 is as low as 5%, most of the spontaneously emitted light and stimulatively emitted light can pass through the light-emitting surface 12. While being converged by the lens 20, the light transmitted through the light-emitting surface 12 is made incident on the optical fiber 30a and reaches the diffraction grating 35. As indicated by FIG. 18, the diffraction grating 35 reflects light over a reflection wavelength width of about 2 nm whose center is the reflection wavelength width $\lambda_R$. The light reflected by the diffraction grating 35 passes through the lens 20 and then is made incident, by way of the lens 20, on the semiconductor laser 10 from the light-emitting surface 12, and reaches the light-reflecting surface 11 while causing stimulated emission. The light reflected by the light-reflecting surface 11 advances, while causing stimulated emission, so as to be emitted from the light-emitting surface 12 and then incident on the optical fiber 30a again. This incident light reaches the diffraction grating 35, where it is reflected again. Thus, as reflection is repeated between the diffraction grating 35 and the light-emitting surface 11, light is amplified so as to finally generate laser oscillation. Thus generated laser light passes through the diffraction grating 35 and is emitted from the end face of the optical fiber 30a facing the optical coupler 40. Thus emitted laser light is inspection laser light output from the inspection light source 1a.

Figure 19:
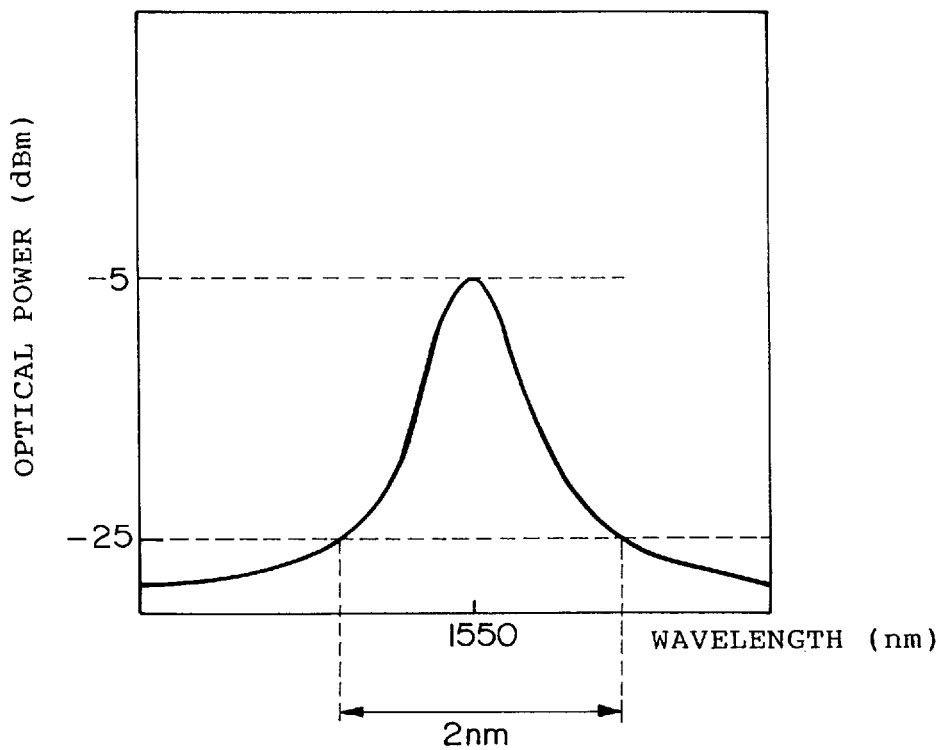

FIG. 19 is a chart showing a characteristic of inspection light output from the inspection light source 1a. The vertical and horizontal axes in this chart respectively indicate power of inspection light and wavelength. Also, the peak shown in this chart is a power spectrum of the inspection light. The light generating the laser oscillation between the diffraction grating 35 and the light-reflecting surface 11 is substantially restricted to, of the light emitted from the semiconductor laser 10, the light component included in the reflection wavelength range of the diffraction grating 35. In this embodiment, since the reflection wavelength width of the diffraction grating 35 is about 2 nm, the wavelength width of inspection light is also about 2 nm. Here, "wavelength width of inspection light" refers to the wavelength width between the intersections of the line drawn in parallel to the wavelength axis at a point where the power is lower than the maximum power of the inspection light by 20 dB and the power spectrum of the inspection light as shown in FIG. 19.

When the wavelength width of the inspection light used for an OTDR test is too small, time-coherency of the inspection light becomes so high that specific noise such as fading noise increases, thereby making it difficult to perfom the OTDR test with a high accuracy. According to experiments effected by the inventors, the noise level in OTDR tests becomes 0.15 dB or lower when the wavelength width of the inspection light is about 1 nm or greater. Since the loss at a point to which the optical connector is connected in the optical fiber is about 0.20 dB, when the noise level is 0.15 dB or lower, the connecting point of the optical conector and a noise can be distinguished from each other so as to identify the connecting point of the optical connector. Accordingly, this level is considered to be practical for OTDR apparatuses.

As explained in the foregoing, in the OTDR apparatus in this embodiment, since the reflection wavelength width of the diffraction grating 35 is broader than 1 nm, the wavelength width of the inspection light is also broader than 1 nm. As the time-coherency of the inspection light is sufficiently lowered thereby, OTDR tests with a high accuracy can be perfomed while fading noise is sufficiently suppressed. Actually, when the inventors perfomed an OTDR test by using the OTDR apparatus 100a of this embodiment, noise level was about 0.05 dB, and preferable results were obtained.

Also, in the OTDR apparatus 100a of this embodiment, since the reflection wavelength width of the diffraction grating 35 is narrower than 20 nm, which is the output wavelength width of the semiconductor laser 10, the wavelength width of inspection light is also narrower than the output wavelength width of the semiconductor laser 10. Accordingly, in the OTDR apparatus 100a of this embodiment, characteristics of the optical fiber 60 to be measured at a specific characteristic can be measured preferably.

Further, since the diffraction grating 35 in the OTDR apparatus 100a of this embodiment is a chirped grating having a reflection wavelength width corresponding to the width of change in grating period. Accordingly, the reflection wavelength width of the diffraction grating 35 can be easily adjusted at the time when it is manufactured. The wavelength width of the inspection light output from the inspection light source 1a is determined according to the reflection wavelength width of the diffraction grating 35. Accordingly, the OTDR apparatus 100a of this embodiment can be easily made to output inspection light having a desired wavelength width.

Also, in the OTDR apparatus 100a of this embodiment, the diffraction grating 35 is disposed such that a part thereof on the short reflection wavelength side, i.e., the part with a smaller grating period, is directed toward the semiconductor laser 10. Accordingly, light from the semiconductor laser 10 advances from the part of the diffraction grating 35 on the short reflection wavelength side toward the long reflection wavelength side. This disposition is effected in view of the following phenomenon. As disclosed in a paper by K. O. Hill et al., "Application of Phase Masks to the Photolithographic Fabrication of Bragg Gratings in Conventional Fiber/Planar Waveguides with Enhanced Photosensitivity" (OFC PD, 15-1, 1993), the diffraction grating has a characteristic of outwardly emitting, at each part thereof, light having a wavelength shorter than the reflection wavelength at that part. Accordingly, when the diffraction grating 35, which is a chirped grating, is disposed such that the part thereof on the long reflection wavelength side is directed toward the semiconductor 10, the light which should be reflected at the part on the short reflection wavelength side is partially emitted outward at the time when it passes through the long reflection wavelength side, whereby, in the light reflected by the diffraction grating 35, the component on the short wavelength side becomes less than that on the longitudinal wavelength side. As a result, in the power spectrum of inspection light, the power on the short wavelength side becomes lower than that on the long wavelength side, whereby the inspection light does not have a uniform power over the wavelength range thereof.

In the OTDR apparatus 100a of this embodiment, since the diffraction grating 35 is disposed such that the part on the short reflection wavelength side is directed toward the semiconductor laser 10, such a phenomenon that the light which should be reflected at each part of the diffraction grating is emitted outward before being reflected can be prevented. As a result, the inspection light has a substantially uniform power over the whole wavelength range. Accordingly, the OTDR apparatus 100a of this embodiment can quite preferably perfom OTDR tests of the optical fiber 60 to be measured.

When the wavelength of the light reflected by the diffraction grating 35 has a significant width, it is preferable that the long-wavelength reflection side be disposed farther from the semiconductor laser 10 than is the short-wavelength reflection side, and that the wavelength distribution of reflectance in the diffraction grating 35 be set as explained in the following.

When the pulse width of inspection light is relatively long, the diffraction grating 35 is preferably disposed such that reflectance of the diffraction grating monotonously increases along the direction moving away from the semiconductor light-emitting device 10.

The wavelength light reflected at a position of the diffraction grating 35 farther from the semiconductor laser 10 has a longer resonator length, thereby having a more attenuated optical power. Accordingly, when the diffraction grating is disposed such that the reflectance thereof monotonously increases along the direction moving away from the semiconductor light-emitting device, the power of reflected light can be made substantially uniform regardless of the point of reflection. Therefore, inspection light having a substantially uniform power over the whole area of reflection wavelength can be used, whereby OTDR tests can be perfomed preferably.

When the pulse width of inspection light is short, by contrast, the diffraction grating 35 is preferably disposed such that reflectance of the diffraction grating monotonously decreases along the direction moving away from the semiconductor light-emitting device 10.

When the pulse width is shortened, there is a case where an effect that injection energy can be made smaller on the long wavelength side surpasses the influence of the resonator length. In such a case, when reflectance is made to decrease as the resonator length is longer, inspection light with a substantially uniform power over the whole reflection wavelength range can be output.

(Embodiment 6)

Figure 20:
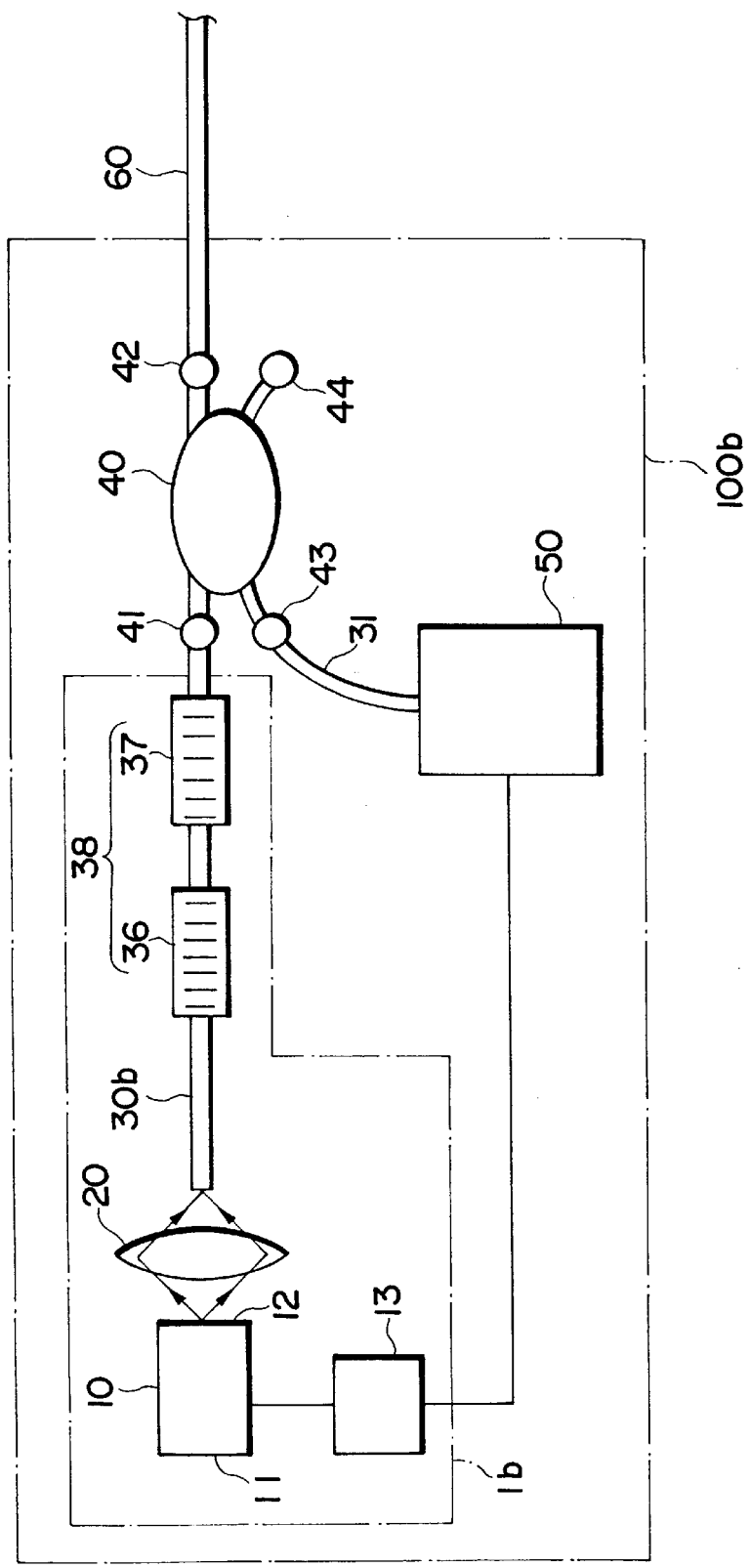
FIG. 20 is a view showing a configuration of an OTDR apparatus in accordance with Embodiment 6.

FIG. 20 is a view showing a configuration of an OTDR apparatus 100b in this embodiment. The OTDR apparatus 100b of this embodiment differs from that of Embodiment 1 in the configuration of an optical fiber 30b optically connected to the semiconductor laser 10 in an inspection light source 1b. Namely, in this embodiment, two diffraction gratings 36 and 37 are provided in a core of the optical fiber 30b.

The diffraction grating 37 is disposed at a position where the optical path length (with respect to the output light of the semiconductor laser 10) from the light-reflecting surface 11 of the semiconductor laser 10 to the terminator (part farthest from the semiconductor laser 10) of the diffraction grating 37 is about 70 mm. The diffraction grating 36 is disposed at a position closer to the semiconductor laser 10 than is the diffraction grating 37.

Each of the diffraction gratings 36 and 37 is a diffraction grating with a constant pitch, in which a predetermined grating period is maintained along the optical axis. The diffraction grating 36 has a period smaller than that of the diffraction grating 37, while their minimum refractive indices nearly equal to each other. Consequently, the diffraction grating 36 has a reflection wavelength smaller than that of the diffraction grating 37. Specifically, the reflection wavelength of the diffraction grating 36 is about 1,550 nm, whereas that of the diffraction grating 37 is about 1,554 nm. The reflection wavelength width of each diffraction grating is about 1 nm. Here, "reflection wavelength width of the diffraction grating" is defined as explained for Embodiment 5.

Figure 21:
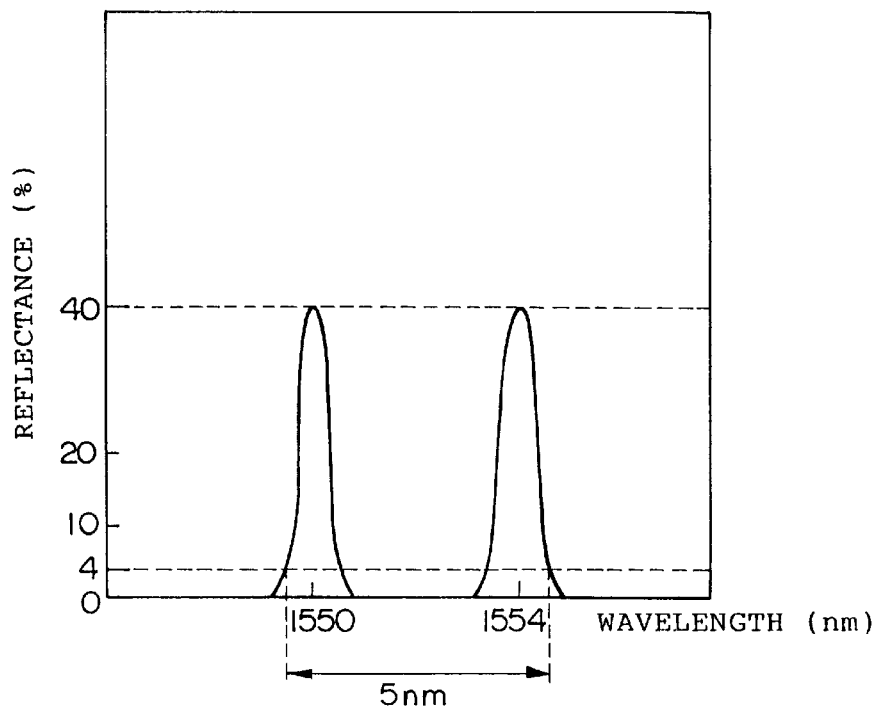
FIG. 21 is a chart showing a reflection characteristic of a reflecting area 38.

The area composed of the diffraction gratings 36 and 37 can be regarded as a single reflecting area 38 which reflects light over a predetermined wavelength range. FIG. 21 is a chart showing a reflection characteristic of this reflecting area, where a reflection spectrum made of two peaks corresponding to the respective diffraction gratings is exhibited. The reflection wavelength width of this reflecting area 38 is about 5 nm. Here, "reflection wavelength width of the reflecting area 38" refers to, among the intersections between the line drawn in parallel to the wavelength axis at a point which is 1/10 of the maximum reflectance of the reflecting area 38 and the reflection spectrum of the reflecting area 38, the wavelength width between the point at which the wavelength is maximized and the point at which the wavelength is minimized as shown in FIG. 21.

Figure 22:
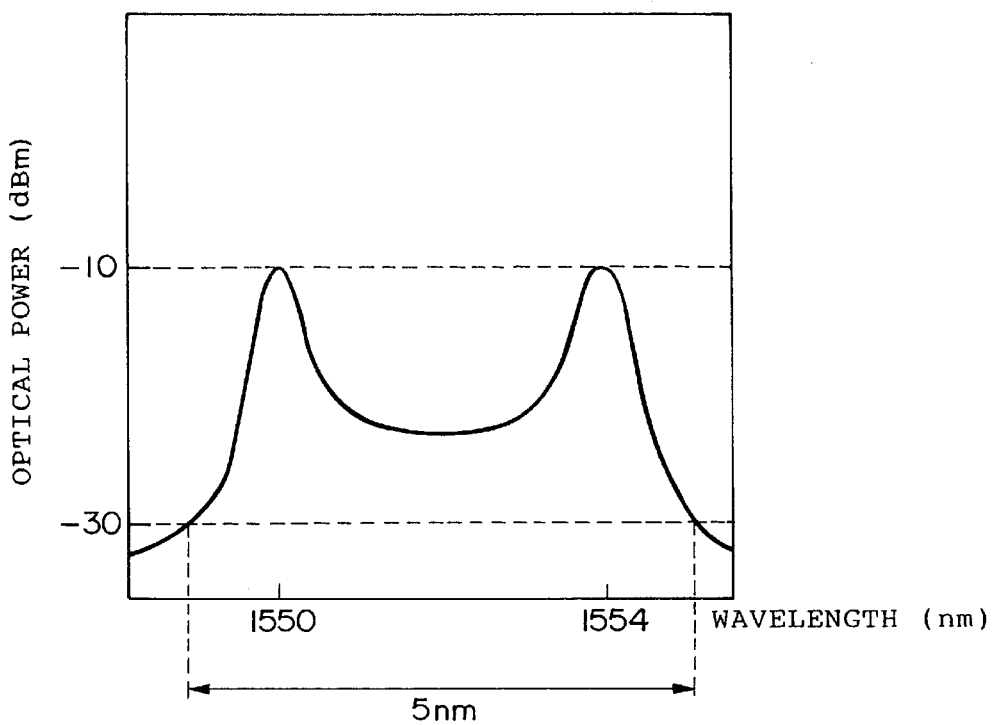
FIG. 22 is a characteristic chart of inspection light output from an inspection light source 1b.

In this embodiment, of the light emitted from the semiconductor laser 10, the light component repeatedly reflected between the light-reflecting surface 11 of the semiconductor laser 10 and the reflecting area 38 is subjected to laser oscillation and then output from the inspection light source 1b as inspection light. FIG. 22 is a chart showing a characteristic of this inspection light. In this embodiment, since the reflecting area 38 composed of the diffraction gratings 36 and 37 has a reflection wavelength width of about 5 nm, the inspection light also has a reflection wavelength width of about 5 nm. Here, "reflection wavelength width of inspection light" refers to the wavelength width between the intersections of the line drawn in parallel to the wavelength axis at a point where the power is lower than the maximum power of the inspection light by 20 dB and the power spectrum of inspection light as shown in FIG. 22.

Thus, in the OTDR apparatus 100b of this embodiment, since the reflecting area 38 composed of two diffraction gratings 36 and 37 having reflection wavelengths different from each other is provided in the optical fiber 30b, even when each diffraction grating has a small reflection wavelength width, and each of light components reflected by the respective diffraction gratings and subjected to laser oscillation has a high time-coherency, these light components are output from the inspection light source 1b as being superposed on each other, thereby yielding a sufficiently low time-coherency in the inspection light. In particular, in this embodiment, since the reflecting area 38 has a reflection wavelength width of 1 nm or greater, the wavelength width of inspection light also becomes broader than 1 nm. Accordingly, the time-coherency of inspection light can be securely lowered. Therefore, OTDR tests with a high accuracy can be securely perfomed while fading noise is sufficiently suppressed. Actually, when the inventors perfomed an OTDR test by using the OTDR apparatus 100b of this embodiment, noise level was about 0.05 dB, and preferable results were obtained.

Also, in the OTDR apparatus 100b of this embodiment, since the reflection wavelength width of the reflecting area 38 provided in the optical fiber 30b is narrower than 20 nm, which is the output wavelength width of the semiconductor laser 10, the wavelength width of inspection light is also narrower than the output wavelength width of the semiconductor laser 10. Accordingly, in the OTDR apparatus 100*b* of this embodiment, characteristics of the optical fiber 60 to be measured at a specific characteristic can be measured preferably.

Further, in the OTDR apparatus 100*b* of this embodiment, since, of the diffraction gratings 36 and 37 constituting the reflecting area 38, the diffraction grating 36 having a shorter reflection wavelength is disposed closer to the semiconductor laser 10, so that the light from the semiconductor laser 10 successively enters the diffraction gratings from the diffraction grating 36 having a shorter reflection wavelength. As previously noted in explanation for Embodiment 5, a diffraction grating has a characteristic of outwardly emitting, at each part thereof, light having a wavelength shorter than the reflection wavelength at that part. Nevertheless, when the diffraction gratings 36 and 37 are disposed as in the case of this embodiment, such a phenomenon that the light which should be reflected at the diffraction gratings is emitted outward before being reflected can be suppressed. As a result, the inspection light has a substantially uniform power over the whole wavelength range. Accordingly, the OTDR apparatus 100*b* of this embodiment can quite preferably perfom OTDR tests of the optical fiber 60 to be measured.

(Embodiment 7)

Figure 23:
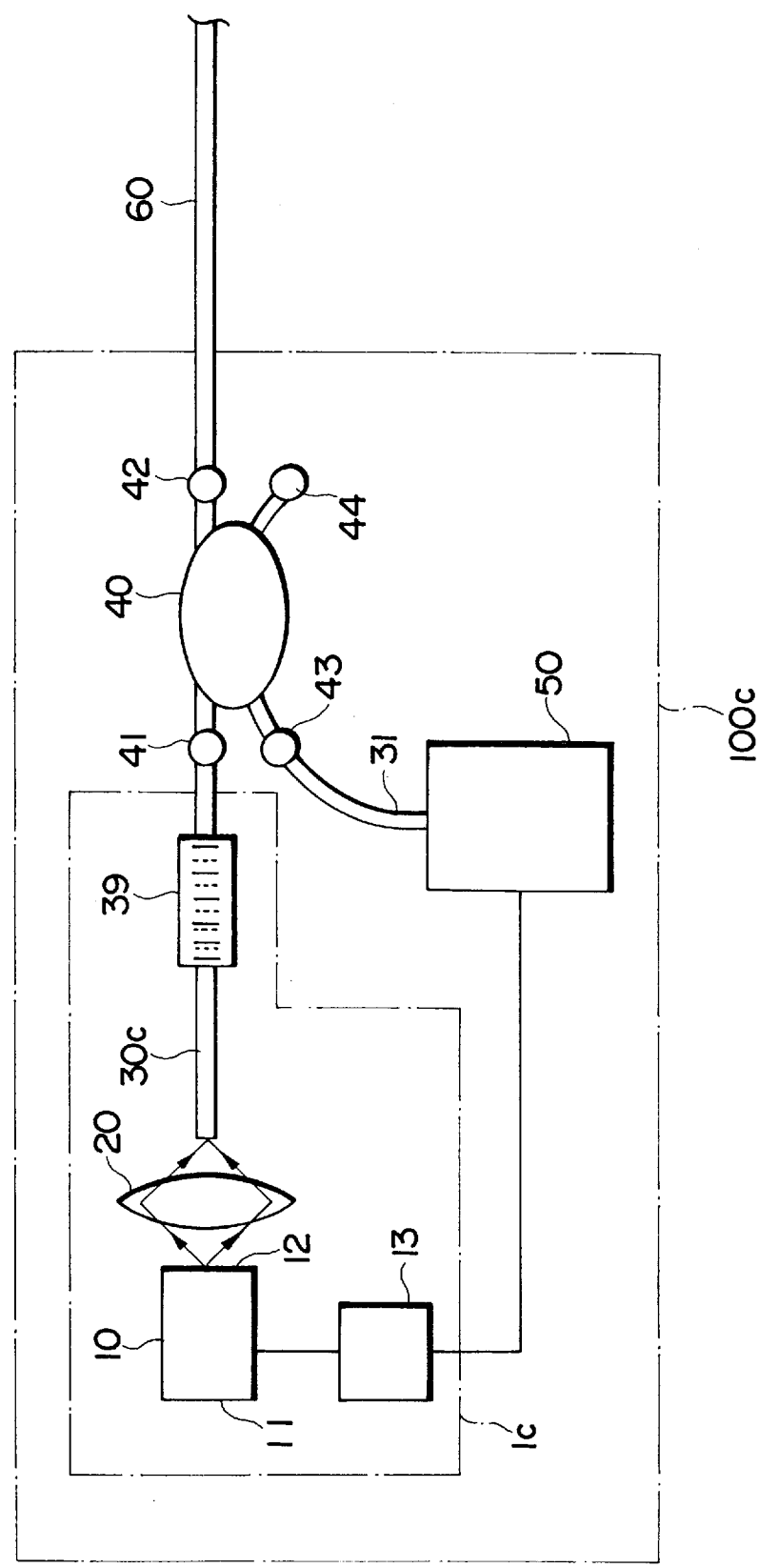
FIG. 23 is a view showing a configuration of an OTDR apparatus in accordance with Embodiment 7.

FIG. 23 is a view showing a configuration of an OTDR apparatus 100*c* in this embodiment. The OTDR apparatus 100*c* of this embodiment differs from that of Embodiment 6 in the configuration of a reflecting area 39 provided in an optical fiber 30*c* optically connected to the semiconductor laser 10 in an inspection light source 1*c*. This reflecting area 39 is formed as the same area of the core doped with germanium in a quartz type single-mode optical fiber is sequentially irradiated with ultraviolet interference fringes having periods different from each other. The periods of the respective interference fringes are adjusted so as to form constant-pitch diffraction gratings having reflection wavelengths of 1,550 nm and 1,554 nm, respectively. Accordingly, in the reflecting area 39, a constant-pitch diffraction grating having a reflection wavelength of 1,550 nm and a constant-pitch diffraction grating having a reflection wavelength of 1,554 nm are disposed at one portion of the optical fiber as being superposed on each other.

This reflecting area 39 exhibits a reflection spectrum such as that obtained when the reflection spectrum of the diffraction grating having a reflection wavelength of 1,550 nm and the reflection spectrum of the diffraction grating having a reflection wavelength of 1,554 nm are superposed on each other. Thus formed reflection spectrum is substantially the same as that (FIG. 21) of the reflecting area 38 in the OTDR apparatus of Embodiment 6, and the reflection wavelength width thereof is about 5 nm. Accordingly, the wavelength width of inspection light output from the inspection light source 1*c* also becomes about 5 nm.

In this embodiment, of the light emitted from the semiconductor laser 10, the light component repeatedly reflected between the light-reflecting surface 11 of the semiconductor laser 10 and the reflecting area 39 is subjected to laser oscillation and then output from the inspection light source 1*c* as inspection light. This inspection light has a characteristic substantially identical to that of the inspection light in Embodiment 6 shown in FIG. 22, and has a reflection wavelength width of about 5 nm corresponding to the reflection wavelength width of the reflecting area 39.

Thus, since the OTDR apparatus 100*c* of this embodiment has the reflecting area 39 composed of two diffraction gratings having reflection wavelengths different from each other provided in the same portion of the optical fiber 30*c*, even when each diffraction grating constituting the reflecting area has a small reflection wavelength width, and each of light components reflected by the respective diffraction gratings and subjected to laser oscillation has a high time-coherency, these light components are output from the inspection light source 1*c* as being superposed on each other, thereby yielding a sufficiently low time-coherency in the inspection light. In particular, in this embodiment, since the reflecting area 39 has a reflection wavelength width of 1 nm or greater, the wavelength width of inspection light becomes broader than 1 nm. Accordingly, the time-coherency of inspection light can be lowered securely and sufficiently. Therefore, OTDR tests with a high accuracy can be securely perfomed while fading noise is sufficiently suppressed. Actually, when the inventors perfomed an OTDR test by using the OTDR apparatus 100*c* of this embodiment, noise level was about 0.05 dB, and preferable results were obtained.

Also, in the OTDR apparatus 100*c* of this embodiment, since the reflection wavelength width of the reflecting area 39 provided in the optical fiber 30*c* is narrower than 20 nm, which is the output wavelength width of the semiconductor laser 10, the wavelength width of inspection light is also narrower than the output wavelength width of the semiconductor laser 10. Accordingly, in the OTDR apparatus 100*c* of this embodiment, characteristics of the optical fiber 60 to be measured at a specific characteristic can be measured preferably.

(Embodiment 8)

Figure 24:
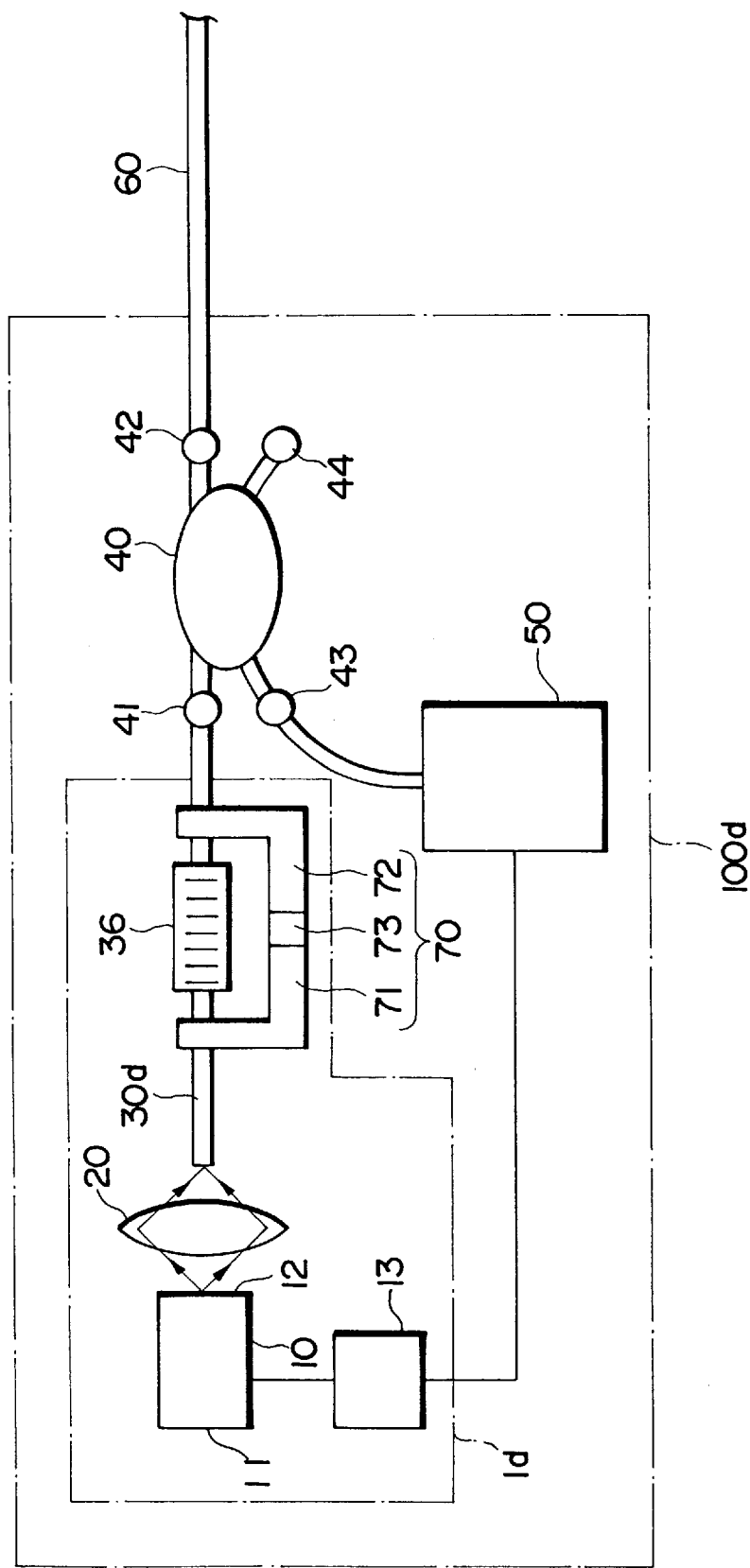
FIG. 24 is a view showing a configuration of an OTDR apparatus in accordance with Embodiment 8.

FIG. 24 is a view showing a configuration of an OTDR apparatus 100*d* in this embodiment. The OTDR apparatus 100*d* of this embodiment differs from that of the above-mentioned embodiment in the configuration of an inspection light source 1*d*. Namely, in the inspection light source 1*d*, the diffraction grating 36 is formed in an optical fiber 30*d* optically connected to the semiconductor laser 10, while a stress applying device 70 is further attached to a part including the diffraction grating 36.

The diffraction grating 36 is a constant-pitch diffraction grating maintaining a predetermined grating pitch along the optical axis. The reflection wavelength of the diffraction grating 36 is about 1,550 nm, with a reflection wavelength width of about 1 nm.

The stress applying device 70 comprises arms 71 and 72 which hold the optical fiber 30*d* respectively at two points between which the diffraction grating 36 is held, and a piezoelectric device 73 having both ends respectively attached to the arms 71 and 72. Connected to the piezoelectric device 73 is a non-depicted variable voltage source, from which a driving voltage is applied to the piezoelectric device 73 so as to make the latter expand or contract. Here, the directions of expansion and contraction are substantially in parallel to the optical-axis direction of the optical fiber 30*d*.

When the piezoelectric device 73 expands or contracts, a stress (tension or pressure) is applied to the optical fiber 30*d* along the optical-axis direction by way of the arms 71 and 72. As a result, the period or minimum refractive index of the diffraction grating 36 changes. As indicated by the above-mentioned expression (1), the reflection wavelength of the diffraction grating 36 depends on the period and minimum refractive index of the diffraction grating 36. Accordingly, the reflection wavelength of the diffraction grating changes in response to the change in the period and minimum refractive index thereof. According to experiments effected by the inventors, the reflection wavelength of the diffraction grating 36 can be increased by about 1 nm when a tension of 100 g is applied thereto.

In this embodiment, of the light emitted from the semiconductor laser 10, the light component repeatedly reflected between the light-reflecting surface 11 of the semiconductor laser 10 and the diffraction grating 36 is subjected to laser oscillation and then output from the inspection light source 1d as inspection light. Since the wavelength range of the inspection light is determined according to the reflection wavelength range of the diffraction grating 36, the wavelength range of the inspection light changes when the reflection wavelength of the diffraction grating 36 changes. Accordingly, when the driving voltage of the piezoelectric device 73 is adjusted so as to control the expansion and contraction of the piezoelectric device 73, the wavelength range of the inspection light can be arbitrarily regulated.

Figure 25:
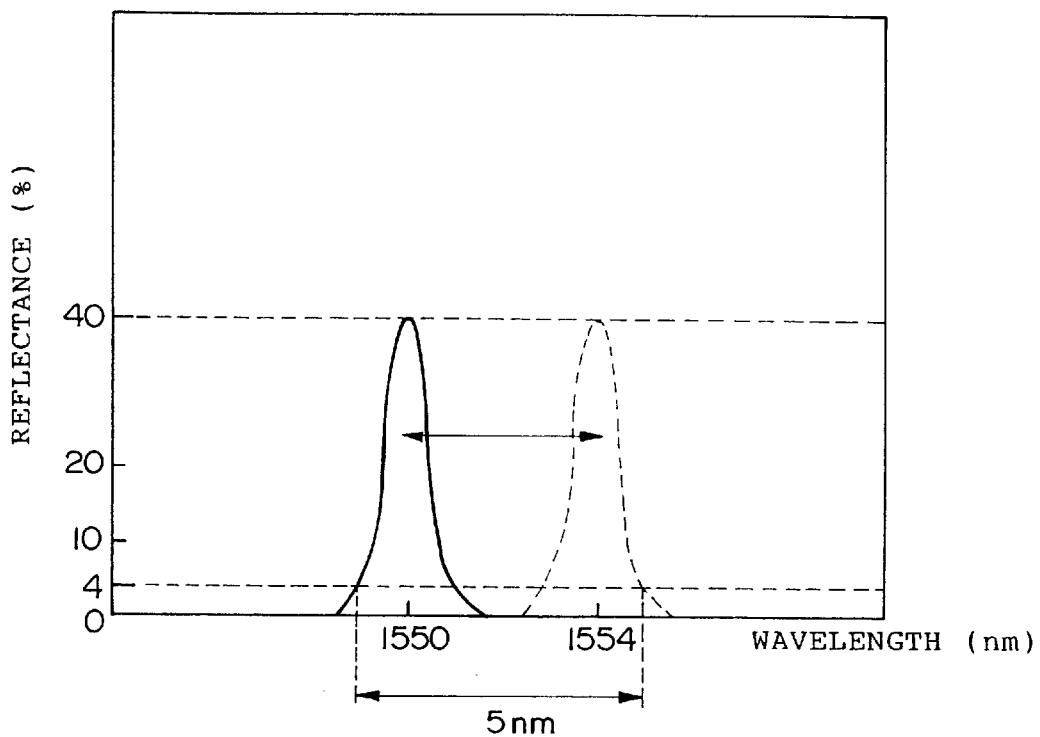
FIG. 25 is a chart showing a change in a reflection characteristic of a diffraction grating 36.
Figure 26:
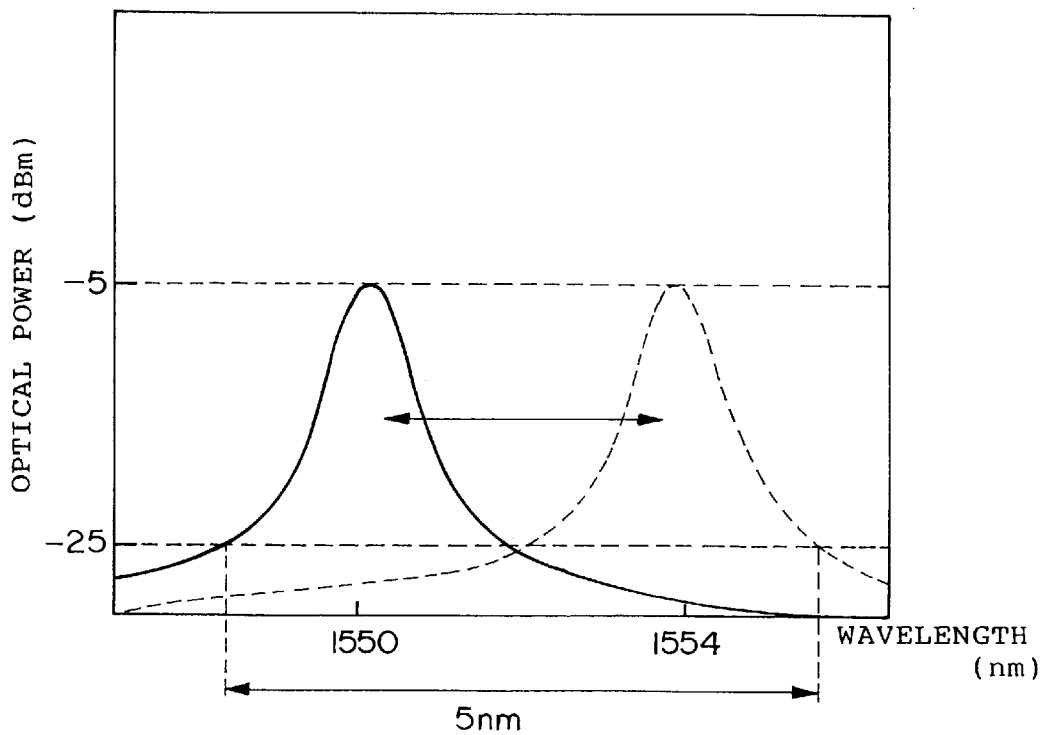
FIG. 26 is a chart showing a change in a characteristic of inspection light output from an inspection light source 1d.

Actually, as shown in the reflection characteristic chart of FIG. 25, when the stress applying apparatus 70 shifts the reflection wavelength of the diffraction grating 36 by about 4 nm, thereby shifting the reflection wavelength range by a wavelength width of about 5 nm; the maximum power of the inspection light also shifts by about 4 nm as shown in the inspection light characteristic chart of FIG. 26. Accordingly, when the driving voltage level is periodically changed with time so as to periodically change the reflection wavelength range of the diffraction grating 36 with time with a wavelength width of about 5 nm, the wavelength range of the inspection light also periodically changes with a wavelength width of about 5 nm. In this case, the inspection light source 1d is equivalent to a light source having a wavelength width of about 5 nm. Here, "changing the reflection wavelength range of the diffraction grating 36 with time with a wavelength width of about 5 nm" refers to a case where the reflection wavelength range is changed with time such that, in a reflection characteristic chart of the diffraction grating 36, when an intersection between a line drawn in parallel to the wavelength axis at a point which is 1/10 of the maximum reflectance of the diffraction grating 36 and the reflection spectrum of the diffraction grating 36 is determined per time, the wavelength width between the point at which the wavelength is minimized and the point at which the wavelength is maximized becomes about 5 nm. Also, "wavelength range of the inspection light periodically changes with time with a wavelength width of about 5 nm" refers to a case where the wavelength range changes with time such that, in a characteristic chart of the inspection light, when an intersection between a line drawn in parallel to the wavelength axis at a point where power is lower than the maximum power of the inspection light by 20 dB and the power spectrum of the inspection light is determined per time, the wavelength width between the point at which the wavelength is minimized and the point at which the wavelength is maximized becomes about 5 nm.

Thus, in the OTDR apparatus 100d of this embodiment, as the reflection wavelength range of the diffraction grating 36 is changed with time by the stress applying apparatus 70, the wavelength range of inspection light can be changed with time, whereby inspection light having a substantially broad wavelength width and a sufficiently low time-coherency can be obtained. Accordingly, in the OTDR apparatus 100d of this embodiment, OTDR tests with a high accuracy can be securely perfomed while fading noise is sufficiently suppressed. Actually, when the inventors perfomed an OTDR test by using the OTDR apparatus 100d of this embodiment, noise level was about 0.05 dB, and preferable results were obtained.

Also, in the OTDR apparatus 100d of this embodiment, since the substantial reflection wavelength width of the diffraction grating 36 is narrower than 20 nm, which is the output wavelength width of the semiconductor laser 10, the substantial wavelength width of inspection light is also narrower than the output wavelength width of the semiconductor laser 10. Accordingly, in the OTDR apparatus 100d of this embodiment, characteristics of the optical fiber 60 to be measured at a specific characteristic can be measured preferably.

Though the stress applying device 70 is used to apply a stress to the diffraction grating 36 so as to change the reflection wavelength range of the latter in this embodiment, the part of the optical fiber 30d including the diffraction grating 36 may be accommodated in a temperature adjusting bath instead, and the temperature within the bath may be changed. When the temperature around the diffraction grating 36 changes, the diffraction grating 36 expands or contracts along the optical-axis direction, thereby changing the reflection wavelength of the diffraction grating 36. Accordingly, when the temperature within the temperature adjusting bath is regulated, the wavelength range of inspection light can be adjusted. In this case, when a member (e.g., plate made of a metal such as aluminum) having a coefficient of thermal expansion different from that of the optical fiber 30d is attached to the part of the optical fiber 30d including the diffraction grating 36, the change in reflection wavelength of the diffraction grating due to the change in temperature preferably increases. According to experiments effected by the inventors, when the aluminum plate is attached thereto, the reflection wavelength of the diffraction grating 36 can be increased by 2 nm as the temperature within the temperature adjusting bath is raised by 10° C.

Figure 27:
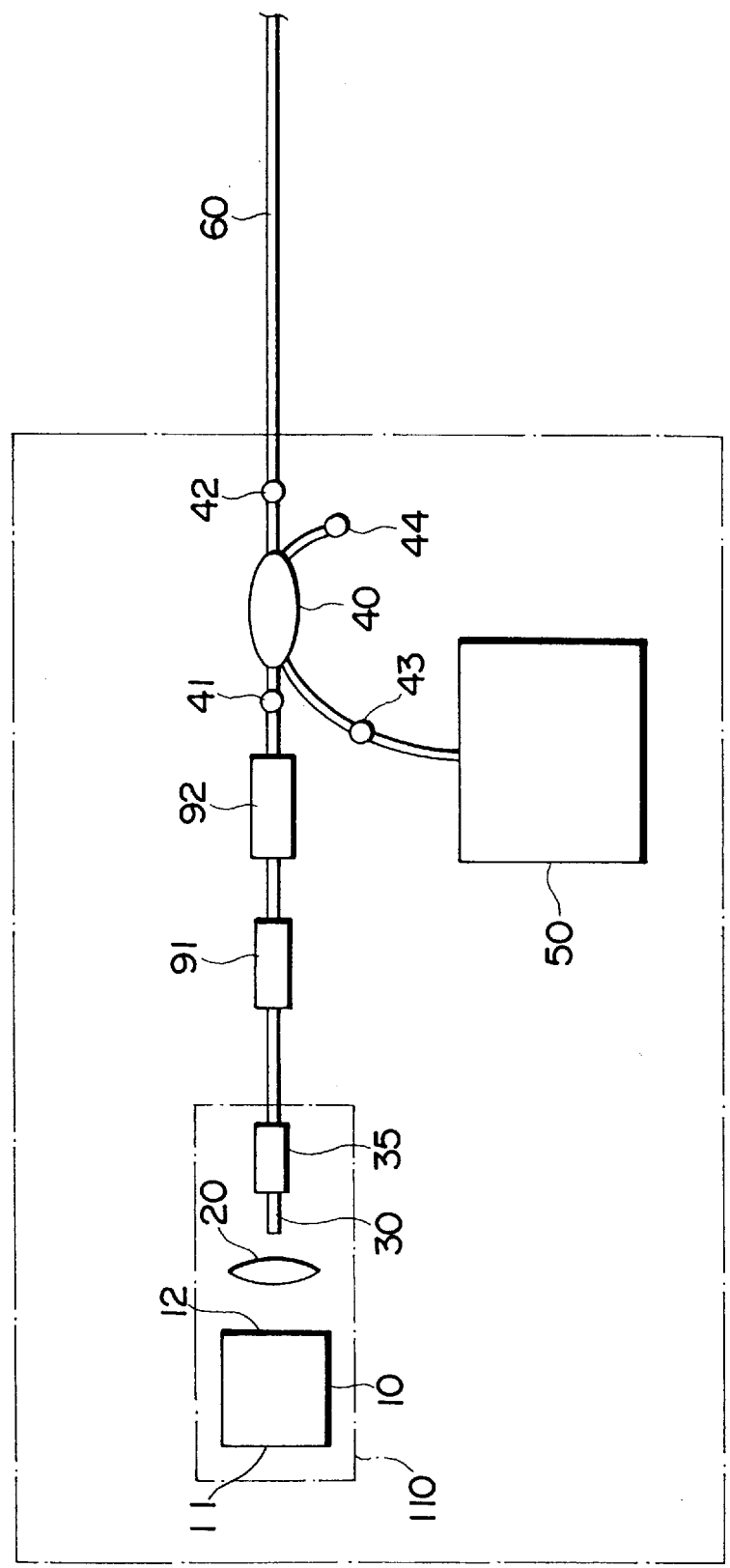
FIGS. 27 and 28 are configurational views respectively showing modified examples of Embodiment 1.
Figure 28:
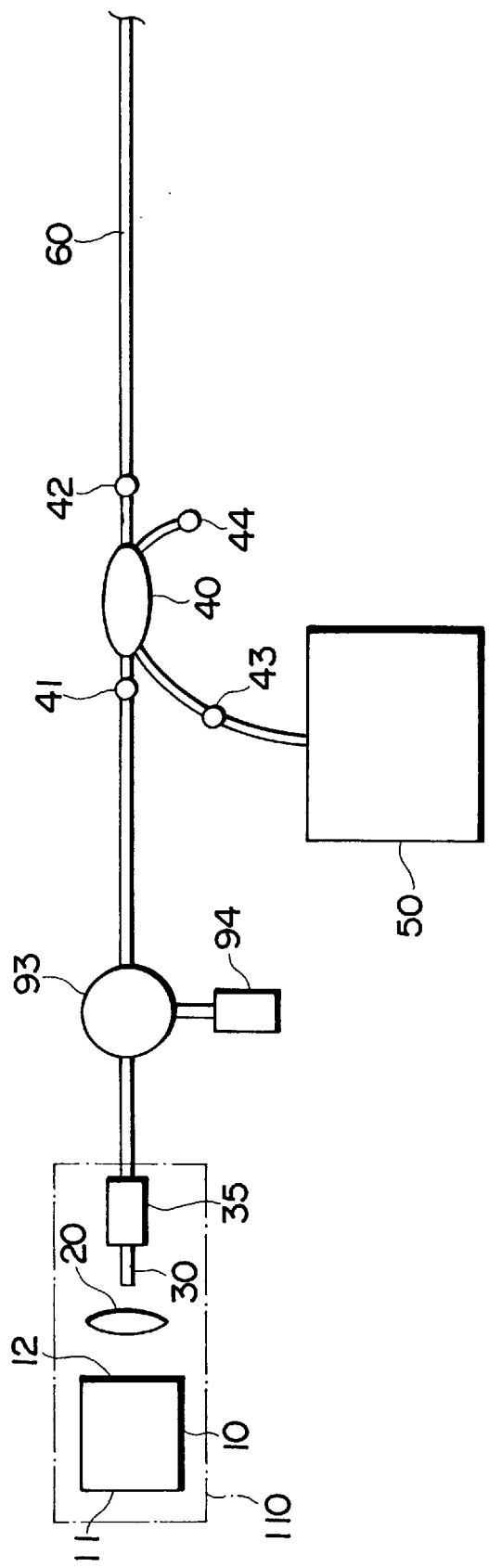

FIGS. 27 and 28 are configurational views respectively showing modified examples of the OTDR apparatus in accordance with the above-mentioned Embodiment 1. FIG. 27 shows an OTDR apparatus in which an optical isolator 91 and a transmission type band pass filter 92 are inserted between the inspection light source 110 and the optical coupler 40. FIG. 28 shows an OTDR apparatus in which an optical circulator 30a is adopted, and a reflection type band pass filter 93 is inserted in an optical path between the inspection light source 110 and the optical fiber 60 to be measured.

In the embodiments where one of facing mirrors of the inspection light source 110 is constituted by the diffraction grating 35 formed in the optical waveguide 30, the wavelength width of the oscillated laser light is made narrower. Nevertheless, when the resonator length becomes large, due to its relationship to pulse width, the number of to-and-fros of light through the resonator decreases. Accordingly, though with a low power, oscillation wavelength cannot be prevented from expanding. When an OTDR test is perfomed, there are cases where, in order to prevent crosstalk to a signal transmission band from occurring, such an extension of oscillation wavelength is desired to be reduced in an amount beyond the capacity of the diffraction grating.

In such cases, when a band pass filter is further provided in an optical path between the inspection light source 110 and the optical fiber 60 to be measured, light outside of the wavelength range necessary for the OTDR apparatus can be cut off, whereby a preferable output characteristic can be obtained. As a result, influence upon optical communications can be securely suppressed.

(Embodiment of Optical Communication Line Inspection System)

Figure 29:
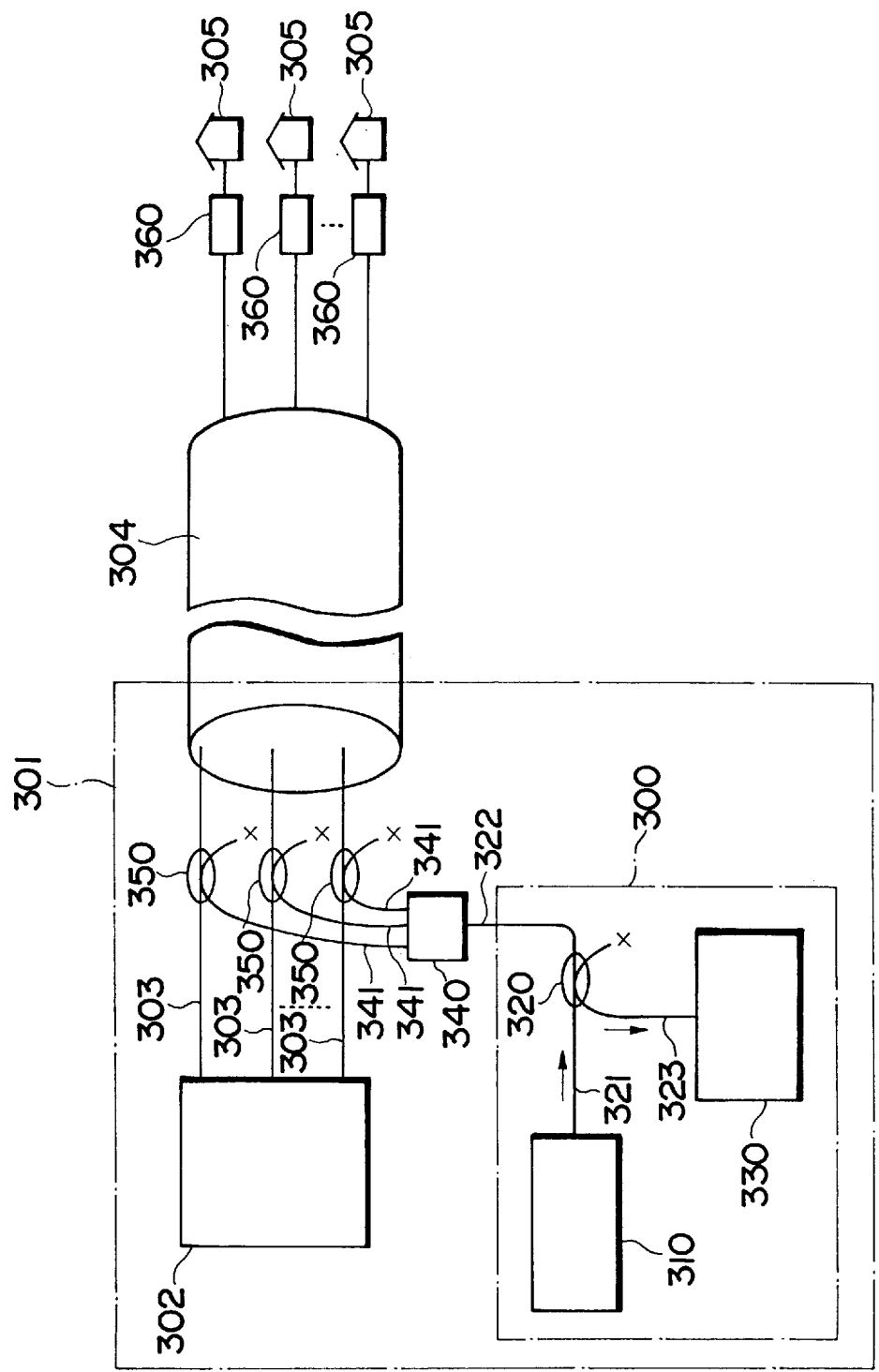
FIG. 29 is a view showing an overall configuration of an optical communication line inspection system in accordance with the present invention.

FIG. 29 is an overall configurational view showing an optical communication line inspection system of this embodiment. First, a basic configuration of an optical communication network to which the inspection system of this embodiment is applied will be explained. One or a plurality of optical communication lines 303 (represented by three optical communication lines in FIG. 29) connected to a transmission apparatus 302, which is installed in a station for a subscriber communication network or the like, are bundled as an optical fiber cable 304 and extend to subscribers' houses 305. Accordingly, the transmission apparatus 302 and each subscriber's house 305 is connected to each other by way of one optical communication line 303. Communication light output from the transmission apparatus 302 is propagated through the optical communication line 303 and received by a terminal installed at the subscriber's house 305. In the optical communication network of this embodiment, signal light having a wavelength of about 1,300 nm is used.

In the following, the configuration of the inspection system in this embodiment will be explained. This inspection system is constituted by an OTDR apparatus 300; an optical switch 340 connected, by way of an optical fiber 322, to inspection light from the OTDR apparatus 300; an optical coupler 350 disposed at the end portion of the optical communication line 303 on the transmission apparatus side 302; and an optical filter 360 disposed at the terminator portion (end portion on the subscriber side 305) of each optical communication line 303.

The OTDR apparatus 300 is constituted by a light-emitting section 310; an optical coupler 320 connected to the light-emitting section 310 by way of an optical fiber 323; and an inspection section 330 connected to the optical coupler 320 by way of the optical fiber 323.

The light-emitting section 310 oscillates in a pulsing manner to emit laser light which is inspection light. The half-width of wavelength spectrum of this inspection light, i.e., wavelength width, is about 20 nm. The center wavelength (wavelength at the center of the half-width) is about 1,550 nm, which is different from the wavelength of the signal light.

The optical coupler 320 makes the inspection light, which is incident thereon by way of the optical fiber 321, incident on the optical switch 340 by way of the optical fiber 322; while making the returned inspection light, which has been reflected or scattered by each part of the optical communication line 303 and optical filter 360, incident on the inspection section 330 by way of the optical fiber 323.

The inspection section 330 detects thus returned inspection light so as to inspect the state of the optical communication line 303. This inspection section 330, which is similar to that used in ordinary OTDR apparatuses, comprises a photodetector for detecting the inspection light and converting thus detected inspection light into an electric signal, an amplifier for amplifying the electric signal output from the photodetector, a signal processor for A/D-converting the signal output from the amplifier and subjecting thus converted signal to an averaging processing or the like; a CRT device connected to the signal processor; and the like.

The optical switch 340 optically connects the optical coupler 320 within the OTDR apparatus 300 and one of the optical couplers 350 in the optical communication line 303 to each other by way of an optical fiber 341 in a switching manner. As the inspection light from the OTDR apparatus 300 is made incident on the optical communication line 303 including the connected optical coupler 350, the optical communication line 303 to be inspected can be selected as the optical switch 340 is operated.

The optical coupler 350 makes the inspection light incident on the optical communication line 303 so as to be propagated toward the subscriber's house 305; while making the returned inspection light, which has been reflected or scattered by each part of the optical communication line 303 and optical filter 360, incident on the optical switch 340.

Here, as can be seen from the foregoing, the optical coupler 320, the optical switch 340, and the optical coupler 350, as a whole, function to make the inspection light incident on the optical communication line 303, while making the reflected light and backscattering light from the optical communication line 303 incident on the inspection section 330. Namely, the optical coupler 320, the optical switch 340, and the optical coupler 350 constitute an optical functional section exhibiting such functions.

The optical filter 360 has a function of reflecting light over a predetermined wavelength range so as to cut off the inspection light immediately in front of the subscriber's house 305, thereby preventing the inspection light from becoming noise in optical communications. The inspection section 330 recognizes the terminator of the optical communication line 303 by detecting the light reflected by the optical filter 360. Here, in order to fully exhibit the function of cutting off the inspection light, the optical filter 306 preferably has a reflection wavelength width greater than the wavelength width of the inspection light.

Figure 30:
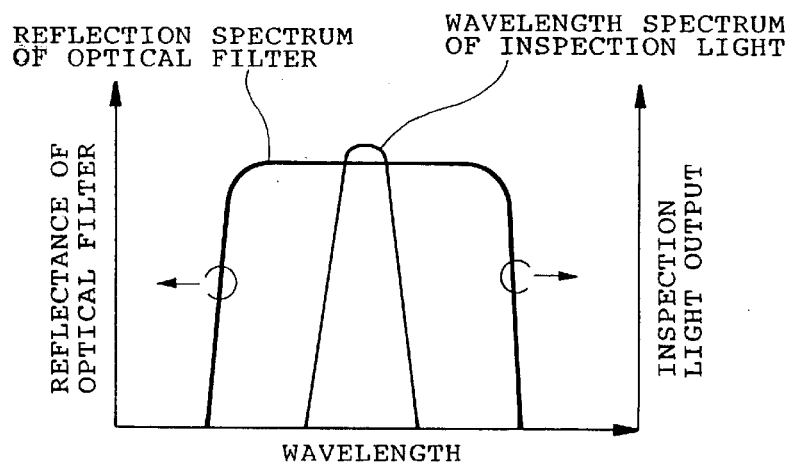
FIG. 30 is a view schematically showing a reflection spectrum of an optical filter and a wavelength spectrum of inspection light.

FIG. 30 is a chart schematically showing a reflection spectrum of the optical filter 360 and a wavelength spectrum of inspection light. As indicated by this chart, the optical filter 360 preferably has a reflection wavelength width (half-width of reflection spectrum) broader than the wavelength width of the inspection light.

The optical filter 360 of this embodiment is constituted by a plurality of optical waveguide type diffraction gratings disposed in the optical communication line 303. An optical waveguide type diffraction grating is an area of a core of an optical waveguide where the effective refractive index of the core periodically changes between the minimum refractive index and the maximum refractive index along the optical axis. This optical waveguide type diffraction grating reflects light having a relatively narrow wavelength width whose center is a predetermined reflection wavelength (Bragg wavelength). It has been known in general that the optical waveguide type diffraction grating can be manufactured as an optical waveguide is irradiated with an interference fringe of ultraviolet rays, for example. Such a manufacturing method is also disclosed in Japanese Publication of the Translation of International Application No. 62-500052.

Though each of the plurality of optical waveguide type diffraction gratings constituting the optical filter 360 has a single period, the periods slightly differ from each other among the respective optical waveguide type diffraction gratings. Thus, when a plurality of optical waveguide type diffraction gratings respectively having periods slightly different from each other are serially disposed in the optical communication line 303 so as to constitute the optical filter 360, the optical filter 360 exhibits a reflection spectrum with a broad wavelength width in which reflection spectra of the respective diffraction gratings partially overlap with each other. As the number of the optical waveguide type diffraction gratings is greater, the reflection wavelength width becomes broader. An optical filter having such a configuration is disclosed in a paper of R. Kashyap et al., "Novel Method of Producing All Fibre Photoinduced Chirped Gratings" (*Electronics Letters,* 9th Jun. 1994, Vol. 30, No. 12).

In order to secure a preferable function as optical filter, a higher reflectance is more preferable in the optical waveguide type diffraction grating. Accordingly, an optical waveguide is exposed to a hydrogen atmosphere and then irradiated with an ultraviolet interference fringe so as to form an optical waveguide type diffraction grating used in this embodiment. According to this method, an optical waveguide type diffraction grating having a high reflectance can be obtained, whereby the reflectance of the optical filter 360 can also be made high. Nevertheless, since OH groups generated upon ultraviolet irradiation may absorb signal light, thereby increasing the transmission loss; the number of the optical waveguide type diffraction gratings constituting the optical filter 360 is preferably as small as possible.

Since the optical communication line 303 includes an optical fiber which is an optical waveguide, the optical filter 360 may be directly formed in the optical communication line 303. Also, an optical fiber or thin-film waveguide in which the optical filter 360 has been formed beforehand may be connected to the optical communication line 303 so as to provide the optical filter 360.

In the following, a method of inspecting an optical communication line by use of the inspection system in accordance with this embodiment will be explained. The inspection light output from the light-emitting section 310 is propagated through the optical fiber 321 so as to be incident on the optical coupler 320, where it is then split into two. While one of thus split inspection light components reaches the resistive terminator of the optical coupler 320, the other is propagated through the optical fiber 322 so as to be incident on the optical switch 340. This part of the inspection light is made incident, by way of the optical fiber 341 and the optical coupler 350, on the optical communication line 303 to be measured, and then advances through the optical communication line 303 to reach the optical filter 360.

Due to Fresnel reflection at a fault position (e.g., disconnected position) or Rayleigh scattering at each point of the optical communication line 303, a part of the inspection light returns in the direction opposite to the advancing direction. Each of the reflected light and backscattering light thus returned is split into two by the optical coupler 350, and one of thus split light components is made incident on the optical switch 340. Thereafter, the reflected light and backscattering light from the optical communication line 303 is propagated through the optical fiber 322 so as to be split into two by the optical coupler 320, and one of thus split light components is propagated through the optical fiber 323 so as to be incident on the inspection section 330.

The inspection section 330 detects the reflected light and backscattering light from the optical communication line 303 and optical filter 360 and subjects them to a signal processing, whereby the power of the reflected light or backscattering light of the optical communication line 303 is displayed on the CRT device with respect to the distance from a predetermined reference point to the measurement point. As thus displayed waveform is observed, the fault position in the optical communication line 303 as well as loss between two arbitrary points in the optical fiber 303 can be determined. In this manner, the inspection of the optical communication line 303 is performed.

In the optical communication line inspection system of this embodiment, since the light-emitting section 310 outputs light having a wavelength range as narrow as about 20 nm or less, the reflection wavelength width of the optical filter 360 can also be narrowed in response thereto. Accordingly, the number of the optical waveguide type diffraction gratings constituting the optical filter 360 may be made small. In particular, when the wavelength width of the inspection light is about 5 nm or less, the number of the optical waveguide type diffraction gratings can be made very small, whereby the optical filter 360 can be constituted by a single optical waveguide type diffraction grating.

When the number of the optical waveguide type diffraction gratings is made small, the number of the abovementioned OH groups can be reduced as well, whereby loss in transmission of the signal light can be suppressed. Also, in the case where the number of the optical waveguide type diffraction gratings is small, mode-mismatching occurring at the time when the signal light passes through the diffraction gratings can be reduced. Accordingly, transmission loss can be suppressed in this respect as well. Thus, in accordance with the optical communication line inspection method of this embodiment, inspection of optical communication lines can be performed while influence upon optical communications is sufficiently suppressed.

As the light-emitting section 10, a variety of configurations can be adopted. FIGS. 31 to 34 are schematic views showing configurational examples 310a to 310d of the light-emitting section 310. In the following, these examples will be explained with reference to their corresponding drawings.

Figure 31:
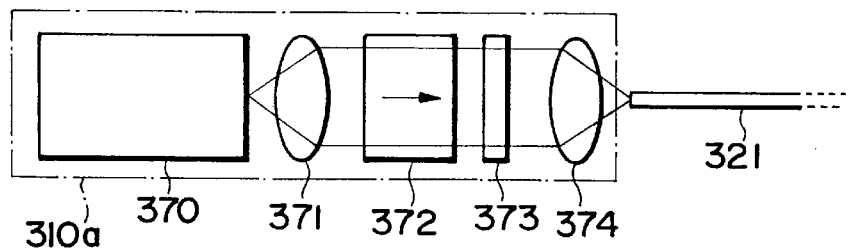
FIG. 31 is a first configurational view of a light-emitting section 310.

First, the light-emitting section 310a of FIG. 31 is constituted by a Fabry-Perot type semiconductor laser 370, lenses 371 and 374, an isolator 372, and an optical filter 373. Here, the optical filter 373 in this example is a dielectric multilayer film filter.

The Fabry-Perot type semiconductor laser 370 has an oscillation wavelength width of about 30 nm. The lens 371 converts the laser light output from the semiconductor laser 370 into a parallel beam and makes this beam incident on the isolator 372. The isolator 372 has a forward direction toward the direction of arrow in the drawing, while cutting off the light advancing in the opposite direction. The laser light transmitted through the isolator 372 is made incident on the optical filter 373.

The optical filter 373 restricts the wavelength width of the laser light from the semiconductor laser 370 such that, of the light included in the oscillation wavelength range of the semiconductor laser 370, a light component having a wavelength width of about 20 nm or less whose center is a predetermined wavelength passes therethrough. Though a part of the laser light from the semiconductor laser 370 may be reflected by the optical filter 373, such reflected light is cut off by the isolator 372. Similarly, the reflected light and scattered light from the optical communication line are cut off. Accordingly, the light is prevented from being incident on the resonator of the semiconductor laser 370 and disturbing a stable oscillation state.

The laser light transmitted through the optical filter 373 is made incident on the lens 374. While converging the parallel beam of laser light, the lens 374 makes the laser light incident on the optical fiber 321. The laser light emitted from the lens 374 is inspection light output from the light-emitting section 310a. As mentioned above, when the laser light from the semiconductor laser 370 passes through the optical filter 373, inspection light having a wavelength range of about 20 nm or less is realized.

Figure 32:
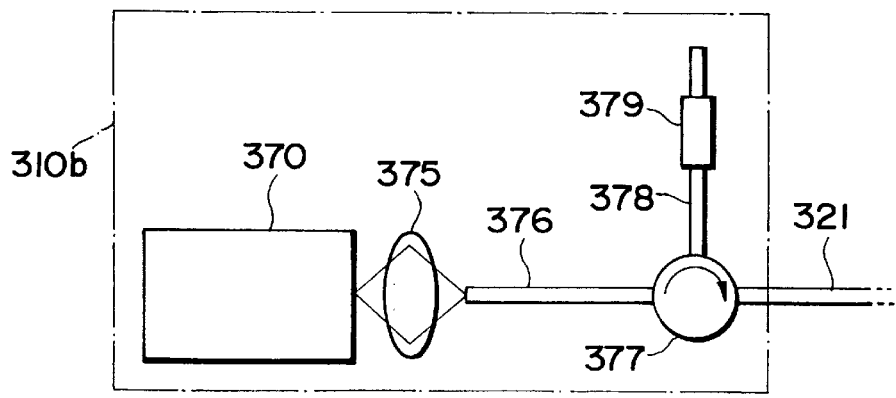
FIG. 32 is a second configurational view of the light-emitting section 310.

Next, the light-emitting section 310b of FIG. 32 is constituted by the Fabry-Perot type semiconductor laser 370, a lens 375, optical fibers 376 and 378, and an optical circulator 377. To the optical circulator 377, the optical fibers 376 and 378 as well as the optical fiber 321 are connected. In a part of a core of the optical fiber 378, an optical waveguide type diffraction grating 379 is disposed.

As in the case of the light-emitting section 310a of FIG. 31, the semiconductor laser 370 has an oscillation wavelength width of about 30 nm. The lens 375 converges the laser light output from the semiconductor laser 370 and makes thus converged light incident on the optical fiber 376, thereby connecting the semiconductor laser 370 to the optical fiber 376 in terms of optical power. The laser light incident on the optical fiber 376 enters the optical circulator 377 and then is emitted to the optical fiber 378. This laser light advances through the optical fiber 378 and reaches the optical waveguide type diffraction grating 379. The optical waveguide type diffraction grating 379 reflects, of the light included in the oscillation wavelength range of the semiconductor laser 370, a light component having a wavelength width of about 20 nm or less. This reflection light is made incident on the optical circulator 377 and then emitted to the optical fiber 321. The light incident on the optical fiber 321 by way of the optical circulator 377 is inspection light of the light-emitting section 310b.

Thus, since the light-emitting section 310b uses the light reflected by the optical waveguide type diffraction grating 379 as inspection light, when the reflection wavelength of the diffraction grating is about 20 nm or less, the wavelength width of inspection light also becomes about 20 nm or less. Since it is easy to prepare the optical waveguide type diffraction grating having a narrow wavelength width, inspection light having a wavelength width of 5 nm or less can be easily realized in accordance with the light-emitting section 310b.

Here, an optical fiber whose tip has been processed by melting or shaving to have a lens function may be used as the optical fiber 376, thereby eliminating the lens 375 which intervenes between the semiconductor laser 370 and the optical fiber 376.

Figure 33:
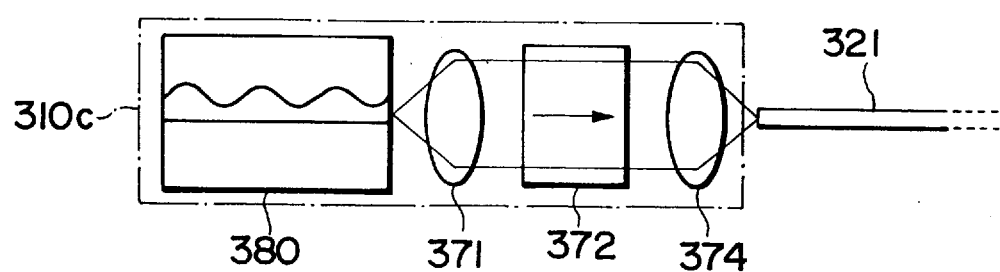
FIG. 33 is a third configurational view of the light-emitting section 310.

Next, the light-emitting section 310c of FIG. 33 is constituted by a distribution feedback (DFB) type semiconductor laser 380, the lenses 371 and 374, and the isolator 372. The laser light output from the distribution feedback type semiconductor laser 380 is converted into a parallel beam by the lens 371 and then made incident on the isolator 372. The isolator 372 has a forward direction toward the direction of arrow in the drawing, while cutting off the light advancing in the opposite direction. Accordingly, the reflected light or backscattering light from the optical communication line 303 is prevented from being incident on the resonator of the semiconductor laser 380 and disturbing a stable oscillation state. The light transmitted through the isolator 372 is incident on the lens 374 and then, while being converged, enters the optical fiber 321. The laser light emitted from the lens 374 is the output inspection light of the light-emitting section 310c.

The wavelength width of inspection light output from the light-emitting section 310c equals to the oscillation wavelength width of the distribution feedback type semiconductor laser 380. The distribution feedback type semiconductor laser 380 has a strong longitudinal-mode selectivity and a very narrow oscillation wavelength width. Therefore, in accordance with the light-emitting section 310c, the wavelength width of the output inspection light can be easily set to about 20 nm or less, and inspection light having a wavelength width of about 5 nm or less can be easily realized.

Figure 34:
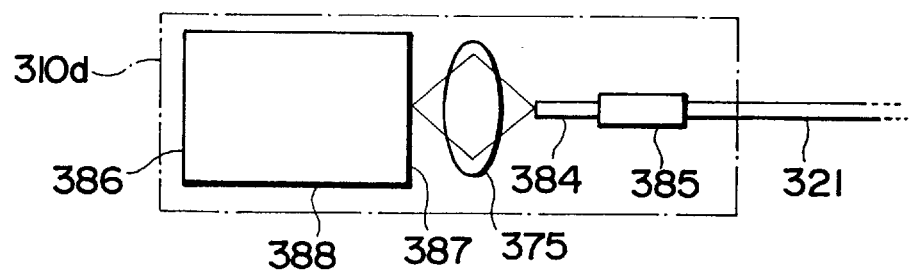
FIG. 34 is a fourth configurational view of the light-emitting section 310.

Finally, the light-emitting section 310d of FIG. 34 is constituted by a Fabry-Perot type semiconductor laser 388, the lens 375, and an optical fiber 384. In a core of the optical fiber 384, an optical waveguide type diffraction grating 385 is formed. Also, to the optical fiber 384, the optical fiber 321 is connected.

This light-emitting section 310d is similar to that disclosed in the paper of D. M. Bird et al (*Electron. Lett.,* Vol. 30, No. 13, pp. 1115–1116, 1994). This light-emitting section 310d can be regarded as a kind of distribution Bragg reflector (DBR) type semiconductor laser.

The Fabry-Perot type semiconductor laser 388 has a light-reflecting surface 386 with a high reflectance and a light-emitting surface 387 with a low reflectance respectively at both ends thereof, whereby light having a wavelength width of about 30 nm is emitted from the light-emitting surface 387. The lens 375 converges the output laser light of the semiconductor laser 380 and makes thus converged light incident on the optical fiber 384, thereby connecting the semiconductor laser 388 to the optical fiber 384 in terms of optical power. The light advancing through the optical fiber 384 reaches the diffraction grating 385. The diffraction grating 385 reflects, of the light included in the oscillation wavelength width of the semiconductor laser 388, only the light component having a wavelength width of about 20 nm or less whose center is a predetermined wavelength. Thus reflected light is made incident on the semiconductor laser 388 by way of the lens 375. The incident light advances through the semiconductor laser 388, while causing stimulated emission, and reaches the light-reflecting surface 386, where it is then reflected. Thus reflected light advances through the semiconductor 388, while causing stimulated emission, and emitted from the light-emitting surface 387 so as to be reflected by the diffraction grating 385 again. Thus, the light is amplified as reflection is repeated between the diffraction grating 385 and the light-reflecting surface 386, thereby finally causing laser oscillation. This is inspection light output from the light-emitting section 310d. This inspection light is transmitted through the diffraction grating 385 and made incident on the optical fiber 321.

The light causing laser oscillation between the diffraction grating 385 and the light-reflecting surface 386 is limited to wavelength light which is reflected with a relatively high reflectance by the diffraction grating 385. Accordingly, when the diffraction grating 385 having an appropriate reflection wavelength width is used, the wavelength width of the output inspection light from the light-emitting section 310d becomes about 20 nm or less. Since the diffraction grating 385 having a narrow reflection wavelength width can be made easily, inspection light having a wavelength width of 5 nm or less can be easily realized in accordance with the light-emitting section 310d.

Here, since the light-emitting section 310d outputs inspection laser light according to laser oscillation between the diffraction grating 385 and the light-reflecting surface 386, it is not always necessary for the light-emitting section 310d to effect laser oscillation at the semiconductor laser 388.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 285068/1995 filed on Nov. 1, 1995, No. 248255/1996 filed on Sep. 19, 1996, No.

068390/1995 filed on Mar. 27, 1995, No. 069554/1995 filed on Mar. 28, 1995, and No. 182867/1995 filed on Jul. 19, 1995 are hereby incorporated by reference.

What is claimed is:

1. A laser light source apparatus comprising:
   a semiconductor light-emitting device to be excited by a current so as to effect spontaneous emission and stimulated emission;
   a reflecting means disposed at a position opposed to a first light-emitting end face of said semiconductor light-emitting device by way of said semiconductor light-emitting device, said reflecting means reflecting light generated by said semiconductor light-emitting device so as to make thus reflected light travel through said semiconductor light-emitting device again;
   an optical waveguide for receiving and guiding the light emitted from said first light-emitting end face, said optical waveguide comprising a reflecting area which selectively reflects a part of the light emitted from the first light-emitting end face of said semiconductor light-emitting device, a core of said reflecting area comprising a first diffraction grating disposed in a first area, a refractive index of said first diffraction grating changing periodically along an optical-axis direction, and said first diffraction grating selectively reflecting within a first wavelength range a part of the light emitted from the first light-emitting end face of said semiconductor light-emitting device; and
   a period changing means for changing a grating period of change in refractive index along the optical axis direction in said first diffraction grating,
   said reflecting means, said semiconductor light-emitting device, and said diffraction grating constituting a laser resonator.

2. A laser light source apparatus according to claim 1, wherein said period changing means is a stress applying means which applies a stress to a part of said optical waveguide including said first diffraction grating along the optical-axis direction.

3. A laser light source apparatus according to claim 1, wherein said period changing means is a temperature adjusting means for changing temperature at a part of said optical waveguide including said first diffraction grating.

4. A laser light source apparatus according to claim 1, wherein said period changing means changes said grating period with time.

5. A laser light source apparatus according to claim 4, wherein changing width in reflection wavelength as said grating period is changed with time is 1 nm or greater.

6. A laser light source apparatus according to claim 4, wherein changing width in reflection wavelength as said grating period is changed with time is 20 nm or less.

7. A laser light source apparatus according to claim 6, wherein changing width in reflection wavelength as said grating period is changed with time is at least 2 nm but not greater than 10 nm.

8. A laser light source apparatus comprising:
   a semiconductor light-emitting device to be excited by a current so as to effect spontaneous emission and simulated emission;
   a current driving means for supplying, to said semiconductor light-emitting device, a stabilizing current having a level not lower than a threshold current level for oscillation of a laser oscillator and a pulse current required for generating a pulse laser light;
   a reflecting means disposed at a position opposed to a first light-emitting end face of said semiconductor light-emitting device by way of said semiconductor light-emitting device, said reflecting means reflecting light generated by said semiconductor light-emitting device so as to make thus reflected light travel through said semiconductor light-emitting device again; and
   an optical waveguide for receiving and guiding the light emitted from said first light-emitting end face, said optical waveguide comprising a reflecting area which selectively reflects a part of the light emitted from the first light-emitting end face of said semiconductor light-emitting device, a core of said reflecting area comprising a first diffraction grating disposed in a first area, a refractive index of said first diffraction grating changing periodically along an optical-axis direction, and said first diffraction grating selectively reflecting within a first wavelength range a part of the light emitted from the first light-emitting end face of said semiconductor light-emitting device,
   said reflecting means, said semiconductor light-emitting device, and said diffraction grating constituting a laser resonator.

9. A laser light source apparatus according to claim 8, wherein said current driving means comprises:
   a first current source for supplying said stabilizing current;
   a second current source for supplying said pulse current; and
   a current adder for adding said stabilizing current and said pulse current together.

10. A laser light source apparatus according to claim 8, wherein said current driving means always supplies a current having a level not lower than that of said stabilizing current at least except for a time during which said pulse current is supplied.

11. A laser light source apparatus according to claim 8, wherein said current driving means supplies said stabilizing current over a predetermined period of time before said pulse current is supplied.

12. A laser light source apparatus according to claim 11, wherein said predetermined period is a time during which light travels to-and-fro through said laser resonator for 1–200 times.

13. A laser light source apparatus according to claim 8, wherein said pulse current has a peak current level which is at least 10 times as high as the current level of said stabilizing current.

14. A laser light source apparatus comprising:
   a semiconductor light-emitting device to be excited by a current so as to effect spontaneous emission and stimulated emission;
   a reflecting means disposed at a position opposed to a first light-emitting end face of said semiconductor light-emitting device by way of said semiconductor light-emitting device, said reflecting means reflecting light generated by said semiconductor light-emitting device so as to make thus reflected light travel through said semiconductor light-emitting device again; and
   an optical waveguide for receiving and guiding the light emitted from said first light-emitting end face, said optical waveguide comprising a reflecting area which selectively reflects a part of the light emitted from the first light-emitting end face of said semiconductor light-emitting device, a core of said reflecting area comprising a first diffraction grating disposed in a first area, a refractive index of said first diffraction grating changing periodically along an optical-axis direction, and said first diffraction grating selectively reflecting within a first wavelength range having a width of at least 1 nm but not greater than 20 nm a part of the light emitted from the first light-emitting end face of said semiconductor light-emitting device, said reflecting means, said semiconductor light-emitting device, and said diffraction grating constituting a laser resonator.

15. A laser light source apparatus according to claim 14, wherein said first wavelength range has a width of at least 2 nm but not greater than 10 nm.

16. A laser light source apparatus according to claim 14, wherein said first diffraction grating has grating period changing monotonously along said optical-axis direction.

17. A laser light source apparatus according to claim 16, wherein the grating period of said first diffraction grating on the semiconductor light-emitting device side is shorter than that on the opposite side.

18. A laser light source apparatus according to claim 16, wherein said first diffraction grating has reflectance increasing monotonically along a direction moving away from said semiconductor light-emitting device.

19. A laser light source apparatus according to claim 17, wherein said first diffraction grating has reflectance decreasing monotonically along a direction moving away from said semiconductor light-emitting device.

20. A laser light source apparatus comprising:

a semiconductor light-emitting device to be excited by a current so as to effect spontaneous emission and stimulated emission;

a reflecting means disposed at a position opposed to a first light-emitting end face of said semiconductor light-emitting device by way of said semiconductor light-emitting device, said reflecting means reflecting light generated by said semiconductor light-emitting device so as to make thus reflected light travel through said semiconductor light-emitting device again; and an optical waveguide for receiving and guiding the light emitted from said first light-emitting end face, said optical waveguide comprising a reflecting area which selectively reflects a part of the light emitted from the first light-emitting end face of said semiconductor light-emitting device, a core of said reflecting area comprising a first diffraction grating disposed in a first area and a second diffraction grating disposed in a second area, refractive indices of said first and second diffraction gratings changing periodically along an optical-axis direction, and said first and second diffraction gratings each selectively reflecting within respective first and second wavelength ranges a part of the light emitted from the first light-emitting end face of said semiconductor light-emitting device, said reflecting means, said semiconductor light-emitting device, and either one of said first and second diffraction gratings constituting a laser resonator.

21. A laser light source apparatus according to claim 20, wherein said second wavelength range has a width of at least 1 nm but not greater than 20 nm.

22. A laser light source apparatus according to claim 21, wherein said second wavelength range has a width of at least 2 nm but not greater than 10 nm.

23. A laser light source apparatus according to claim 20, wherein said second diffraction grating has grating period changing monotonically along said optical-axis direction.

24. A laser light source apparatus according to claim 23, wherein the grating period of said second diffraction grating on the semiconductor light-emitting device side is shorter than that on the opposite side.

25. A laser light source apparatus according to claim 23, wherein said second diffraction grating has reflectance increasing monotonically along a direction moving away from said semiconductor light-emitting device.

26. A laser light source apparatus according to claim 23, wherein said second diffraction grating has reflectance decreasing monotonically along a direction moving away from said semiconductor light-emitting device.

27. A laser light source apparatus according to claim 20, wherein no common area exists between said first and second areas.

28. A laser light source apparatus according to claim 20, wherein said first and second areas have a common area.

29. An OTDR apparatus comprising:

a laser light source apparatus, said laser light source apparatus comprising:

a semiconductor light-emitting device to be excited by a current to effect spontaneous emission and stimulated emission, a reflecting means disposed at a position opposed to a first light-emitting end face of said semiconductor light-emitting device by way of said semiconductor light-emitting device, and said reflecting means reflecting light generated by said semiconductor light-emitting device so as to make thus reflected light travel through said semiconductor light-emitting device again, and an optical waveguide for receiving and guiding the light emitted from said first light emitting end face, said optical waveguide comprising a reflecting area reflecting a part of the light emitted from said first light-emitting end face of the semiconductor light-emitting device, and a core of said reflecting area comprising a first diffraction grating disposed in a first area, a refractive index of said first diffraction grating changing periodically along an optical-axis direction, and said first diffraction grating selectively reflecting within a first wavelength range a part of the light emitted from the first light-emitting end face of said semiconductor light-emitting device, said reflecting means, said semiconductor light-emitting device, and said diffraction grating constituting a laser resonator;

an optical path setting device for receiving, from a first terminal, the light emitted from said laser light source apparatus and sending, from a second terminal, thus received light toward an optical fiber to be measured, and also receiving, from the second terminal, return light from the optical fiber and sending, from a third terminal, thus received return light; and an optical measurement section for measuring intensity in the light output from the third terminal of said path setting device.

30. An OTDR apparatus according to claim 29, wherein said optical path setting device is an optical coupler.

31. An OTDR apparatus according to claim 29, wherein said optical path setting device is an optical directional coupler.

32. An OTDR apparatus according to claim 29, further comprising a band pass filter in an optical path between said laser light source apparatus and said optical fiber to be measured.

33. An OTDR apparatus according to claim 29, wherein said reflecting means is a reflectively processed end face of said semiconductor light-emitting device opposed to said first light-emitting end face.

34. An OTDR apparatus according to claim 29, wherein said reflecting means is a reflector reflecting light emitted from a second light-emitting end face of said semiconductor light-emitting device.

35. An OTDR apparatus according to claim 29, further comprising a period changing means for changing grating period of change in refractive index along said optical-axis direction in said first diffraction grating.

36. An OTDR apparatus according to claim 35, wherein said period changing means is a stress applying means for applying a stress to a part of said optical waveguide including said first diffraction grating along said optical-axis direction.

37. An OTDR apparatus according to claim 35, wherein said period changing means is a temperature adjusting means changing temperature at a part of said optical waveguide including said first diffraction grating.

38. An OTDR apparatus according to claim 35, wherein said period changing means changes said grating period with time.

39. An OTDR apparatus according to claim 38, wherein changing width in reflection wavelength as said grating period is changed with time is 1 nm or greater.

40. An OTDR apparatus according to claim 39, wherein changing width in reflection wavelength as said grating period is changed with time is 20 nm or less.

41. An OTDR apparatus according to claim 40, wherein changing width in reflection wavelength as said grating period is changed with time is at least 2 nm but not greater than 10 nm.

42. An OTDR apparatus according to claim 29, further comprising a current driving means for supplying, to said semiconductor light-emitting device, a stabilizing current having a level not lower than a threshold current level for oscillation of a laser oscillator and a pulse current required for generating pulse laser light.

43. An OTDR apparatus according to claim 42, wherein said current driving means comprises:
 a first current source for supplying said stabilizing current;
 a second current source for supplying said pulse current; and
 a current adder for adding said stabilizing current and said pulse current together.

44. An OTDR apparatus according to claim 42, wherein said current driving means always supplies a current having a level not lower than that of said stabilizing current at least except for a time during which said pulse current is supplied.

45. An OTDR apparatus according to claim 42, wherein said current driving means supplies said stabilizing current over a predetermined period of time before said pulse current is supplied.

46. An OTDR apparatus according to claim 45, wherein said predetermined period is a time during which light travels to-and-fro through said laser resonator for 1–200 times.

47. An OTDR apparatus according to claim 42, wherein said pulse current has a peak current level which is at least 10 times as high as the current level of said stabilizing current.

48. An OTDR apparatus according to claim 42, wherein said optical measurement section further comprises a high pass filter which eliminates a low frequency component of input optical intensity.

49. An OTDR apparatus according to claim 29, wherein said first wavelength range has a width of 1 nm or greater.

50. An OTDR apparatus according to claim 49, wherein said first wavelength range has a width of 20 nm or less.

51. An OTDR apparatus according to claim 50, wherein said first wavelength range has a width of at least 2 nm but not greater than 10 nm.

52. An OTDR apparatus according to claim 48, wherein said first diffraction grating has grating period changing monotonically along said optical-axis direction.

53. An OTDR apparatus according to claim 52 wherein the grating period of said first diffraction grating on the semiconductor light-emitting device side is shorter than that on the opposite side.

54. An OTDR apparatus according to claim 52, wherein said first diffraction grating has reflectance increasing monotonically along a direction moving away from said semiconductor light-emitting device.

55. An OTDR apparatus according to claim 53, wherein said first diffraction grating has reflectance decreasing monotonically along a direction moving away from said semiconductor light-emitting device.

56. An OTDR apparatus according to claim 29, wherein said reflecting area further comprises a second diffraction grating formed in a second area of the core, refractive index of said second diffraction grating changing periodically along the optical-axis direction, said reflecting area selectively reflecting, of the light emitted from the first light-emitting end face of said semiconductor light-emitting device, a part of the light within a second wavelength range.

57. An OTDR apparatus according to claim 56, wherein said second wavelength range has a width of 1 nm or greater.

58. An OTDR apparatus according to claim 57, wherein said second wavelength range has a width of 20 nm or less.

59. An OTDR apparatus according to claim 58, wherein said second wavelength range has a width of at least 2 nm but not greater than 10 nm.

60. An OTDR apparatus according to claim 56, wherein said second diffraction grating has grating period changing monotonically along said optical-axis direction.

61. An OTDR apparatus according to claim 60, wherein the grating period of said second diffraction grating on the semiconductor light-emitting device side is shorter than that on the opposite side.

62. An OTDR apparatus according to claim 60, wherein said second diffraction grating has reflectance increasing monotonically along a direction moving away from said semiconductor light-emitting device.

63. An OTDR apparatus according to claim 61, wherein said second diffraction grating has reflectance decreasing monotonically along a direction moving away from said semiconductor light-emitting device.

64. An OTDR apparatus according to claim 56, wherein no common area exists between said first and second areas.

65. An OTDR apparatus according to claim 56, wherein said first and second areas have a common area.

66. An optical communication line inspection system for inspecting transmission state of an optical communication line for transmitting signal light, said system comprising:
 a light-emitting section for outputting inspection light with a wavelength in a first wavelength range;
 an optical path setting section disposed in an optical path of said optical communication line,
 said optical path setting section receiving the inspection light output from said light-emitting section and introducing thus received inspection light into said optical communication line, and also receiving return light derived from the inspection light input from said optical communication line and outputting thus received return light to a path different from said optical communication line;

a waveguide type reflecting means disposed at a terminating portion of said optical communication line, said reflecting means reflecting light with a wavelength in a second wavelength range including said first wavelength range, said reflecting means comprising a first diffraction grating, refractive index of a core thereof changing periodically along an optical-axis direction;

an optical measurement section for measuring intensity in the return light output from said optical path setting section; and a processing section for determining, based on a result of the measurement by said optical measurement section, the transmission state of said optical communication line.

67. An optical communication line inspection system according to claim 66, wherein said first wavelength width has a width of 20 nm or less.

68. An optical communication line inspection system according to claim 66, wherein said first wavelength width has a width of 5 nm or less.

69. An optical communication line inspection system according to claim 66, wherein said light-emitting section comprises a laser light source apparatus, said laser light source apparatus comprising:

a semiconductor light-emitting device to be excited by a current so as to effect spontaneous emission and stimulated emission;

a reflecting means disposed at a position opposed to a first light-emitting end face of said semiconductor light-emitting device by way of said semiconductor light-emitting device, and said reflecting means reflecting light generated by said semiconductor light-emitting device so as to make thus reflected light travel through said semiconductor light-emitting device again; and an optical waveguide for receiving and guiding the light emitted from said first light-emitting end face, said optical waveguide comprising a reflecting area reflecting selectively at least a part of the light emitted from the first light-emitting end face of said semiconductor light-emitting device, a core of said reflecting area comprising a second diffraction grating, refractive index of said second diffraction grating changing periodically along the optical-axis direction, said reflecting means, said semiconductor light-emitting device, and said third diffraction grating constituting a laser resonator.

70. An optical communication line inspection system according to claim 69, wherein said reflecting area further comprises a third diffraction grating which reflects wavelength light having a wavelength range different from reflection wavelength range of said second diffraction grating.

71. An optical communication line inspection system according to claim 66, wherein said light-emitting section comprises a distributed feedback type semiconductor laser.

72. An optical communication line inspection system according to claim 66, further comprising a band pass filter in an optical path between said laser light-emitting section and said optical communication line.

* * * * *